US005731228A

United States Patent [19]

Endo et al.

[11] Patent Number: 5,731,228

[45] Date of Patent: Mar. 24, 1998

[54] METHOD FOR MAKING MICRO ELECTRON BEAM SOURCE

[75] Inventors: Yasuhiro Endo; Shunji Goto; Ichiro Honjo, all of Kawasaki, Japan

[73] Assignee: Fujitsu Limited, Kawasaki, Japan

[21] Appl. No.: 401,511

[22] Filed: Mar. 10, 1995

[30] Foreign Application Priority Data

| | | | |
|---|---|---|---|
| Mar. 11, 1994 | [JP] | Japan | 6-041477 |
| Oct. 6, 1994 | [JP] | Japan | 6-243214 |

[51] Int. Cl.[6] .................. H01L 21/465

[52] U.S. Cl. .................. 437/228; 156/644.1; 455/47; 455/49; 455/50; 455/51; 313/309; 313/336; 313/351

[58] Field of Search .................. 437/228; 445/46, 445/47, 49, 50, 51; 313/309, 336, 351; 156/644.1

[56] References Cited

U.S. PATENT DOCUMENTS

| | | | |
|---|---|---|---|
| 4,874,981 | 10/1989 | Spindt | 445/46 |
| 4,983,878 | 1/1991 | Lee et al. | 445/46 |
| 5,012,153 | 4/1991 | Atkinson et al. | 313/336 |
| 5,136,764 | 8/1992 | Vasquez | 29/25.01 |
| 5,150,019 | 9/1992 | Thomas et al. | 315/350 |
| 5,164,632 | 11/1992 | Yoshida et al. | 313/309 |
| 5,176,557 | 1/1993 | Okunuki et al. | 445/50 |
| 5,218,273 | 6/1993 | Kane et al. | 315/326 |
| 5,229,331 | 7/1993 | Doan et al. | 437/228 |
| 5,315,206 | 5/1994 | Yoshida | 313/306 |
| 5,378,182 | 1/1995 | Liu | 445/50 |
| 5,444,328 | 8/1995 | Van Zutphen | 313/446 |
| 5,451,175 | 9/1995 | Smith et al. | 445/49 |
| 5,461,009 | 10/1995 | Huang et al. | 445/49 |
| 5,480,843 | 1/1996 | Park et al. | 437/228 |
| 5,482,486 | 1/1996 | Vandaine et al. | 445/50 |
| 5,496,200 | 3/1996 | Yang et al. | 445/50 |
| 5,509,839 | 4/1996 | Liu | 445/49 |

OTHER PUBLICATIONS

Spindt et al. "Field-Emitter Arrays . . . Microelectronics", IEEE Transctions on Elec. Dev., vol. 38, No. 19, Oct. 1991.

*Primary Examiner*—John Niebling
*Assistant Examiner*—Long Pham
*Attorney, Agent, or Firm*—Armstrong, Westerman, Hattori, McLeland & Naughton

[57] ABSTRACT

A method for fabricating a micro-field emission gun including the steps of providing an insulator slab, formed with a penetrating hole acting as a passage of an electron beam, upon a gate electrode of the micro-field emission gun, such that the penetrating hole is aligned with an emitter of the micro-field gun, bonding an insulator slab upon the gate electrode by means of an anodic bonding process, and providing an acceleration electrode on the insulator slab such that the acceleration electrode covers a surface of said insulator slab facing away from said gate electrode, except for a passage of the electron beam.

13 Claims, 42 Drawing Sheets

234
232
230
236
241
240

233
SiO2
238

233
SiO2
238

234
233
238
236
241
240

METHOD FOR MAKING MICRO ELECTRON BEAM SOURCE

BACKGROUND OF THE INVENTION

1. Field of the Invention

The present invention generally relates to electron beam sources and, more particularly, to a micro-electron gun known also as micro field emission gun and a fabrication process thereof.

2. Description of the Related Art

Micro-field emission guns have been studied originally in the purpose of breaking through the limit of operational speed of solid-state devices. In such a study, attempts have been made to fabricate integrated circuits of vacuum tubes by using the microfabrication technology developed in the art of semiconductor fabrication. Recently, however, intensive efforts are being made to construct a flat panel display by arranging such micro-field emission guns in a two-dimensional plane, such that an image is formed on a screen opposing such a field emitter array by the electron beams emitted from the micro-field emission guns forming the field emitter array. It should also be noted that such micro-field emission guns are advantageous in the point that one can produce a high energy electron beam without using bulky columns conventionally used for producing such a high energy electron beam. Thus, the possibility has now emerged to construct very compact electron microscopes or other analyzing tools that use such accelerated electron beams by using the micro-field emission guns.

FIG. 1 shows the construction of a conventional micro-field emission gun.

Referring to FIG. 1, the micro-field emission gun is constructed on a semiconductor substrate 11 such as Si and includes a sharply pointed conical emitter 12, wherein the emitter 12 is surrounded by a gate electrode 13. The gate electrode 13 induces an electric field between the gate electrode 13 and the emitter 12 such that the electrons are emitted from the emitter 12 as a result of field emission. The emitter 12 may have a diameter of 2 μm and is formed in a hole 14*a* that is formed in an insulation film 14 of $SiO_2$ or SiO covering the surface of the substrate 11 such that the hole 14*a* exposes the surface of the substrate 11. Typically, a number of such holes 14*a* are formed in rows and columns in the insulation film 14 with a pitch of about 300 μm, and accordingly, the emitters 12 are also formed in rows and columns with a corresponding pitch of about 300 μm. In such a construction, a large electric field is induced in response to the control voltage applied to the gate electrode 13, while such a large electric field causes a deformation in the surface potential barrier of the conductor material such as Si or W that forms the emitter 12. Thereby, the electrons are emitted to the exterior of the emitter 12 by passing through the deformed surface potential barrier by tunneling effect. The structure shown in FIG. 1 can be fabricated easily by the microfabrication technology used in the production of semiconductor devices.

FIGS. 2A–2D show the fabrication process of the micro-field emission gun of FIG. 1.

Referring to FIGS. 2A–2D, a mask pattern 12*a* of $SiO_2$ is provided in the step of FIG. 2A on a part of the silicon substrate 11 on which the emitter 12 is to be formed, and a reactive ion etching process (RIE) is conducted in the step of FIG. 2B upon the substrate 11 while using the pattern 12*a* as a mask. Thereby, the RIE process is set such that the etching proceeds obliquely to the surface of the substrate 11, and one obtains a truncated-conical region 12*b* in correspondence to the mask 12*a*.

Next, the surface of the substrate 11 is subjected to oxidation while leaving the mask 12*a* such that an oxide film 12*c* is formed on the inclined, conical surface of the region 12*b*. Further, an insulation layer 14 of SiO and a layer of Cr to be used for the gate electrode 13, are deposited consecutively upon the silicon oxide film 12*c* on the substrate 11. Thereby, one obtains a structure shown in FIG. 2C.

Further, by removing the mask pattern 12*a*, a structure of FIG. 2D is obtained. In the structure of FIG. 2D, it should be noted that one can form a sharply pointed structure by removing the oxide film 12*c*.

In the micro field emission gun of the structure of FIG. 1 or FIG. 2D, an acceleration voltage of several hundred volts is applied across the gate electrode 13 and the substrate 11, and an electron beam of several hundred electron volts is obtained. On the other hand, this means that an acceleration voltage of several thousand kilovolts has to be applied across the substrate 11 and the gate electrode 13 in order to obtain an accelerated, high energy electron beam of several kilo-electron volts, which are required in electron microscopes or other various analyzing tools. As the insulation layer 14 has a thickness of about 1 μm or less, such an application of high acceleration voltage results in a formation of very high electric field in the order of $10^9$ V/m in the insulation layer 14. Thereby, a leak current of several micro amperes cannot be avoided in the insulation layer 14.

In order to reduce the leak current, it is necessary to increase the thickness of the insulation layer 14 to be larger than 10 μm, while the formation of such a thick insulation layer by means of conventionally used semiconductor fabrication processes such as CVD or sputtering is difficult. It is of course possible to bond a thick glass slab upon the gate electrode and provide an acceleration electrode upon such a glass slab by means of adhesives, while such a use of adhesives raises a problem in that the gas released from the adhesives may cause a contamination of the field emitter guns and hence undesirable deterioration of the emission characteristics thereof.

SUMMARY OF THE INVENTION

Accordingly, it is a general object of the present invention to provide a novel and useful micro field emission gun and a fabrication process thereof wherein the foregoing problems are eliminated.

Another and more specific object of the present invention is to provide a micro field emission gun having an acceleration electrode on a gate electrode with a separation therefrom, for producing a high energy electron beam, and a fabrication process thereof.

Another object of the present invention is to provide a method for fabricating a micro field emission gun, said micro field emission gun having an emitter provided on a substrate, an insulator layer surrounding said emitter, and a gate electrode provided on said insulator layer so as to surround said emitter, said micro field emission gun thereby emitting an electron beam from said emitter in response to a control voltage applied to said gate electrode, said method comprising the steps of:

providing an insulator slab, formed with a penetrating hole acting as a passage of said electron beam, upon said gate electrode, such that said penetrating hole is aligned with said emitter of said field emission gun;

bonding said insulator slab upon said gate electrode by means of an anodic bonding process; and providing an acceleration electrode on said insulator slab such that said acceleration electrode covers a surface of said insulator slab facing away from said gate electrode, except for a passage of said electron beam.

Another object of the present invention is to provide a micro field emission gun, comprising:

a substrate;

an emitter provided on a surface of said substrate, said emitter emitting electrons in response to a gate electric field applied thereto;

a first insulation layer provided on said surface of said substrate, said first insulation layer carrying thereon a first penetrating hole in alignment with said emitter as a passage of said electrons;

a gate electrode layer provided on a surface of said first insulation layer, said gate electrode carrying thereon a first opening in alignment with said first penetrating hole and acting as a passage of said electrons, said gate electrode being applied with a gate voltage and creating said gate electric field in response thereto;

a second insulation layer provided on a surface of said gate electrode layer and carrying a second penetrating hole in alignment with said first opening as a passage of said electrons, said second insulation layer having a thickness at least larger than 10 μm; and an acceleration electrode layer provided on a surface of said second insulation layer, said acceleration electrode layer carrying a second opening in alignment with said second penetrating hole as a passage of said electrons, said acceleration electrode layer being applied with an acceleration voltage for accelerating said electrons.

According to the present invention as set forth above, the acceleration electrode for accelerating the electron beam is provided with a substantial separation from the gate electrode, with a thick insulator slab such as a glass plate intervening therebetween. As a result, development of large electric field is successfully avoided in the first insulation layer even when a very large acceleration voltage is applied between the gate electrode and the acceleration electrode, and the problem of leak current in the first insulator layer is successfully eliminated. As the thick second insulator layer is bonded upon the gate electrode by the anodic bonding process without using any adhesives, the problem of gas release from the adhesives is entirely eliminated. As the anodic bonding process allows use of glass slab of arbitrary thickness, the increase in the electric field strength in the second insulator layer is also suppressed successfully by using a thick slab.

Another object of the present invention is to provide a method for fabricating a micro field emission gun, said micro field emission gun having an emitter provided on a substrate, an insulator layer surrounding said emitter, and a gate electrode provided on said insulator layer so as to surround said emitter, said micro field emission gun thereby emitting an electron beam from said emitter in response to a control voltage applied to said gate electrode, said method comprising the steps of:

placing a semiconductor slab on said gate electrode, said semiconductor slab carrying thereon a penetrating hole acting as a passage of said electron beam and comprising a p-type layer and an n-type layer contacting each other intimately at a p-n junction interface, said p-type layer further carrying an oxide film on a surface thereof, such that said penetrating hole is aligned with said emitter and such that the surface of said p-type layer carrying thereon said oxide film faces said gate electrode; and bonding said semiconductor slab upon said gate electrode by an anodic bonding process.

According to the present invention, the acceleration electrode is separated from the gate electrode by a thick semiconductor slab that includes therein a p-n junction. Thereby, the p-n junction is reversely biased by the acceleration voltage and the semiconductor slab effectively insulates the acceleration electrode from the gate electrode. In this case, too, the problem of gas release associated with bonding of insulation layer is eliminated as a result of use of the anodic bonding process. Further, it should be noted that such a construction allows to use the n-type layer as the acceleration electrode itself. Thereby, separate formation of the acceleration electrode can be eliminated. It should be noted that the anodic bonding process is conducted by causing a transport of ions between the gate electrode and the oxide film contacting thereto.

Another object of the present invention is to provide a method for fabricating a micro field emission gun, said micro field emission gun having an emitter provided on a substrate, an insulator layer surrounding said emitter, and a gate electrode provided on said insulator layer so as to surround said emitter, said micro field emission gun thereby emitting an electron beam from said emitter in response to a control voltage applied to said gate electrode, said method comprising the steps of:

placing an insulator slab on said gate electrode;

bonding said insulator slab upon said gate electrode by an anodic bonding process;

providing a conductor layer upon a surface of said insulator slab at a side away from a side of said insulator slab facing said gate electrode, such that said conductor layer carries an opening for exposing said surface of said insulator slab in correspondence to a passage of said electron beam emitted from said emitter;

removing said insulator slab for a part thereof exposed by said opening of said conductor layer by an etching process to form said passage of said electron beam in said insulator slab.

According to the present invention, the passage of the electron beam is formed in the insulator slab by conducting an etching process while using the conductor layer acting as the acceleration electrode, as a mask. Thereby, the fabrication process of the micro field emission gun is simplified substantially. In such a process, the step for aligning the acceleration electrode and the insulator slab with each other for alignment of the respective electron beam passages is eliminated.

Another object of the present invention is to provide a method for fabricating a micro field emission gun, said micro field emission gun having an emitter provided on a substrate, a first insulator layer surrounding said emitter, a gate electrode provided on said first insulator layer so as to surround said emitter, said micro field emission gun thereby emitting an electron beam from said emitter in response to a control voltage applied to said gate electrode, a second insulator layer having a passage of said electron beam and provided on said gate electrode, and an acceleration electrode having a passage of said electron beam and provided on said second insulator layer, said acceleration electrode thereby accelerating said electron beam in response to an acceleration voltage applied thereto, said method comprising the steps of:

providing a third insulator layer on said acceleration electrode by conducting a first anodic bonding process, said third insulator layer having a passage of said electron beam;

forming an electrostatic lens as an alternate stacking of a plurality of electrode films each having an opening acting as a passage of said electron beam and a plurality of insulation films each having an opening acting as a passage of said electron beam, such that respective openings are aligned with each other to form a straight path of said electron beam extending from a bottom surface to a top surface of said electrostatic lens; and bonding the lowermost electrode film of said electrostatic lens upon said third insulator layer by conducting a second anodic bonding process.

According to the present invention, an electrostatic lens is provided on the acceleration electrode. Thereby, it becomes possible to converge or diverge the high energy electron beam produced by the micro field emission gun and accelerated by the acceleration electrode. By using the conductor films having the openings for the passage of the electron beam as a mask, it is possible to provide corresponding openings in the intervening insulation films with exact alignment. Further, such a self-alignment etching process simplifies the fabrication process of the electrostatic lens substantially.

Other objects and further features of th present invention will become apparent from the following detailed description when read in conjunction with the attached drawings.

DETAILED DESCRIPTION OF THE PREFERRED EMBODIMENTS

[First Embodiment]

Figure 1:
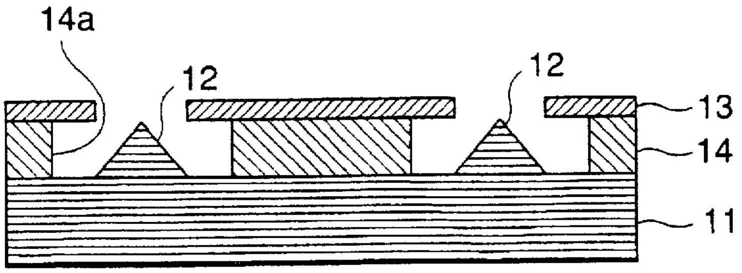
FIG. 1 PRIOR ART
FIG. 1 is a diagram showing the construction of a conventional micro field emission gun in a cross sectional view.
Figure 2A:
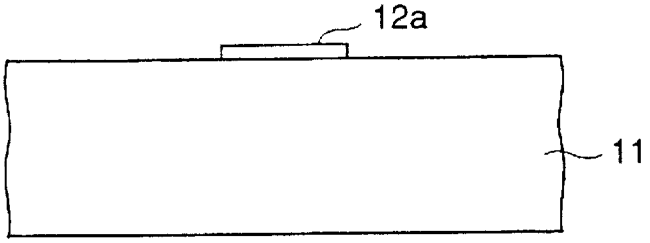
FIG. 2A PRIOR ART
FIGS. 2A–2D are diagrams showing the fabrication process of the micro field emission gun of FIG. 1.
Figure 2B:
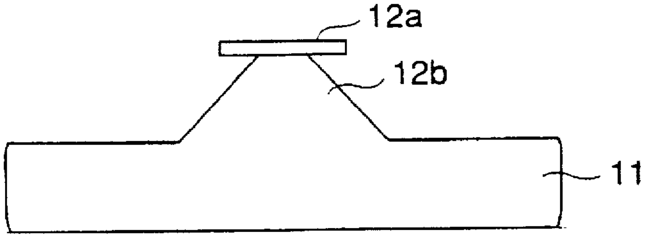
FIG. 2B PRIOR ART
Figure 2C:
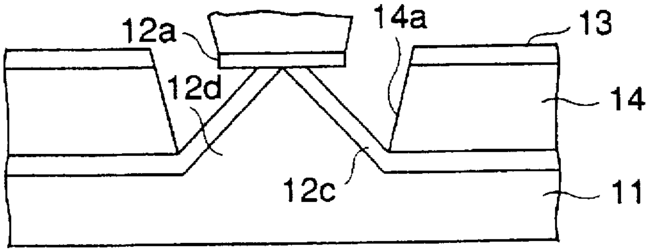
FIG. 2C PRIOR ART
Figure 2D:
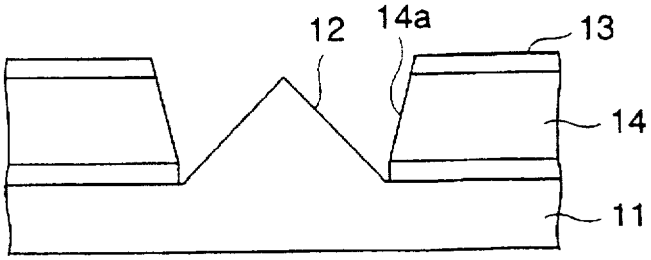
FIG. 2D PRIOR ART
Figure 3:
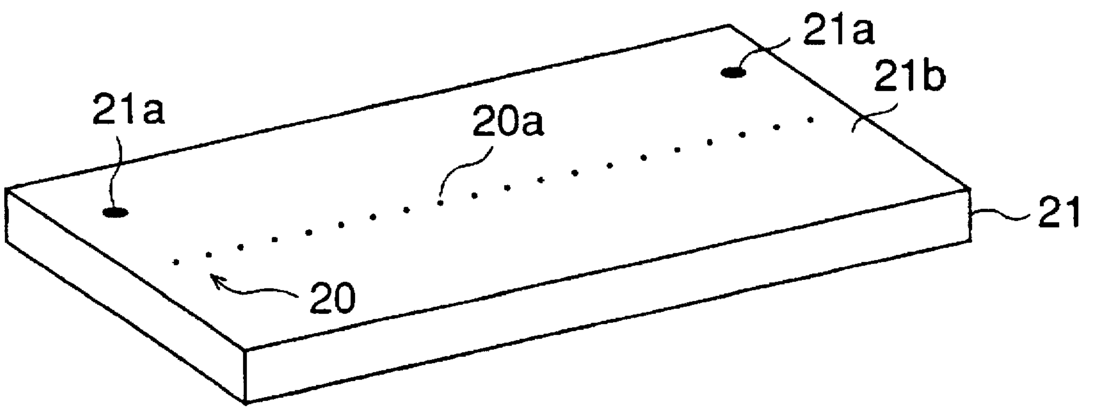
FIGS. 3–7 are diagrams showing the fabrication process of the micro field emission gun according to a first embodiment of the present invention.

FIG. 3 shows the silicon substrate 21 used in the micro field emission gun of FIG. 1.

Referring to FIG. 3, the silicon substrate 21 carries a row of emitters 20*a* corresponding to the emitter 12 of FIG. 1, wherein the emitters 20*a* as a whole form an emitter array 20. As each of the emitters 20*a* is formed according to the process of FIGS. 2A–2D, the process of formation of the individual emitters will be omitted from the description. In a typical example, the substrate 21 has a size of 5 mm×10 mm, and the emitters 20*a* are formed with a pitch of 300 μm. Further, the substrate 21 carries a film 21*b* of Cr acting as the gate electrode 13, wherein it will be noted that the emitters 20*a* are exposed in correspondence to the openings formed in the Cr film 21*b* with a diameter of about 2 μm. Further, the Cr film 21*b* carries a pair of alignment marks 21*a* at respective positions, which is determined with respect to the edges of the substrate 21, wherein the alignment mark 21*a* may have a diameter of 50 μm.

Figure 4:
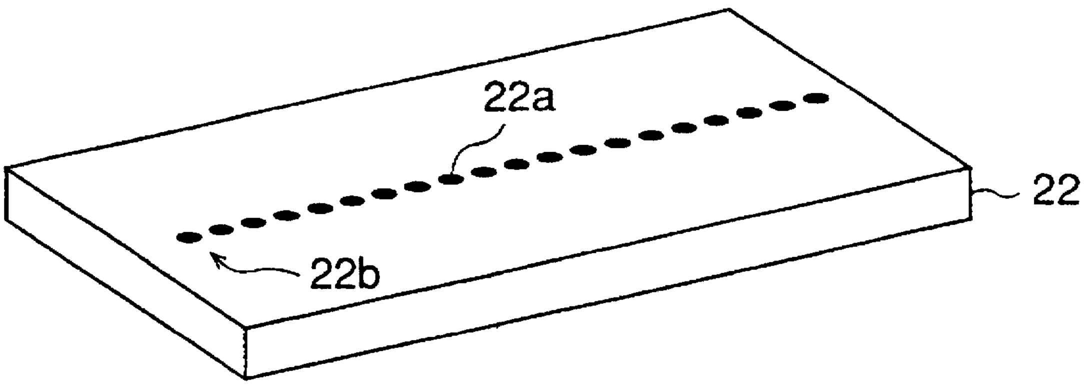

FIG. 4 shows the construction of an insulator slab 22 that is to be provided upon the substrate 21 in contact with the Cr film 21*b*, wherein FIG. 4 shows the insulator slab 22 before it is bonded upon the substrate 21. It should be noted that the insulator slab 22 forms a thick insulation layer on the Cr film 21*b* that acts as the gate electrode of the micro field emission gun.

Referring to FIG. 4, the insulator slab 22 may be formed of a borosilicate glass, $SiO_2$, SiO, and the like, and has a thickness of about 100 μm and a size corresponding to the size of the substrate. Further, the insulator slab 22 is provided with a plurality of penetrating holes 22*a*, wherein the penetrating holes 22*a* are formed so as to align with the corresponding emitters 20*a* on the substrate 21 when the insulator slab 22 is properly bonded upon the substrate 21. In the illustrated example, the insulator slab 22 may have a size of 5 mm×10 mm in correspondence to the size of the substrate 21, while the penetrating holes 22*a* are formed with a pitch of 300 μm in correspondence to the pitch of the emitters 20*a* forming the emitter array 20 on the substrate 21. Thereby, the holes 22*a* form a hole array 22*b*. Each of the holes 22*a* may be formed to have a diameter of about 100 μm, wherein the holes 22*a* are formed with a tolerance of several microns or less with respect to the outer size of the insulator slab 22.

Figure 5:
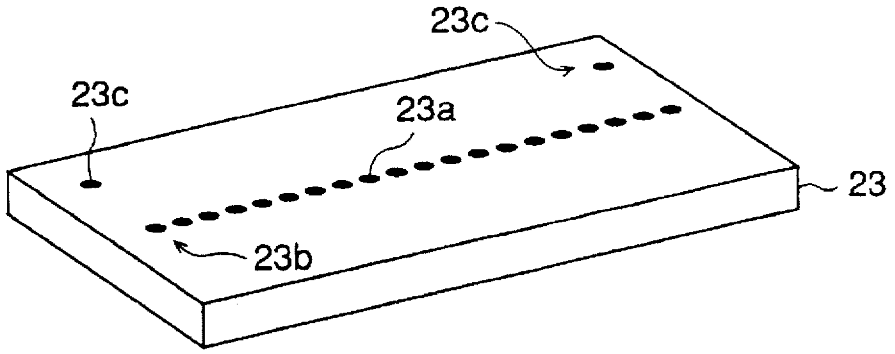

FIG. 5 shows a conductor plater 23 to be bonded upon the insulator slab 22 of FIG. 4.

Referring to FIG. 5, the conductor plate 23 may be formed of a metal plate such as Ta, Ti, or Kovar (trade name), or a semiconductor substrate of Si, Ge, GaAs, and the like, and has a size of 5 mm×10 mm in correspondence to the size of the substrate 21 and the size of the insulator slab 22. Typically, the plate 23 has a thickness of 50 μm and carries a plurality of penetrating holes 23*a* formed in correspondence to the emitters 20*a* on the substrate 21, wherein the holes 23*a* form a hole array 23*b*. Further, the conductor plate 23 is formed with further penetrating holes 23*a* provided in correspondence to the alignment marks 21*a*. Each of the penetrating holes 23*a* has a diameter of typically 50 μm and is formed by an electrospark machining process with a pitch of 300 μm with respect to the adjacent holes 23*a*, in correspondence to the pitch of the emitters 20*a* on the substrate 21. Similarly, the alignment marks 23*c* are formed with an electrospark machining process with a diameter of 100 μm. By using the electrospark machining process, it is possible to form the holes 23*a* or 23*c* with a precision of 1 μm or less.

Figure 6:
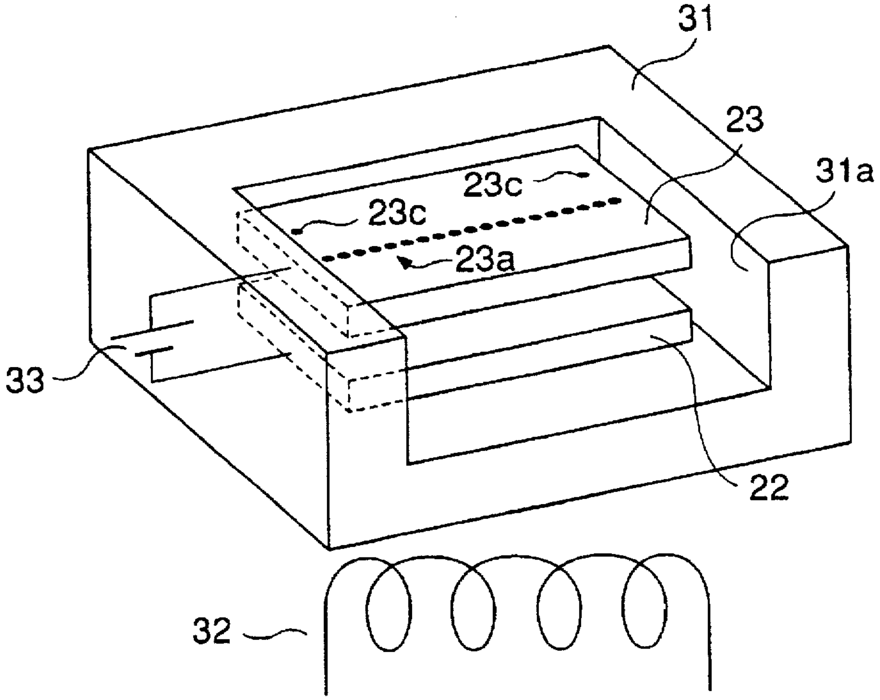

FIG. 6 shows the bonding process of the insulator slab 22 of FIG. 4 and the conductor plate of FIG. 5.

Referring to FIG. 6, the bonding process is achieved by using a jig 31 that holds the insulator slab 22 of FIG. 4 and the conductor plate 23 of FIG. 5 with a mutual alignment, wherein an anodic bonding process is applied to the insulator slab 22 and the conductor plate 23 thus held in the jig 31. More specifically, the insulator slab 22 and the conductor plate 23 are abutted to an inner surface 31*a* of the jig 31, and the slab 22 and the plate 23 are aligned within the precision several microns.

Next, while holding the insulator slab 22 and the conductor plate 23 together on the jig 31 of FIG. 6, negative and positive voltages are applied respectively to the insulator slab 22 and the conductor plate 23. Further, the environmental pressure of the jig 31 is reduced to about $1\times10^{-5}$ Torr, and the entire jig 31 is heated to a temperature of about 300° C. by energizing a heating mechanism 32 of the jig 31. The magnitude of the d.c. voltage applied across the insulator slab 22 and the conductor plate 23 is set to about 300 volts.

Upon such an application of the heat, the mobility of sodium ions in the glass increases substantially, and the sodium ions are moved to the cathode as a result of the electric field created by the d.c. voltage. As a result of such a transport of the sodium ions, oxygen ions are left in the glass and form a negatively charged region. On the other hand, the sodium ions are accumulated to form a positively charged region on the surface of the conductor slab 22. Thereby, the intimate contact between the conductor plate 23 and the insulator slab 22 is further facilitated. Ultimately, a firm bond is established between the insulator slab 22 and the conductor plate 23, and there the insulator slab 22 and the conductor plate 23 are firmly bonded with each other, without using adhesives. Typically, the foregoing d.c. voltage is applied for about 10 minutes.

Next, the insulator slab 22 thus prepared and carrying thereon the conductor plate 23 integrally, is then bonded upon the substrate 21 of FIG. 3 that carries thereon the emitter array 20. More specifically, the substrate 21 is held on a jig 41 shown in FIG. 7, and the slab 22 is placed upon the substrate 21 thus held on the jig 41. Thereby, the jig 41 has a fine adjustment mechanism 42 for adjusting the position of the insulator slab 22 with respect to the substrate 21, and the mechanism 42 is used for aligning the positioning marks 23*c* of the conductor plate 23 with respect to the corresponding alignment marks 21*a* on the substrate 21 within the accuracy of 1 μm, under microscopic observation. Although not illustrated, the jig 41 has a positioning part for abutting with the edge of the substrate 21 at a predetermined position. On the other hand, the foregoing fine adjustment mechanism 42 includes piezo elements for engaging with the edges of the foregoing slab 22 or plate 23 for moving the same in the direction of the arrows as well as corresponding return springs. Further, a microscope is provided for observing the state of the alignment.

Figure 8A:
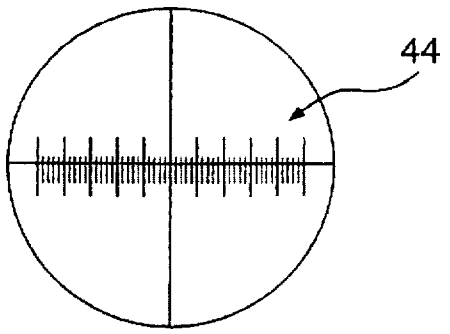
FIGS. 8A and 8B are diagrams showing the alignment process conducted in the step of FIG. 7.
Figure 8B:
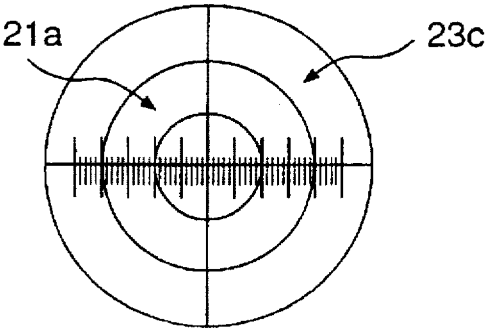

More specifically, the substrate 21 and the slab 22 are coarsely aligned within a precision of about 10 μm, by aligning the respective edges with each other. Next, while observing the positioning mark 23*c* by the microscope, the fine adjustment mechanism 42 is driven such that the mark 23*c* and the mark 21*a* overlap with each other concentrically. See FIGS. 8A and 8B showing such a microscopic alignment of the alignment marks 23*c* and 21*a*. In a typical example, an objective lens of ×20 magnification and an eye piece lens of ×10 magnification are used in the microscope, and the alignment of the mark 23*c* and the mark 21*a* is detected by using a cursor 44 that is formed in the view field of the eye piece lens.

In this process, the microscope is focused at the beginning upon surface of the substrate 21, and the jig 41 is moved such that the center of the mark 21*a*, which has a diameter of 50 μm, aligns with the center of the cursor 44. Next, while holding the substrate 21 firmly, the focusing of the microscope is changed to the surface of the conductor plate 23, and the fine adjusting mechanism 42 is activated until the center of the mark 23*c*, which has a diameter of 100 μm, aligns with the center of the cursor 44. Thereby, it is possible to align the center of the mark 21*a* and the center of the mark 23*c* within the precision of 1 μm.

After carrying out such an alignment for all of the marks 21*a* and 23*c*, the environmental pressure of the jig 41 is reduced to a pressure of $10^{-5}$ Torr or less. Further, by energizing a heating mechanism 43 of the jig 41, the temperature of the insulator slab 22 and the substrate 21, more specifically the temperature of the junction interface between the slab 22 and the substrate 21 is raised to about 300° C. By applying a d.c. voltage of about 300 volts across the slab 22 and the substrate 21 for about 10 minutes, such that the negative voltage is applied to the slab 22 and the positive voltage is applied to the gate electrode 21*b* on the substrate 21, one can achieve a firm bonding between the insulator slab 22 and the substrate 21. In this case, too, anodic bond is formed between the cations in the gate electrode 21*b* and the oxygen ions in the glass.

Figure 9:
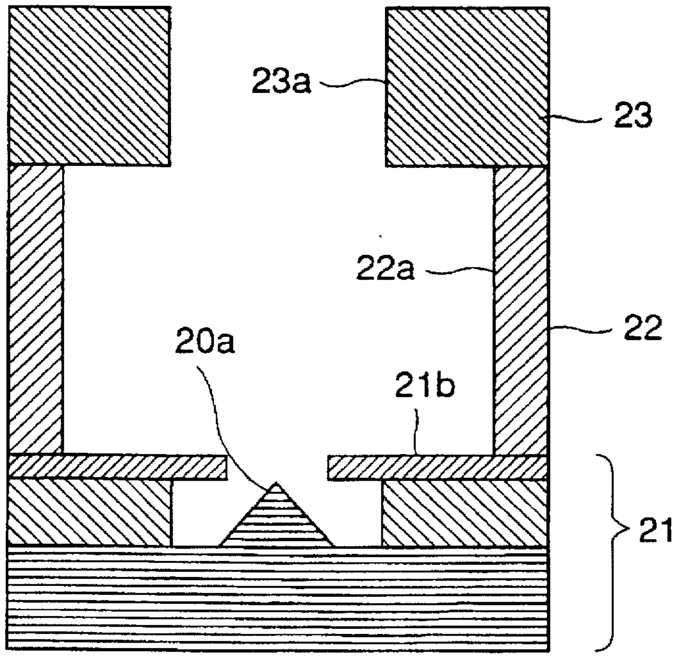
FIG. 9 is a diagram showing the construction of the micro field emission gun obtained according to the process of the first embodiment.

As a result of such an anodic bonding process, one obtains a micro field emission gun shown in FIG. 9, wherein the acceleration electrode 23 is separated from the gate electrode 21*b* by the insulator layer 22. In the structure of FIG. 9, the opening 23*a* formed in the acceleration electrode 23 and acting as the path of the electron beam aligns with the emitter 20*b* within the precision of 1 μm. As the insulator layer 22 is formed by the anodic bond of a thick insulator slab such as a glass slab, one can form the insulator layer 22 easily with a thickness exceeding 10 μm, in contrast to the conventional device that forms the insulator layer by a deposition process. In the illustrated example described heretofore, a slab of borosilicate glass having a thickness of 100 μm has been used. Of course, the material for the slab 22 is not limited to such a borosilicate glass but glasses of other composition may also be used. It is preferable that such a glass used for the slab 22 contains cations that can move relatively freely at the temperature used for the anodic bonding process.

In the micro field emission gun of FIG. 9, in which the acceleration electrode 23 is provided separately to the gate electrode 21*b* and the insulator layer 22 intervening between the gate electrode 21*b* and the acceleration electrode 23 with a thickness of at least 10 μm, preferably 100 μm or more, one can successfully avoid the problem of high acceleration voltage applied to the gate electrode 21*b* when accelerating the electron beam. Even when a voltage of several kilovolts is applied to the acceleration electrode 23, the electric field induced in the insulator layer 14 is reduced to 1/100–1/1000 of the electric field that is created therein when the same acceleration voltage is directly applied to the gate electrode, and the leak current flowing through the insulator layer 14 is substantially completely eliminated.

Figure 7:
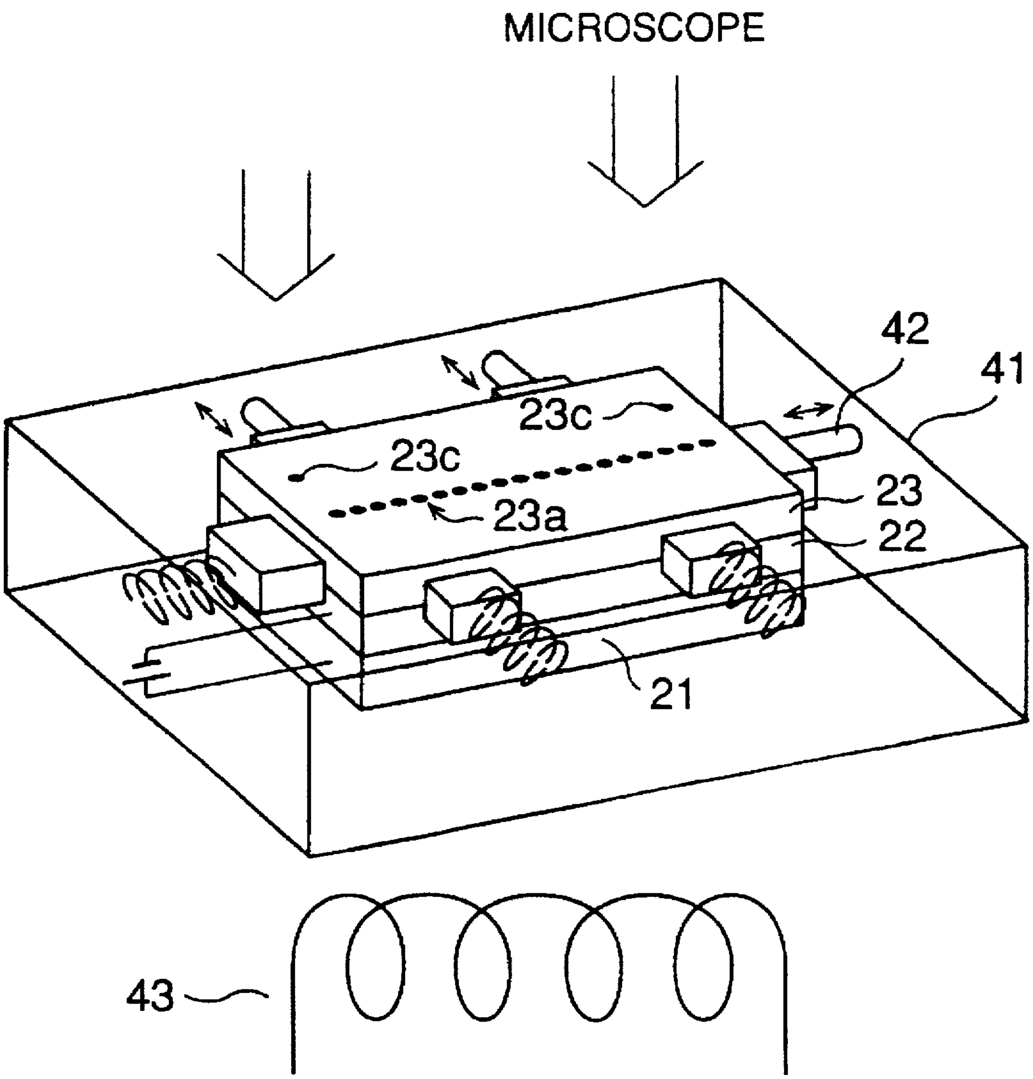

In the foregoing steps of FIGS. 6 and 7, it should be noted that the conductor layer 23 forming the acceleration electrode is anodically bonded upon the insulator slab 22 prior to the anodic bonding of the slab 22 upon the substrate 21. However, it is obvious that one can carry out the anodic bonding of the insulator slab 22 upon the substrate 21 first, followed by the anodic bonding of the conductor plate 23 upon the insulator slab 22. Further, the steps of FIGS. 6 and 7 may be conducted simultaneously.

[Second Embodiment]

Next, a second embodiment of the present invention will be described with reference to FIGS. 10A–8D, wherein the present embodiment achieves the desired separation of the acceleration electrode from the gate electrode by means of a p-n junction formed in a semiconductor substrate. In the description hereinafter, those parts corresponding to the parts described previously are designated by the same reference numerals and the description thereof will be omitted.

Figure 10A:
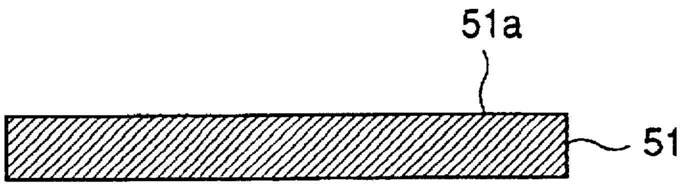
FIGS. 10A–10D are diagrams showing the fabrication process of the field emission gun according to a second embodiment of the present invention.

Referring to FIG. 10A, a p-type semiconductor substrate 51 is prepared. The substrate may be a Si substrate doped by B with a concentration of $10^{15}$ $cm^{-3}$ and may have a thickness of about 100 μm.

Figure 10B:
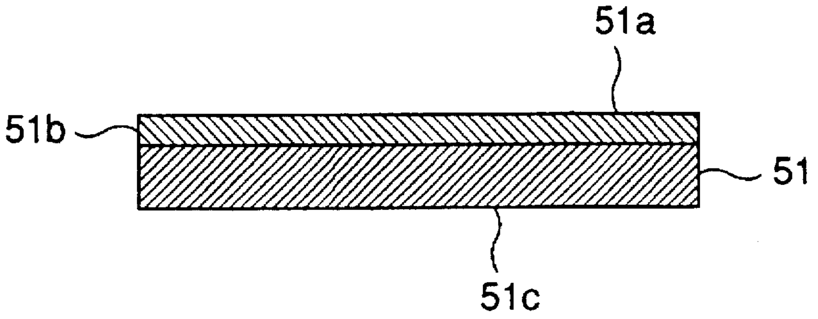

In the step of FIG. 10B, an n-type layer 51*b* of Si doped by P with a concentration level of $10^{15}$ $cm^{-3}$ is grown epitaxially on a principal surface 51*a* of the substrate 51 with a thickness of about 2 μm.

Figure 10C:
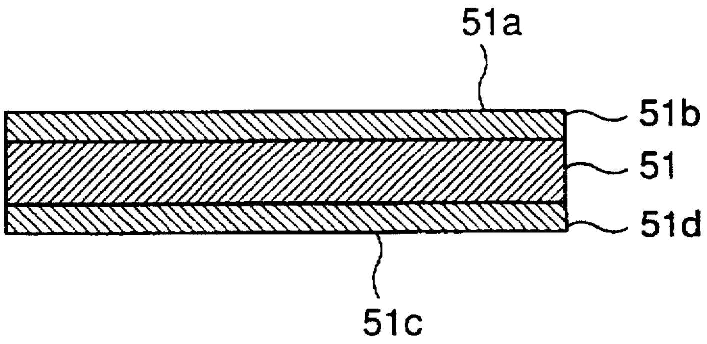
Figure 10D:
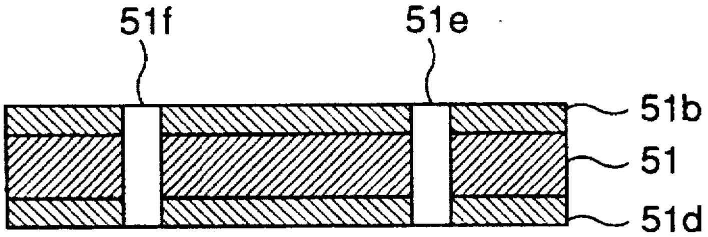

Further, in the step of FIG. 10C, an oxide film 51*d* is deposited on a second principal surface 51*c* of the substrate 51 opposite to the foregoing principal surface 51*a*, with a thickness of about 2 μm. Further, the step of FIG. 10D is conducted wherein a series of penetrating holes 51*e* are formed on the structure thus obtained by means of an electrospark machining process with a diameter of about 10 μm, wherein the holes 51*e* are formed with a pitch of 300 μm in correspondence to the emitters 20*a* on the substrate 21. It should be noted that the holes 51*e* act as a passage of the electron beams emitted from the emitters 20*a*. Further, a pair of penetrating holes 51*f* each having a diameter of about 100 μm are formed also on the structure thus obtained as an alignment mark, wherein the holes 51*f* are formed at respective positions predetermined with respect to the penetrating holes 51*e* with a precision of 1 μm or less. Further, by scribing the structure of FIG. 10D, one obtains a structure 50 of FIG. 11, wherein the structure 50 may have a size of 10 mm×5 mm.

Next, the structure 50 is placed upon the substrate 21 held on the jig 41 shown in FIG. 7, such that the oxide film 51*d* contacts with the gate electrode 21*b* covering the surface of the substrate 21. Further, by activating the fine adjustment mechanism, the structure 50 is aligned with respect to the substrate 21 under microscopic observation such that the alignment mark 51*f* of the structure 51 aligns with the corresponding alignment mark 21*a* of the substrate 21 within the precision of 1 μm.

Figure 11:
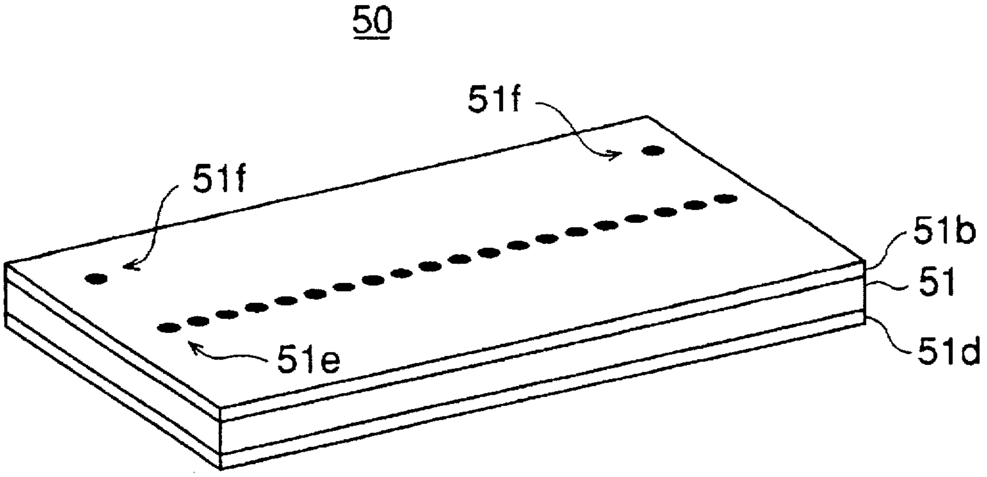
FIG. 11 is a diagram showing the construction of an accelerating structure used in the second embodiment.

After the foregoing alignment, the environmental pressure of the jig 41 is reduced to a pressure of $10^{-5}$ Torr or less similarly as before, and the anodic bonding of the oxide film 51*d* and the gate electrode 21*b* is achieved at 300° C. while applying a d.c. voltage of about 300 volts between the oxide film 51*d* and the gate electrode 21*b*. Again, a positive voltage is applied to the gate electrode 21*b* and a negative voltage is applied to the oxide film 51*d*. As a result, the structure 50 of FIG. 11 is firmly bonded upon the micro field emission gun 21 as indicated in the cross section of FIG. 12.

Figure 12:
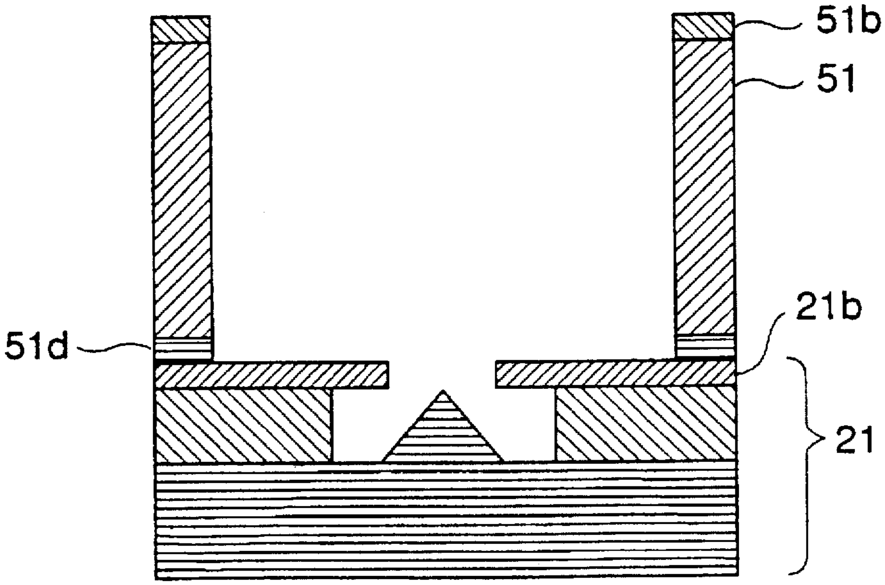
FIG. 12 is a diagram showing the construction of the micro field emission gun of the second embodiment.

In the operational state of the field emission gun of FIG. 12, it should be noted that a high voltage is applied to the n-type layer 51*b* of the structure 51. As a result, the p-n junction interface between the p-type substrate 51 and the n-type layer 51*b* is reversely biased, and the p-type substrate 51 acts, together with the n-type layer 51*b*, as an insulator layer. As the substrate 51 has a thickness of about 100 μm, the leak current through the substrate 51 is negligible even when a high acceleration voltage in the order of several kilovolts is applied to the n-type layer 51*b*. In this embodiment, it should further be noted that the n-type layer 51*b* acts as the acceleration electrode and it is not necessary to provide the acceleration electrode separately.

[Third Embodiment]

Next, a third embodiment of the present invention will be described with reference to FIGS. 13–20, wherein those parts described previously with preceding drawings are designated by the same reference numerals and the description thereof will be omitted.

Figure 13:
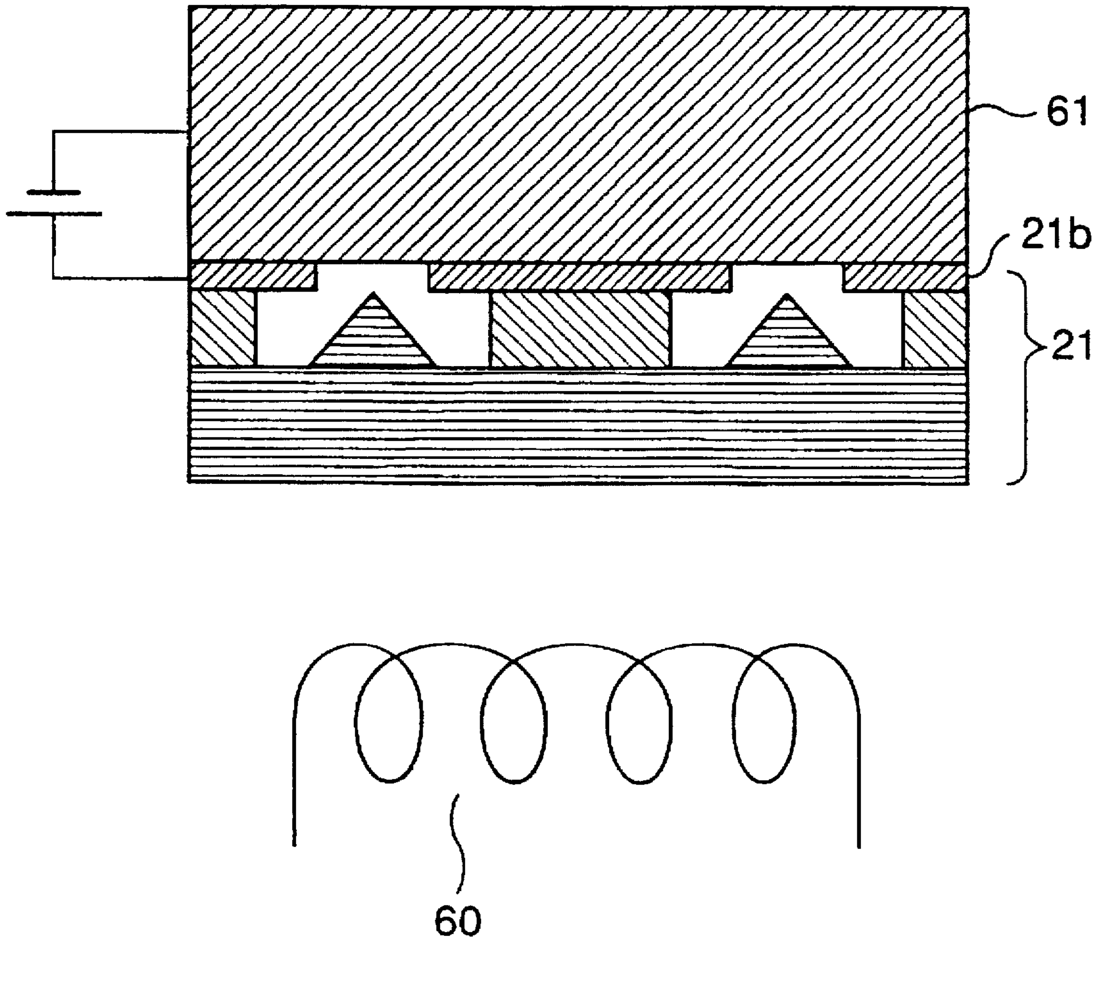
FIGS. 13–21 are diagrams showing the fabrication process of the micro field emission gun according to a third embodiment of the present invention.

Referring to FIG. 13, a glass slab 61 having a photosensitivity is bonded upon the substrate 21 on which the emitter array 20 is formed, by means of the anodic bonding process, wherein the glass slab 61 may have a thickness of about 100 μm. Such a photosensitive glass is available from HOYA Co., Ltd. Japan under the trade name of PEG3.

In the step of FIG. 13, the substrate 21 is held on the jig 31 shown in FIG. 6 and the environmental pressure of the jig 31 is reduced to the pressure of $10^{-5}$ Torr. Thereby, the glass slab 61 is bonded firmly upon the gate electrode 21*b* by conducting the anodic bonding process at 300° C. for 10 minutes while simultaneously applying a d.c. voltage of 300 volts, similarly as before. Again, a positive voltage is applied to the gate electrode 21*b* while a negative voltage is applied to the glass slab 61. In the case of FIG. 13, the heating of the jig is achieved by a heating mechanism 60. As a result of such an anodic bonding process, the glass slab 61 is firmly bonded upon the micro field emission gun 21 underneath.

Figure 14:
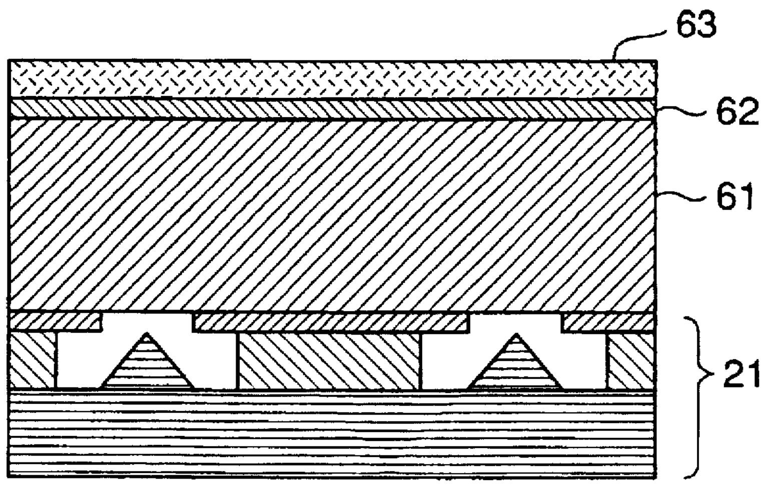
Figure 15:
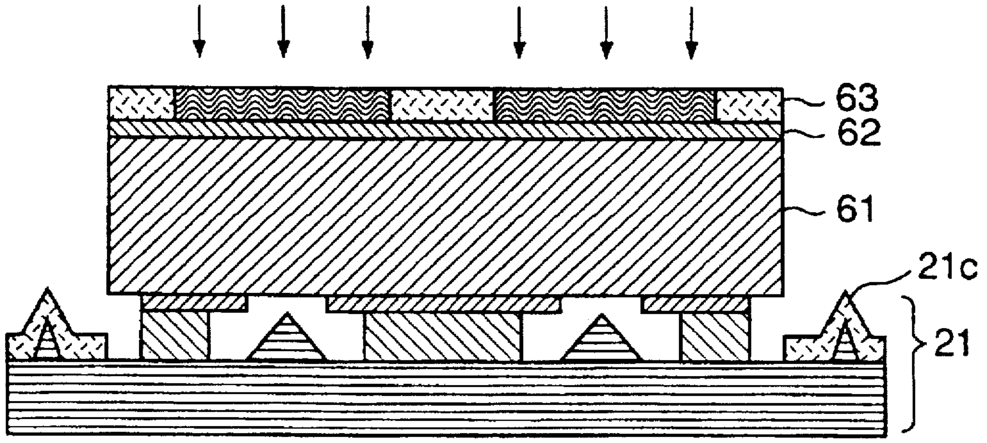
Figure 16:
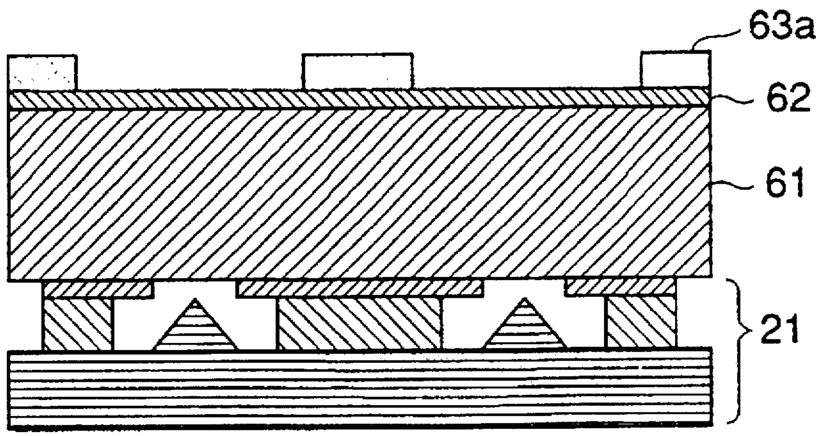
Figure 17:
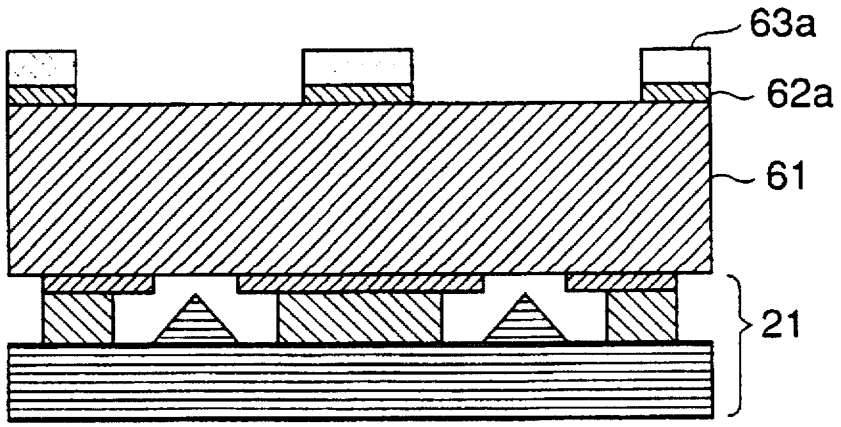

Next, in the step of FIG. 14, a layer 62 of Cr is deposited on the surface of the glass slab 61 by a vacuum deposition process with a thickness of about 0.5 μm, followed by a deposition of a positive resist layer 63 on the layer 62. Further, in the step of FIG. 15, the resist layer 63 is exposed according to a predetermined pattern, followed by the step of FIG. 16 for developing the resist layer 63 exposed in the step of FIG. 15. As a result of the development, a resist mask pattern 63*a* is formed such that only the region corresponding to the emitter 20*a* is exposed. In the exposure process of FIG. 15, it should be noted that the resist pattern 63*a* includes a number of openings each having a diameter of 50 μm and formed with a pitch of 300 μm in correspondence to the emitters 20*a* that form the emitter array 20 on the substrate 21, by using the exposure mask 21*c*, which has been used for the exposure of the emitter array 20, as the reference. Further, the step of FIG. 16 is conducted for patterning the Cr layer 62 while using the resist pattern 63*a* as a mask, and a Cr pattern 62*a* shown in FIG. 17 is obtained.

Figure 18:
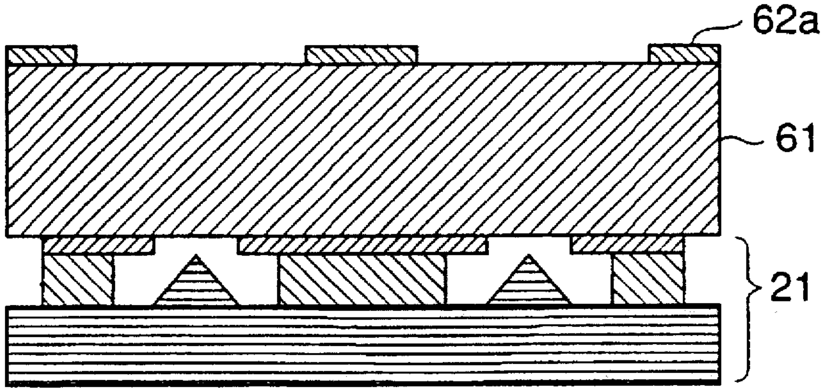
Figure 19:
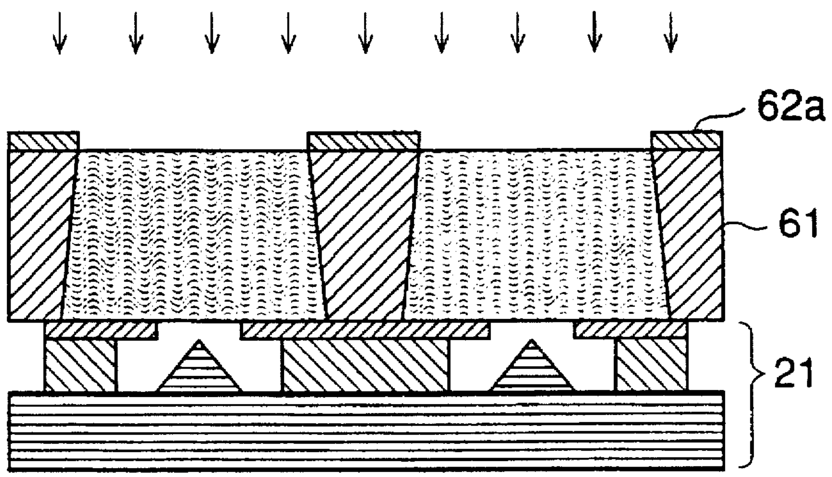
Figure 20:
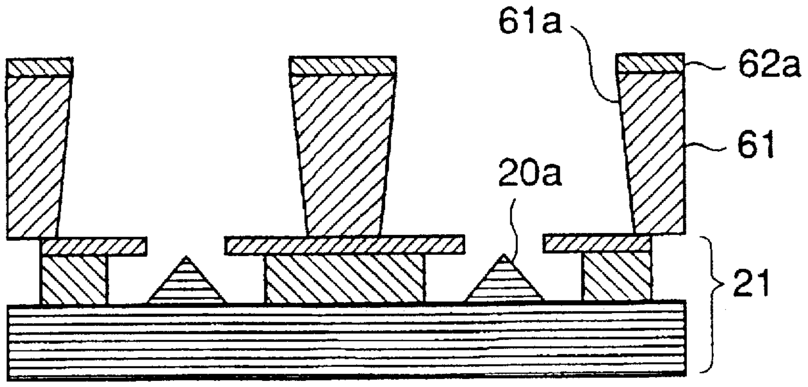

Further, in the step of FIG. 18, the resist pattern 63*a* remaining on the Cr pattern 62*a* is removed, and the exposure of the photosensitive glass slab 61 is conducted in the step of FIG. 19 while using the Cr pattern 62*a* as a mask. As a result, a latent image corresponding to the pattern of the mask 62*a* is formed in the glass slab 61. Further, the step of FIG. 20 is conducted, wherein the structure of FIG. 19 is heated to a temperature of about 400° C. As a result of such a thermal annealing process, the part of the glass slab 61, in which the latent image is formed, causes a crystallization, and the glass slab 61 changes to be soluble to acid as a result of such a crystallization. By dissolving the crystallized part of the slab 61 by an acid, therefore, one obtains a structure shown in FIG. 20, in which the glass slab 61 is formed with penetrating holes 61*a* in correspondence to the exposed region of the slab 61. The penetrating holes 61*a* thus formed serve for the passage of the electron beam. As already noted, the holes 61*a* have a diameter of about 50 μm and are formed with a pitch of about 300 μm in correspondence to the individual emitters 20*a*.

After the step of FIG. 20, the structure is heated to a temperature of about 650° C., and the glass forming the slab 61 crystallizes into a chemically as well as physically stable phase, which is also insensitive to the exposure.

Figure 21:
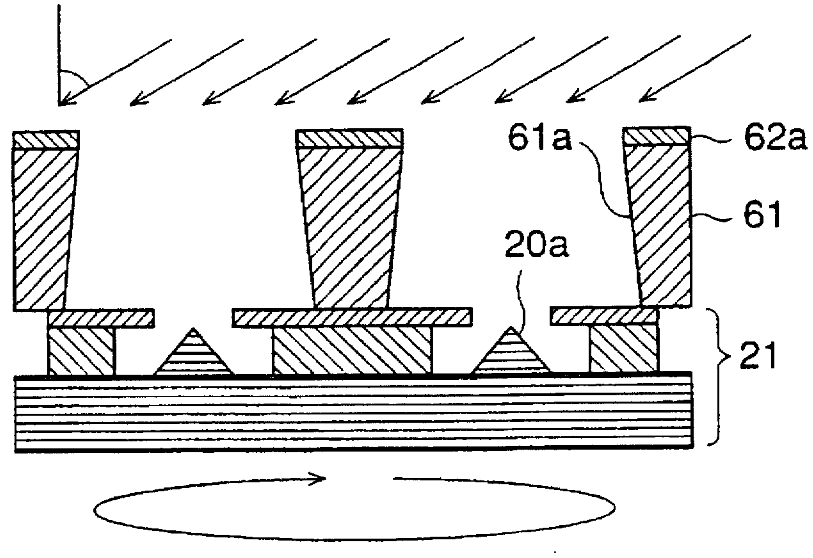
Figure 22:
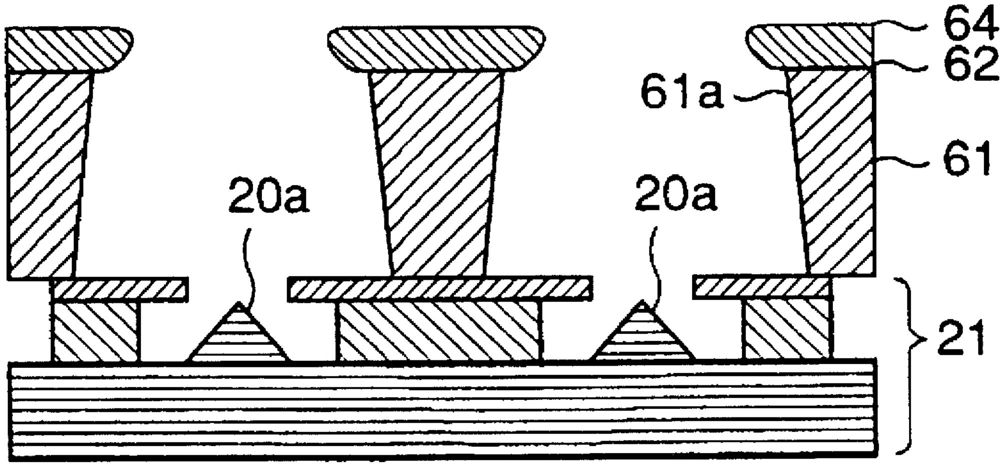
FIG. 22 is a diagram showing the construction of the micro field emission gun according of the third embodiment.

Finally, in the step of FIG. 21, the structure of FIG. 20 is subjected to a deposition of Cr while rotating the structure about an axis generally perpendicular to the substrate 21. Thereby, the Cr atoms are deposited obliquely with an angle of about 60 degrees, and causes a deposition of a thick Cr layer 64 selectively upon the Cr pattern 62*a* as indicated in FIG. 22. The Cr layer 64 is thereby used as the acceleration electrode of the micro field emission gun.

According to the process of the present embodiment, the insulation layer 61 and the acceleration electrode 64 are formed with a self-alignment, and the fabrication process of the micro field emission gun is substantially simplified. As the acceleration electrode 64 is formed on the thick insulation layer 61 similarly to the previous embodiments, the micro field emission gun of the present embodiment can effectively suppress the leak current in the insulation layer 61 even when a very high acceleration voltage is applied to the acceleration electrode 64.

[Fourth Embodiment]

When using the micro field emission guns of any of the previous embodiments to construct various apparatuses that use a high energy electron beam, examples of which may be electron microscopes, electron beam exposure apparatuses, electron micro analyzers, and the like, it is necessary to converge the obtained electron beam and deflect the same as desired. Of course, such beam convergence and deflection of electron beams are in principle possible by using conventional electron lenses or electrostatic deflectors, while it is more desirable to provide a compact electron lens or electron deflector suitable for integration with the micro field emission gun, in order to fully exploit the advantageous feature of the micro field emission gun that enables a reduction of the column of the electron optical system to several centimeters or less.

Figure 23:
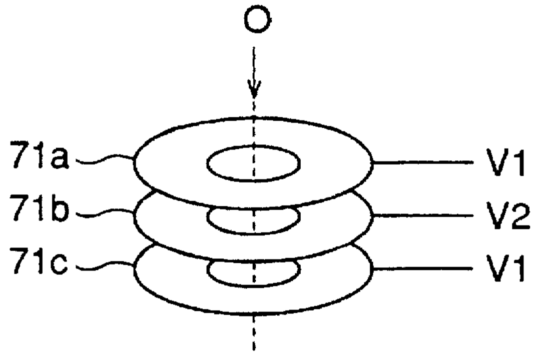
FIG. 23 PRIOR ART
FIG. 23 is a diagram showing the construction of a conventional so-called Einzel lens.

FIG. 23 shows the construction of an electrostatic lens or Einzel lens suitable for use in combination with the micro field emission gun of the present invention.

Referring to FIG. 23, the Einzel lens is formed of three annular electrodes 71*a*, 71*b* and 71*c* arranged consecutively and coaxially with respect to the optical axis of the electron beam, wherein a voltage $V_1$ is applied to the electrodes 71*a* and 71*c* while a different voltage $V_2$ is applied to the electrode 71*b*. As a result, the iso-potential surface deforms between the electrodes 71*a* and 71*b* and between the electrodes 71*b* and 71*c*, and the electron beam incident to the Einzel lens experiences a refraction symmetrically with respect to the optical axis. Thereby, it is possible to converge or diverge the electron beam as desired by setting the voltages $V_1$ and $V_2$.

Figure 24:
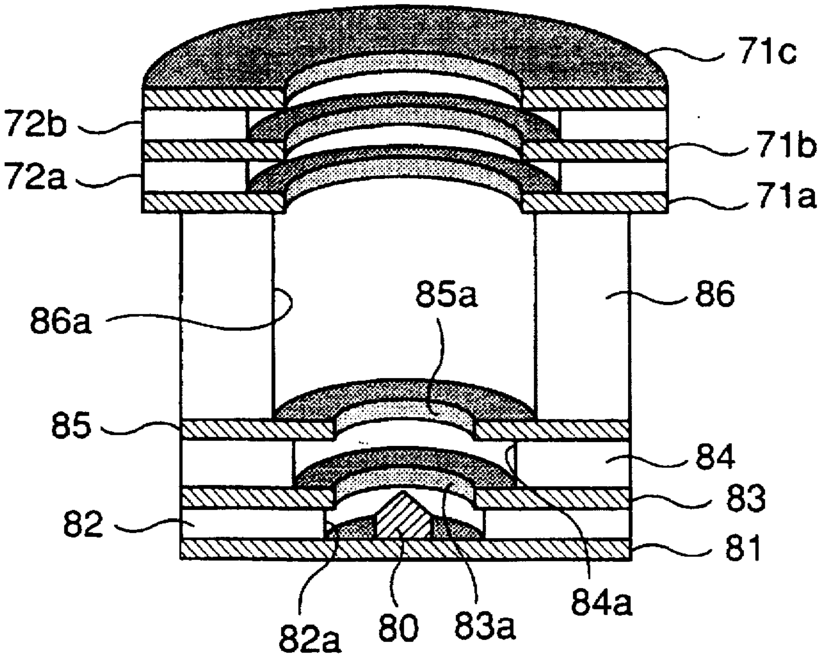
FIG. 24 is a diagram showing the construction of the micro field emission gun having an integral Einzel lens according to a fourth embodiment of the present invention;.

FIG. 24 shows the construction of the micro field emission gun that carries such an Einzel lens thereon.

Referring to FIG. 24, the micro field emission gun has a construction shown in FIG. 9, 12 or 22 and includes a substrate 81 carrying thereon an emitter 80, an insulation layer 82 provided on the substrate 81 and having a penetrating hole 82*a* surrounding the emitter 80, a gate electrode layer 83 provided on the insulation layer 82 and having an opening 83*a* surrounding the emitter 80 and acting as a passage of the electron beam, and another insulation layer 84 provided on the gate electrode 83 with a thickness of 10–100 μm and formed with a penetrating hole 84*a* acting as a passage of the electron beam, wherein the insulation layer 84 carries thereon an acceleration electrode 85 formed with an opening 85*a* that acts also as a passage of the electron beam. On the acceleration electrode 85, it should be noted that there is formed an insulation layer 86 having a penetrating hole 86*a* acting as a passage of the electron beam, and annular electrodes 71*a*, 71*b* and 71*c* are provided consecutively on the insulation layer 86 with intervening insulation layers 72*a* and 72*b* to form the Einzel lens of FIG. 23.

In the Einzel lens provided integrally to the micro field emission gun, it is necessary to form the openings of the annular electrodes 71*a*–71*c* to be in the order of 100 μm, in correspondence to the 300 μm pitch of the emitters forming the emitter array on the substrate 81.

While such annular electrodes having an opening of 100 μm diameter may be fabricated with precision by employing the microfabrication technology used in the production of semiconductor devices, use of such a microfabrication technology raises a problem in that a substantial leak current may flow through the thin insulation layers 72*a* and 72*b* in view of the voltage of about 1 kV applied across the electrodes 71*a*–71*c* as the foregoing voltages $V_1$ and $V_2$.

When forming the Einzel lens by bonding insulation slabs to the electrodes 71*a*–71*c* for avoiding the foregoing problem, on the other hand, it is necessary to align the optical axis of the lens by a machining process, while such a machining process has to be achieved with an alignment error of less than 1 μm. Further, use of adhesives for bonding the insulation slabs upon the electrodes is not preferred in view of the degradation of the high vacuum environment required for the apparatus of the electron gun. It should be noted that the electron guns has to be held in the vacuum environment of less than $10^{-9}$ Torr pressure. Thus, there has been substantial difficulty in providing Einzel lenses integrally to the field emission gun forming an emitter array on a substrate.

FIGS. 25A–25H show the fabrication process of the Einzel lens according to a fourth embodiment of the present invention.

Figure 25A:
FIGS. 25A–25H are diagrams showing the fabrication process of the micro field emission gun of the fourth embodiment.

Referring to FIG. 25A, a metal foil 91 of Cr or Ta having a thickness of about 50 μm is prepared, and an aperture having a diameter of 100 μm is formed in correspondence to each of the paths of the electron beams emitted from the emitter array of the field emission gun by means of the electrospark machining process with a tolerance of 1 μm or less. In the case of the foregoing embodiments in which the emitters are formed with a pitch of 300 μm, the apertures 90*a* are formed also with the pitch of 300 μm.

Figure 25B:
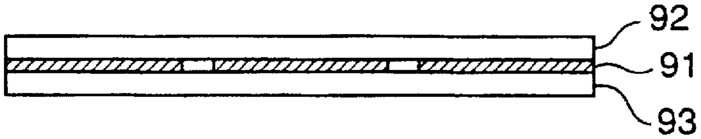

Next, in the step of FIG. 25B, glass slabs 92 and 92 of a borosilicate glass similar to the one used in the previous embodiments are bonded upon the upper and lower major surfaces of the metal foil 91 by means of the anodic bonding process. The anodic bonding process is conducted in the vacuum environment at the temperature of 300° C. while applying a d.c. voltage of 300 volts, similarly to the previous embodiments. In this anodic bonding process, the metal foil 91 is applied with the positive voltage while the glass slabs 92 and 93 are applied with the negative voltage.

Figure 25C:
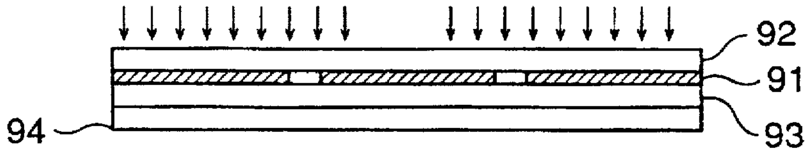
Figure 25D:
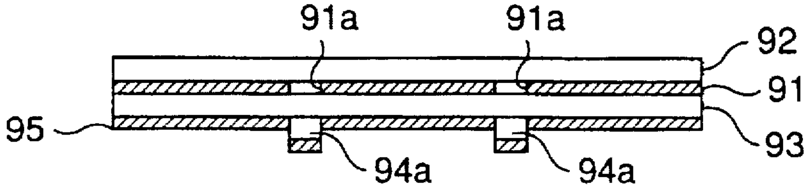
Figure 25E:
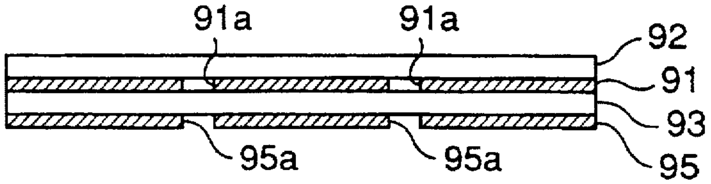

Next, in the step of FIG. 25C, a resist layer 93 is formed on the lower major surface of the glass slab 93 and irradiation of ultraviolet light is made upon the lower major surface of the glass slab 93 from the side of the glass slab 92. Thereby, the resist layer 94 experiences exposure according to the pattern of the metal foil 91, and the resist layer 94 thus exposed is developed in the step of FIG. 25D. As a result of the development, the resist layer 94 is removed except for a resist pattern 94*a* corresponding to the aperture 91*a*, and the lower major surface of the glass slab 93 is exposed except for the resist pattern 94*a*. After the development, a layer 95 of Cr is deposited upon the exposed lower major surface of the glass slab 93 by a vacuum deposition process, and the resist pattern 94*a* as well as the Cr layer thereon are removed subsequently in the step of FIG. 25E by liftoff.

Figure 25F:
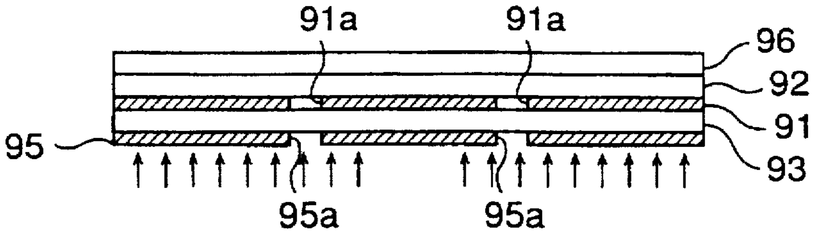
Figure 25G:
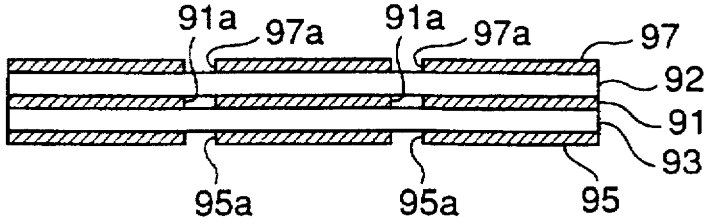
Figure 25H:
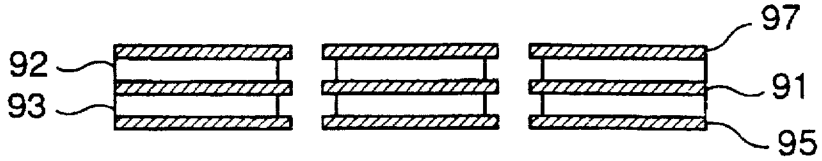

Next, a resist layer 96 is applied upon the upper major surface of the glass slab 92 in the step of FIG. 25F, wherein the layer 96 is exposed by a ultraviolet light from the side of the glass slab 93. Thereby, the Cr layer 95 and the metal foil 91 act as the exposure mask. After developing the resist layer 96, a Cr layer is deposited on the upper major surface of the glass substrate 92 while using the remaining resist layer 96 as a mask. Further, the resist layer 96 is subsequently lifted off together with the Cr layer thereon and one obtains a structure shown in FIG. 25G. Further, the glass slabs 92 and 93 are subjected to an etching process while using the Cr layers 95 and 97 thus formed as a mask, and a structure shown in FIG. 25H is obtained. In the structure of FIG. 25H, it should be noted that the metal foil 91 corresponds to the electrode 71*b*, the Cr layer 95 corresponds to the electrode 71*a*, and the Cr layer 97 corresponds to the electrode 71*c*.

In the process of FIGS. 25A–25H wherein the electrodes 95 and 97 experience a self-alignment patterning process, it will be noted that an ideal alignment is achieved for the optical axes of the annular electrodes. Further, one can provide a thick insulation layer between the annular electrodes without using adhesives at all. Thereby, a precise electrostatic lens is obtained without sacrificing the degree of vacuum, wherein such a lens can be operated without being restrained from the leak current flowing through the insulation layers.

Next, the mounting process of the Einzel lens fabricated according to the process of FIGS. 25A–25H upon the micro field emission gun will be described.

Figure 26:
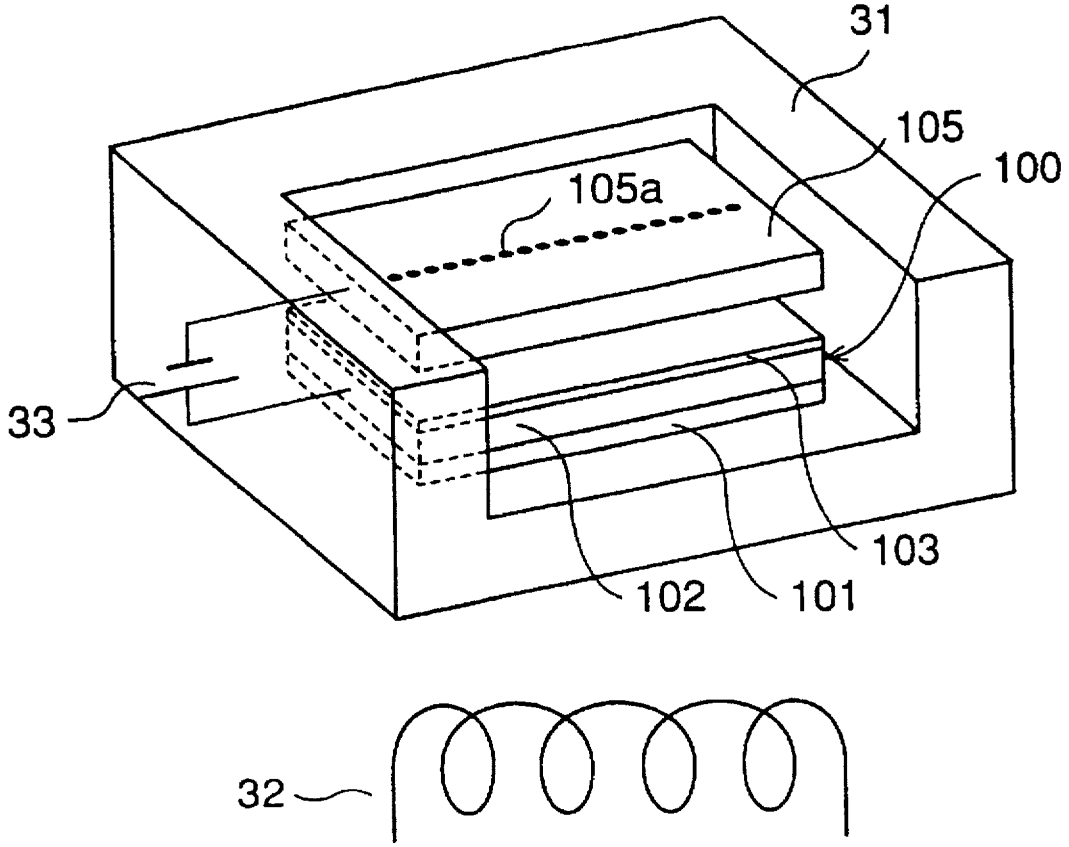
FIG. 26 is a diagram showing an alternative fabrication process of the micro field emission gun of the fourth embodiment.

Referring to FIG. 26, the jig 31 of FIG. 6 is used for holding the micro field emission gun 100, wherein the micro field emission gun 100 is constructed on a substrate 101 corresponding to the substrate 21 described before and includes an emitter array not illustrated in FIG. 26. The substrate 101 in turn carries an insulator slab 102 corresponding to the insulator slab 22, 51 or 61 described before and an acceleration electrode 103 formed on the insulator slab 102, wherein the electrode 103 corresponds to the electrode 23, 51*b* or 64 also described previously. In the step of FIG. 26, an insulator slab 105 of a borosilicate glass, and the like, is placed upon the acceleration electrode 103 such that each of penetrating holes 105*a* provided thereon is aligned with a corresponding emitter on the electron gun 100, and the slab 105 is bonded upon the acceleration electrode 103 of the micro field emission gun by means of an anodic bonding process. As the anodic bonding process is conducted similarly as before, further description thereof will be omitted.

Next, in the step of FIG. 27, the micro field emission gun 100 thus attached with the insulator slab 106 is held in the jig 41 described with reference to FIG. 7, wherein a lens structure 106 including an Einzel lens 106*a* having the structure of FIG. 25H is placed thereupon such that each lens 106*a* aligns with a corresponding emitter on the substrate 101. Thereby, it should be noted that the lens structure 106 carries an alignment aperture 106*b* at a predetermined position predetermined with respect to the lens 106*a*. Thus, it is possible to achieve an alignment of the lens structure 106 with respect to the micro field emission gun 100 within the error of 1 μm by activating the fine adjustment mechanism 42, while observing the alignment of the alignment mark on the field emission gun 100 with respect to the alignment aperture 106*b* by an optical microscope. Further, the lens structure 106 is fixed upon the field emission gun 100 by bonding the lowermost electrode 95 of the lens upon the insulator slab 105 by an anodic bonding process.

It will be noted that, in the micro field emission gun having such a construction, it is possible to provide the Einzel lens with an exact optical alignment.

[Fifth Embodiment]

FIGS. 28A–28D show a fabrication process of the Einzel lens according to a fifth embodiment of the present invention.

Figure 28A:
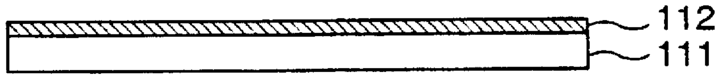
FIGS. 28A–28D are diagrams showing the fabrication process of a micro field emission gun having an integral Einzel lens according to a fifth embodiment of the present invention.

Referring to FIG. 28A, an undoped silicon substrate 111 of about 100 μm thickness is prepared, and a p-type epitaxial layer 112 is grown on a first principal surface of the substrate 111 with a thickness of about 2 μm. The layer 112 may be doped by B with an impurity concentration level of $10^{15}$ $cm^{-3}$.

Figure 28B:
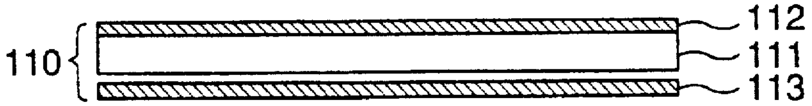

Next, in the step of FIG. 28B, an oxide film 113 is deposited on a second, opposite major surface of the substrate 111 with a thickness of about 50 nm. Thereby, a layered structural body 110 is obtained.

Figure 28C:
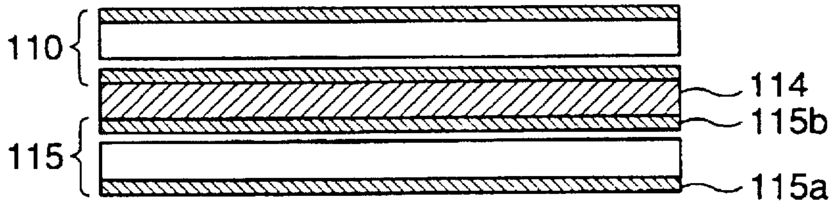

Next, in the step of FIG. 28C, a similar layered structural body 115 is formed by a similar process, wherein the structural body 110 and the structural body 115 are bonded with each other by an anodic bonding process with an intervening silicon substrate 114 of n-type, wherein the silicon substrate 114 may have a thickness of about 100 μm and is used as an electrode in the anodic bonding process. Here, it should be noted that the stacked layered body 115 carries a p-type layer 115*a* on a lower major surface thereof and an oxide film 115*b* on an upper major surface thereof. One may use a silicon substrate doped by an n-type dopant such as P to a concentration level of $10^{15}$ $cm^{-3}$ as the silicon substrate 114. The anodic bonding process may be conducted under the similar condition described before.

Figure 28D:
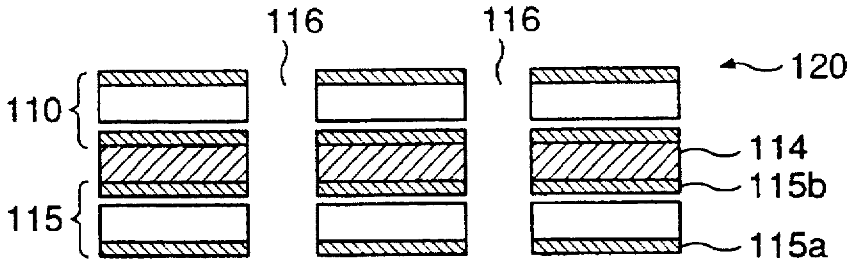

Further, in the step of FIG. 28D, the layered structural body obtained in the step of FIG. 28C is subjected to an electrospark machining process to form a penetrating hole 116 in correspondence to the emitter of the field emission gun 100 as a passage of the electron beam. Thereby, one obtains a structural body 120 that acts as the Einzel lens.

Figure 27:
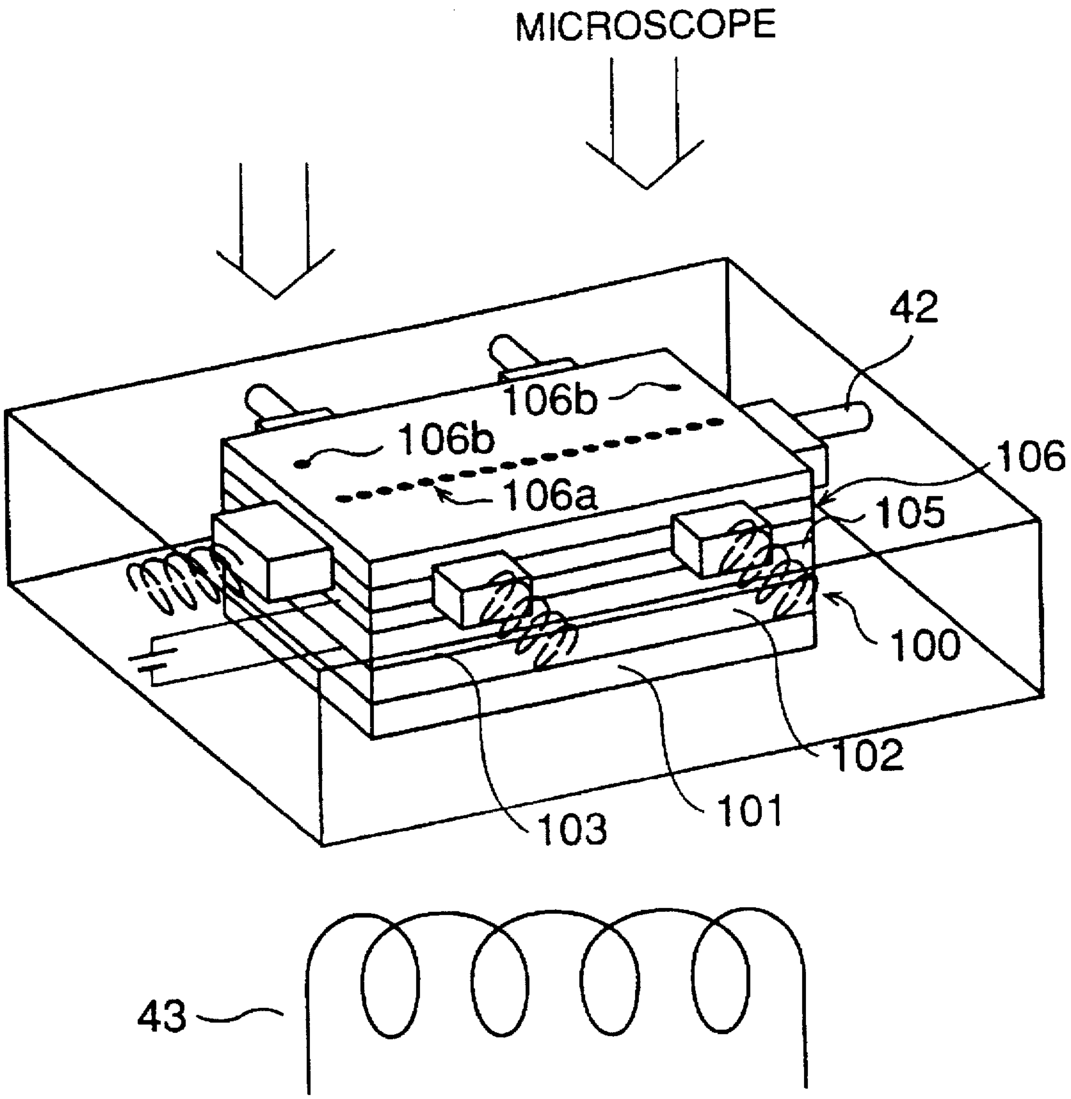
FIG. 27 is a diagram showing a further alternative fabrication process of the micro field emission gun of the fourth embodiment.

The structural body 120 obtained in the steps FIGS. 28A–28C may be also provided upon the insulation slab 105 by the anodic bonding process in place of the structural body 106 in the step of FIG. 27 to form the desired field emission gun. In this case, the p-type layer 112 corresponds to the electrode 71*c* of FIG. 25, the n-type layer 114 corresponds to the electrode 71*b*, and the p-type layer 115*a* corresponds to the electrode 71*a*. In this structure, the p-type layers 112 and 115 are applied with a negative voltage while the n-type layer 114 is applied with a positive voltage, such that the p-n junction formed therein is reversely biased. Further, one may reverse the conductivity type of the layers 112, 114 and 115*a*.

Figure 29:
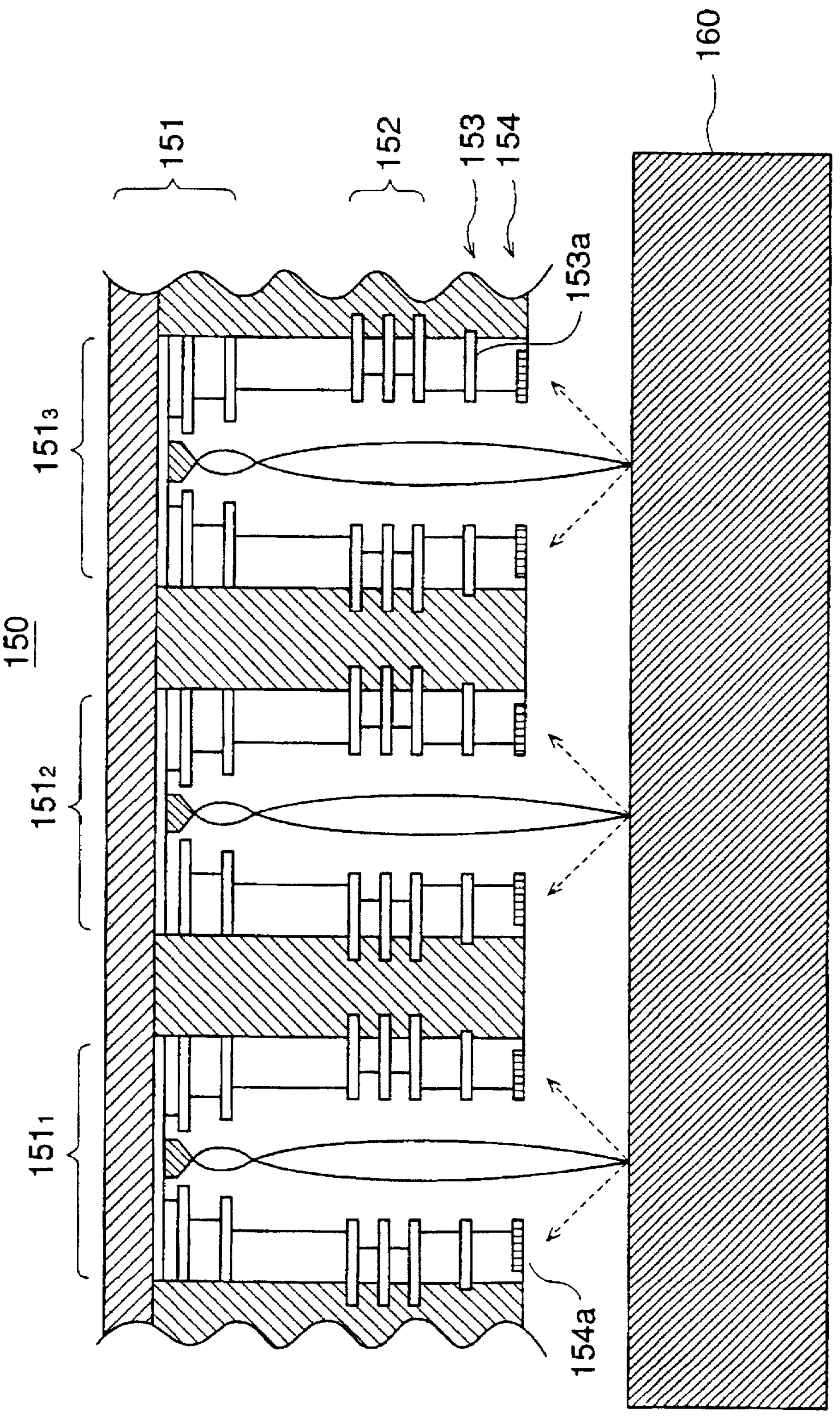
FIG. 29 is a diagram showing the construction of an inspection device that uses the micro field emission gun of the present invention.

FIG. 29 shows the construction of a semiconductor inspection device 150 that uses the micro field emission gun carrying therein an integral Einzel lens.

Referring to FIG. 29, the inspection device 150 includes an electron beam source 151 formed of a number of micro field emission guns $151_1$–$151_3$ each including an emitter, a gate electrode and an acceleration electrode, wherein a plurality of Einzel lenses 151 are provided in correspondence to the field emission guns $151_1$–$151_3$. It should be noted that the device of FIG. 29 further includes electrostatic deflectors 153 provided in correspondence to the field emission guns $151_1$–$151_3$, wherein the electrostatic deflector includes electrodes 153*a* formed according to a process similar to the process for forming the Einzel lens. Thus, in each of the field emission guns, the electron beam emitted from the emitter is accelerated by the acceleration electrode and is focused upon an object 160 by the Einzel lens 160. In the illustrated construction, there are also provided electrodes 154*a* facing the object 160, wherein the electrodes 154*a* act as a detector 154 for detecting reflected or back scattered electrons.

The device of FIG. 29 scans the object 160 simultaneously by a number of electron beams and an efficient pattern inspection becomes possible. Of course, the device of FIG. 29 has a much compact size as compared with the conventional inspection apparatus that uses a conventional electron gun and a corresponding column.

Further, the present invention is useful also for electron beam exposure systems that exposes a pattern of a substrate by a focused electron beam.

[Sixth Embodiment]

In the view point of production or cost of the micro field emission guns described heretofore, it is desired to fabricate a large number of micro field emission guns simultaneously.

However, such a mass production of the field emission guns has been difficult.

More specifically, when fabrication a large number of micro field emission guns simultaneously, it is necessary to bond the micro field emitter guns, the insulators and the acceleration electrodes while they are in the form of wafers, while such a process bonding the wafers is substantially difficult as compared with the process for bonding the parts of individual micro field emission guns.

For example, the micro field emitter guns, the insulators, and the acceleration electrodes have to be formed without misalignment, and the bonding of the wafers has to be conducted without defect for the entire surface thereof.

Further, scribing process for separating the individual micro field emission guns has to be optimized.

Thus, the embodiments hereinafter addresses the problem of mass production of the micro field emission guns, wherein the sixth embodiment described hereinafter shows the case in which the gate electrode is used for the anodic bonding process and the d.c. voltage is supplied to two electrode pads on the wafer when carrying out the anodic bonding process.

a) FABRICATION OF MICRO FIELD EMITTER TIP

Figure 69:
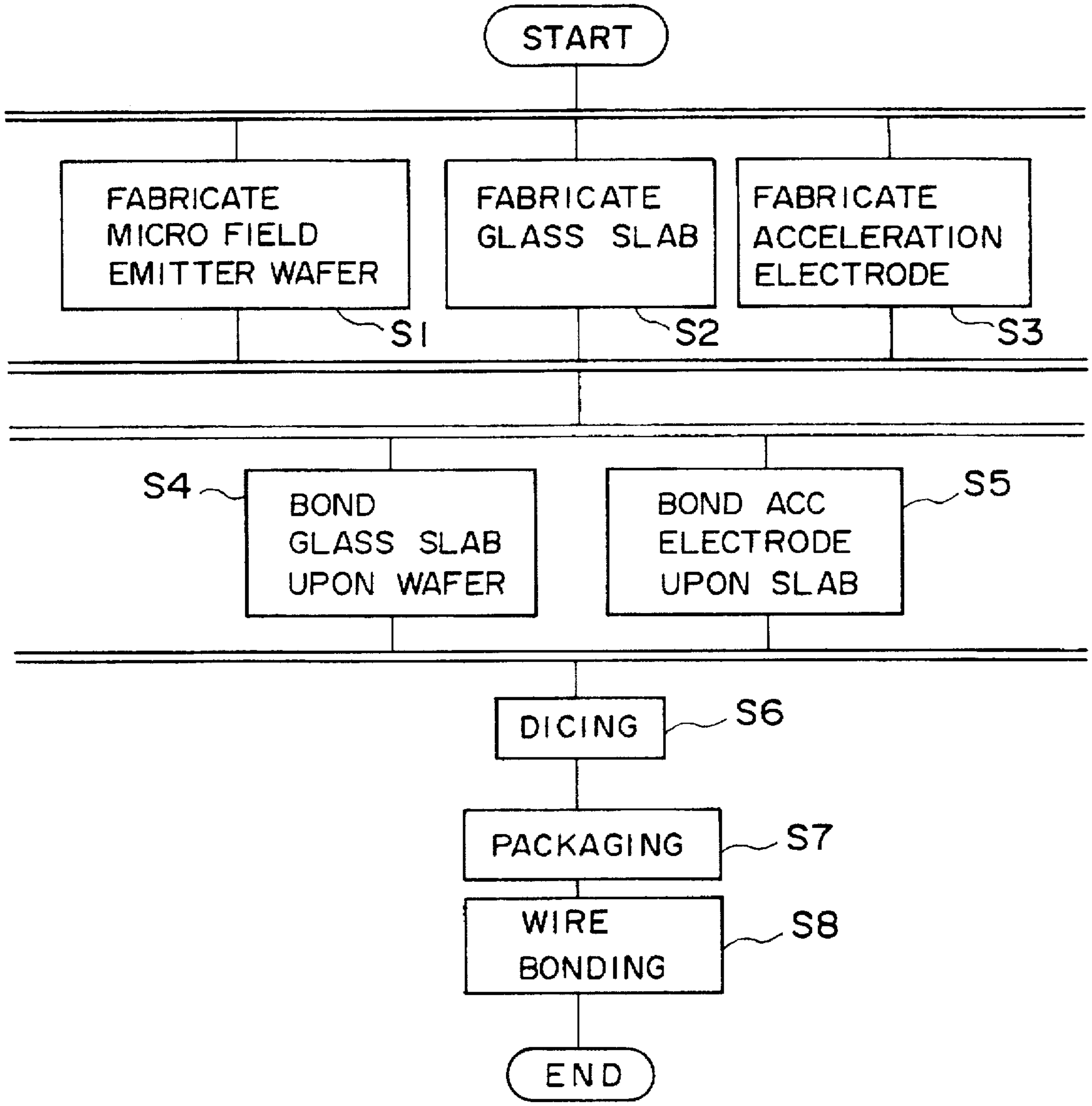
FIG. 69 is a flowchart showing the fabrication process of the micro field emission gun of the present invention.

The process corresponds to a step S1 of FIG. 69 and uses a micro fabrication technology of semiconductor devices.

Figure 30:
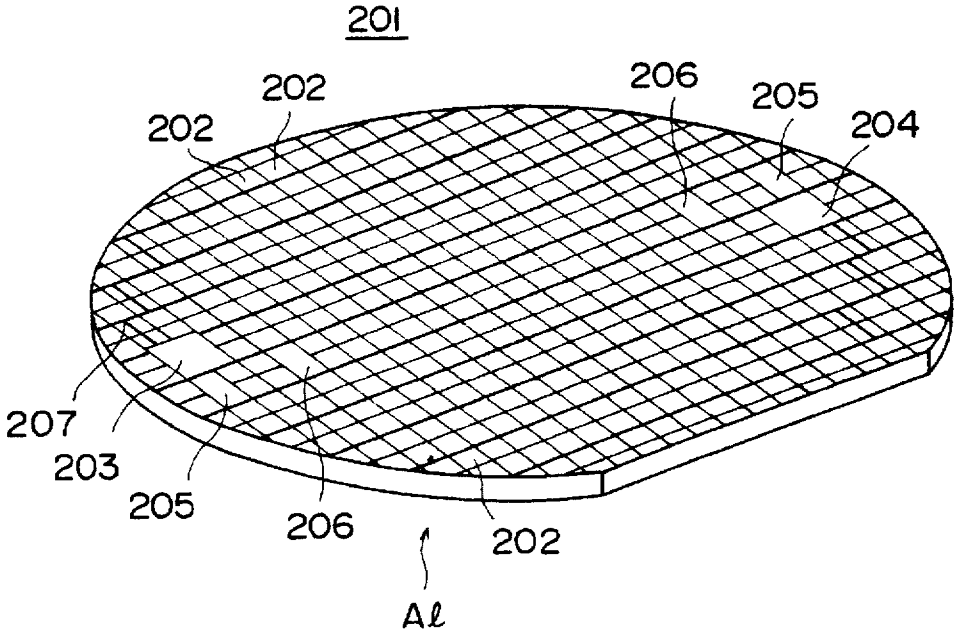
FIG. 30 is a diagram showing a silicon wafer used for constructing micro field emission guns of a sixth embodiment of the present invention in a perspective view.

FIG. 30 shows a silicon (Si) wafer 201 on which a number of micro field emission guns 202 are formed, wherein a first electrode pad 203 used for anodic bonding process, a second electrode pad 204 used also for anodic bonding process, a first alignment mark 205 for aligning the wafers, and a second alignment mark 206 used also for aligning the wafers, are provided also on the wafer 201. Further, each of the micro field emission guns 202 is connected to one of the first electrode pad 203 and the second electrode pad 204 via a conductor pattern 207. In the illustrated example, the silicon wafer 201 may have a diameter of 203 inches and a thickness of 500 μm.

Figure 31:
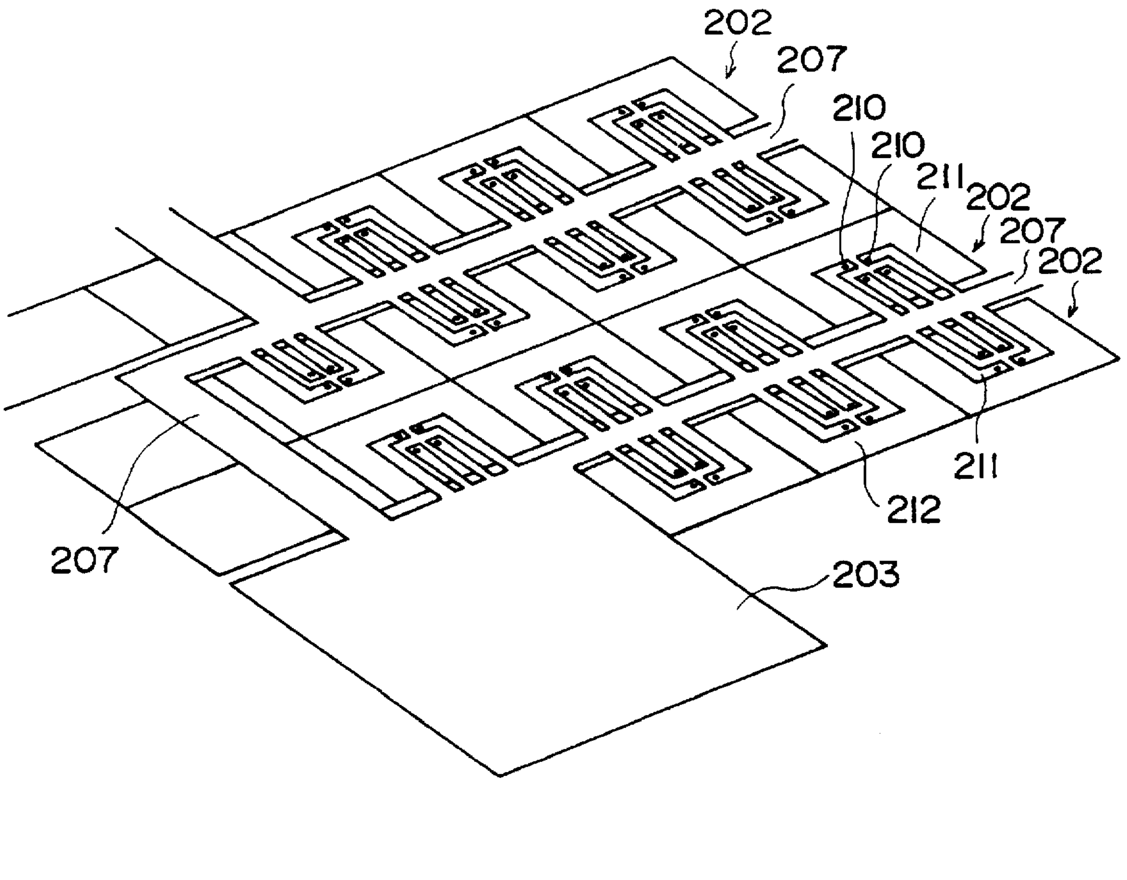
FIG. 31 is a diagram showing the silicon wafer of FIG. 30 in an enlarged scale.
Figure 32:
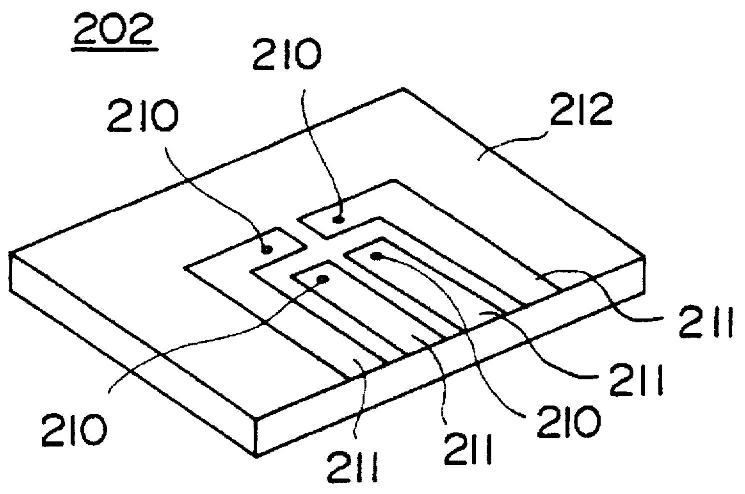
FIG. 32 is a diagram showing a single micro field emission gun of the sixth embodiment in a perspective view.

Each of the micro field emission guns 202 typically has a size of about 3 mm×3 mm and includes four emitters 210 disposed on the silicon substrate with a separation of about 500 μm, wherein there is a gate electrode 211 on the emitters 210 as indicated in FIG. 31 or FIG. 32, with an insulator layer 212 of SiO provided so as to intervene between the gate electrode 211 and the wafer 201.

One may use various materials for the emitter 210, in addition of silicon, wherein such materials include W, Ni, Au, and the like.

As indicated in FIG. 230, the first alignment mark 205 is formed at a position offset from the center of the silicon wafer 201 by a distance of 30–35 mm, while the second alignment mark 206 is formed at a position offset from the center by a distance of 20–25 mm. The alignment marks 205 and 206 may be formed by conducting an exposure simultaneously to the exposure of the field emission guns by using the same exposure mask, followed by a patterning process.

Further, the rear surface of the silicon wafer 201 is covered by an aluminum film.

It should be noted that each of the gate electrodes 211 of the micro field emission guns is connected to one of the electrode pads 203 and 204 via the conductor pattern 207, while the conductor pattern 207 is formed such that the gate electrode 211 is disconnected from the corresponding electrode pad upon scribing of the wafer 201 into individual field emission guns 202.

b) PREPARATION OF INSULATOR GLASS SLAB

This step corresponds to a step S2 of FIG. 69 and is conducted by using the microfabrication technology of semiconductor devices.

Figure 33:
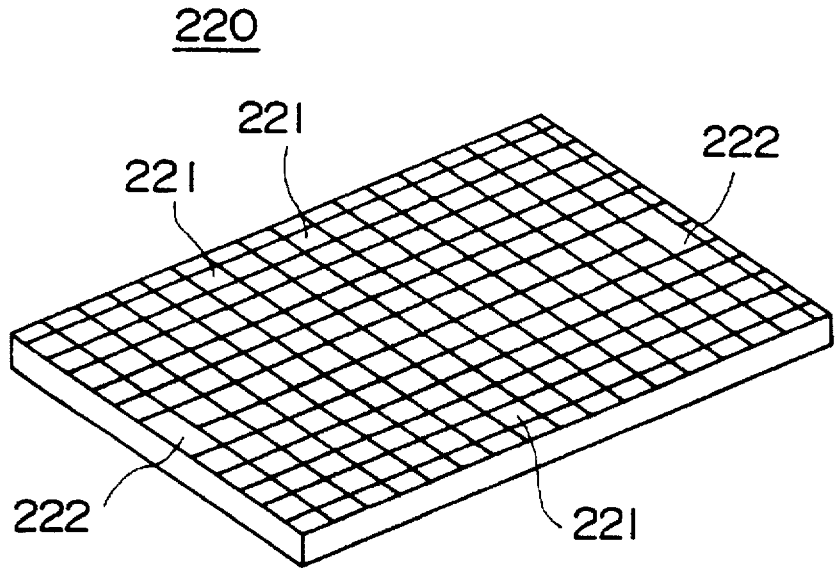
FIG. 33 is a diagram showing an insulation glass slab used in the sixth embodiment in a perspective view.

FIG. 33 shows a glass slab 220 in which a number of cells 221 are formed together with a third alignment mark 222, wherein the alignment mark 222 is formed at a position corresponding to the alignment mark 206 described before.

Figure 34:
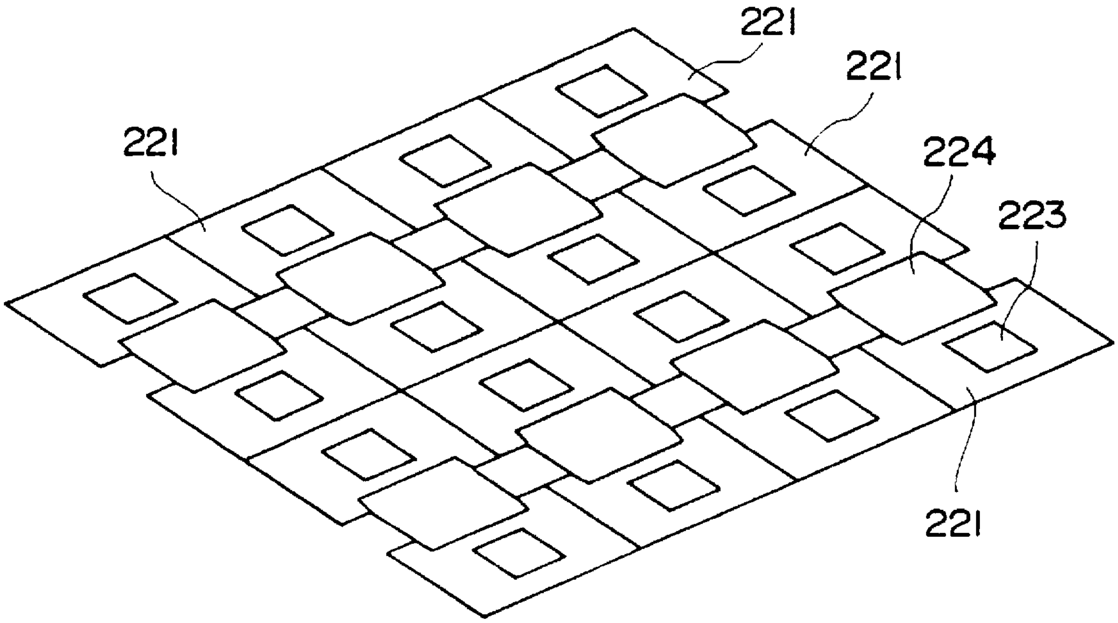
FIG. 34 is a diagram showing the glass slab of FIG. 33 in an enlarged scale.

Referring to FIG. 34 showing the glass slab 220 in an enlarged scale, it will be noted that there are formed an opening 223 used as a passage of the electron beam of the micro field emission gun as well as an opening 224, wherein the opening 224 forms a cutout region when the field emission guns are separated individually as a result of scribing. Thereby, the cutout region serves for disconnecting the gate electrode 211 from the electrode pad 203 or 204 in each device.

It should be noted that the glass slab 220 has a size such as 50 mm×50 mm×100 mm, which size being selected such that the electrode pads 203 and 204 on the silicon wafer 201 are exposed and such that the first alignment mark 205 used for aligning the silicon wafer 201 and an acceleration electrode to be described layer is not covered.

The foregoing third alignment mark 222, the first opening 223 and the second opening 224 may be formed by a sand blasting process.

Figure 35:
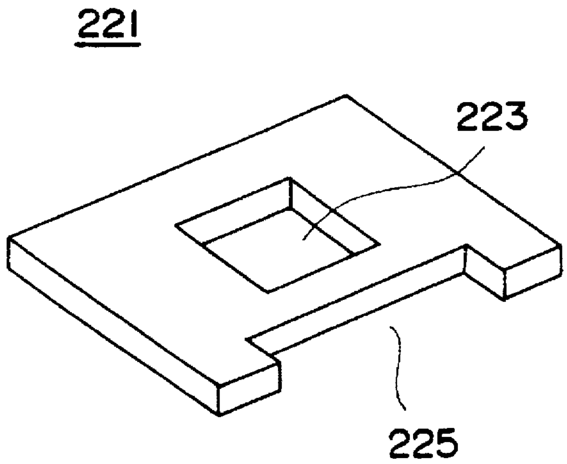
FIG. 35 is a diagram showing a piece of the glass slab used in the micro field emission gun of the sixth embodiment in a perspective view.

FIG. 35 shows a glass piece corresponding to the cell 221 defined in the glass slab 220 in a perspective view, wherein the illustrated piece is hereinafter designated by the numeral 221.

Referring to FIG. 35, the glass piece 221 includes a rectangular first opening corresponding to the opening 223 of FIG. 34 and a cutout 225 corresponding to the opening 224 of FIG. 34, wherein the cutout 225 is formed as a result of scribing of the glass slab 220.

c) FABRICATION OF ACCELERATION ELECTRODE

The step corresponds to a step S3 of FIG. 69 and is conducted by employing a microfabrication process of semiconductor devices.

Figure 36:
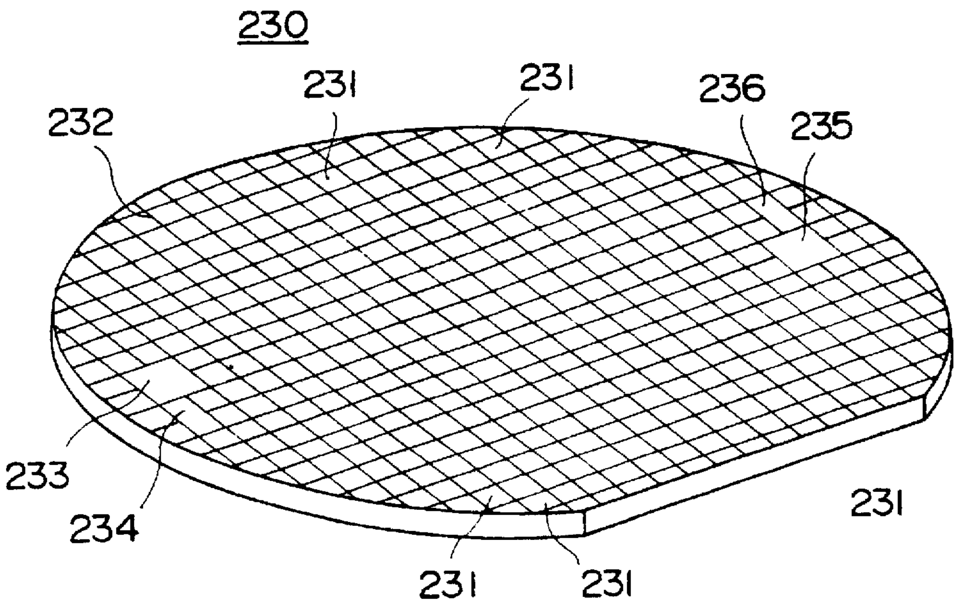
FIG. 36 is a diagram showing a silicon wafer used for the acceleration electrode in the sixth embodiment in a perspective view.
Figure 37:
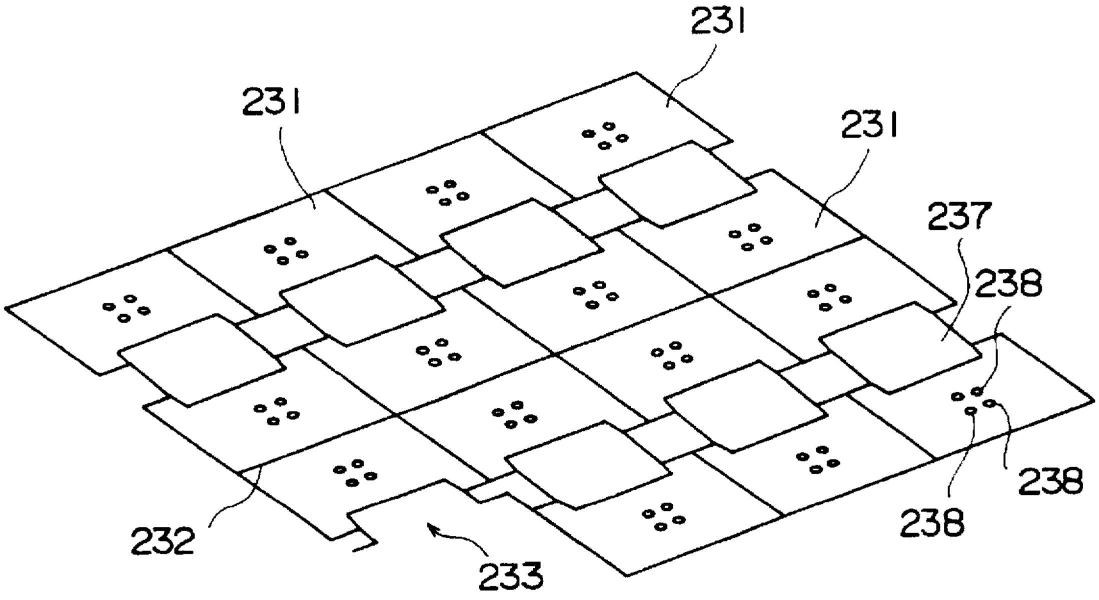
FIG. 37 is a diagram showing the silicon wafer of FIG. 36 in an enlarged scale.
Figure 38:
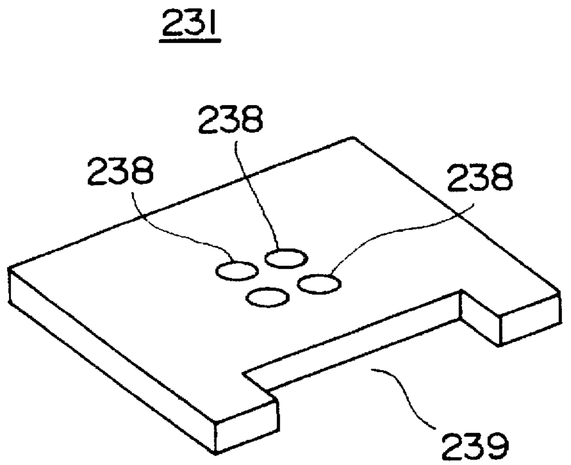
FIG. 38 is a diagram showing the acceleration electrode of the field emission gun of the sixth embodiment in a perspective view.

FIG. 36 shows a silicon wafer 230 used for the acceleration electrode in a perspective view, wherein FIG. 36 shows the silicon wafer 230 viewed from a side not bonded upon the field emission guns.

Referring to FIG. 36, the silicon wafer 230 includes a number of cells 231 each acting as an acceleration electrode, wherein the cells 231 are separated from each other by scribe lines 232. Further, the wafer 230 includes a third opening 233 used for passing a lead that supplies a d.c. current for the anodic bonding process, as well as a fourth alignment mark for checking the alignment at the time of bonding. Further, the wafer 230 includes a fourth opening 235 used for passing a lead that supplies a d.c. current for the anodic bonding process, as well as a fifth alignment mark 236 for checking the alignment at the time of bonding. In the illustrated example, the silicon wafer 230 may have a diameter of 203 inches and a thickness of about 200 μm.

Each of the acceleration electrodes corresponding to the cell 231 has a size of 3 mm×3 mm and carries sixth apertures 238 in correspondence to the four emitters 210 of the micro field emission gun (see FIGS. 31 and 32), wherein the sixth apertures 238 act as a passage of the electron beam. There are four such apertures 238 on the wafer 230. Further, there are formed a number of fifth apertures 237 wherein the fifth apertures 237 are so provided to form a second cutout 239 upon scribing of the wafer 230, wherein the second cutout 239 enables an electric connection to the gate electrode 211 upon completion of the fabrication of the micro field emission guns.

Figure 39:
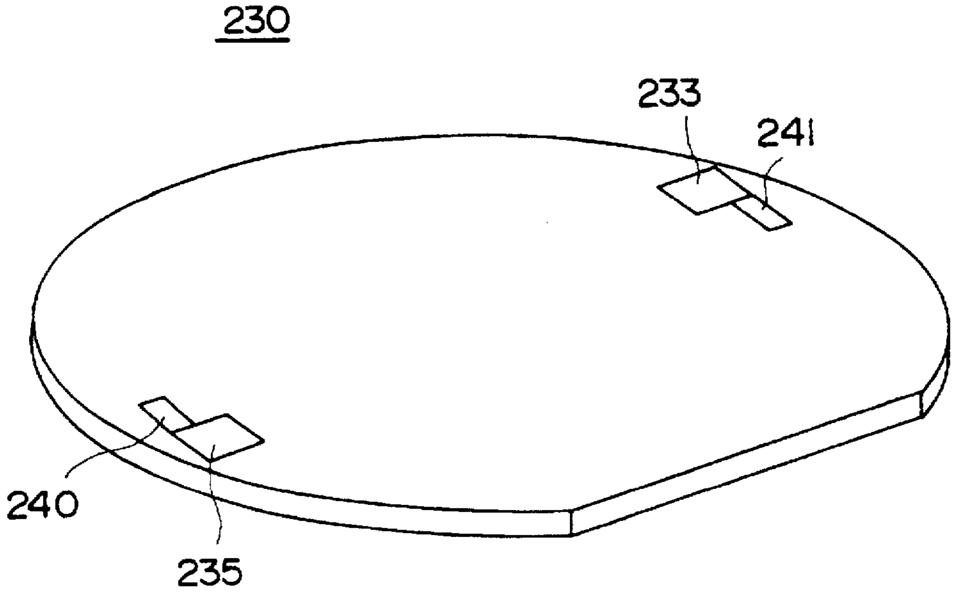
FIG. 39 is a diagram showing the rear side of the silicon wafer of FIG. 36.

FIG. 39 shows the silicon wafer 230 in another perspective view, wherein FIG. 39 shows the side of the wafer 230 that is contacted upon the field emission gun formed on the wafer 201.

Referring to FIG. 39, it will be noted that the silicon wafer 230 includes the foregoing third and fourth openings 233 and 235, as well as sixth and seventh alignment marks 240 and 241 for the alignment of the wafer 230 at the time of the anodic bonding process thereof.

Here, the process for forming the acceleration electrode upon the silicon wafer will be described.

First, the fourth and fifth alignment marks 234 and 236 as well as the scribe lines 232 are formed on a first side of a silicon wafer by using a two-side mask aligner, followed by a formation of the sixth and seventh alignment marks 240 and 241 on the other side of the same wafer. See the process of FIG. 40A.

Figures 40A, 40B, 40C, 40D:
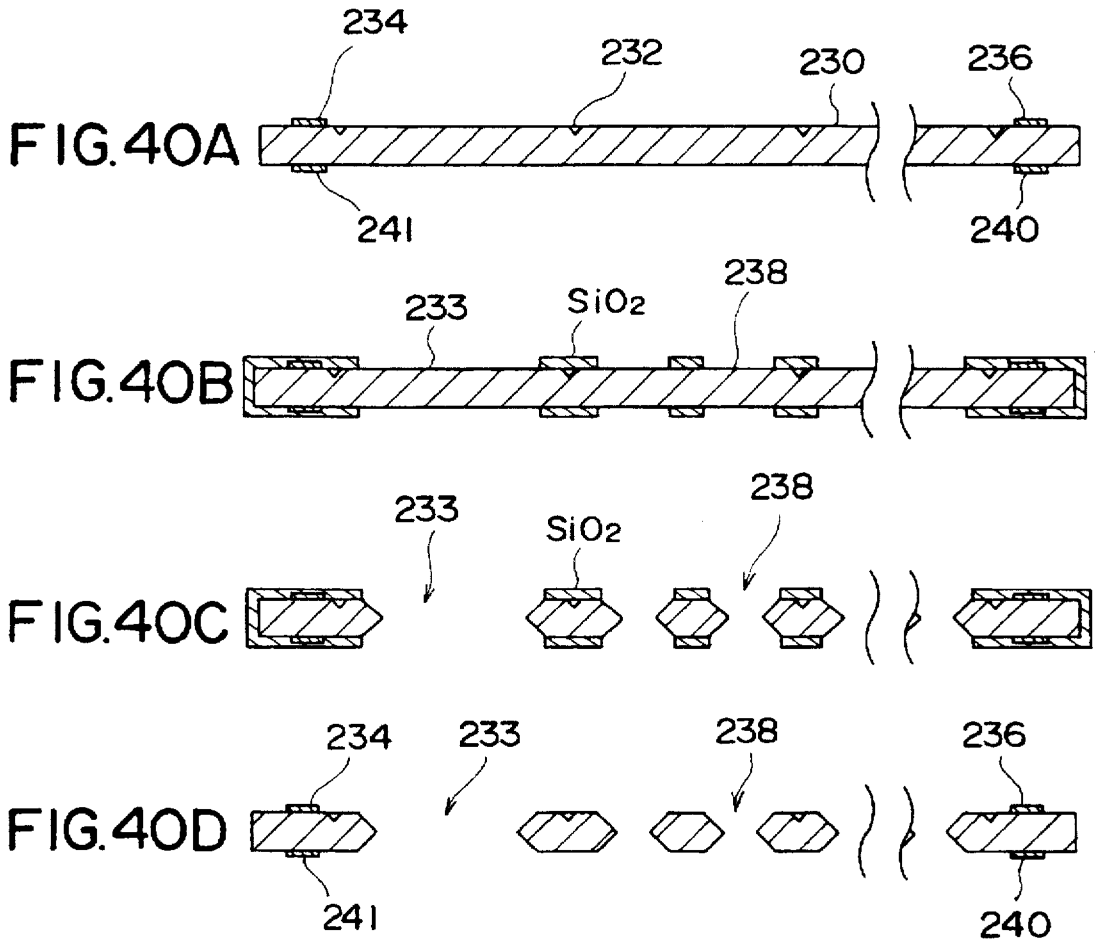
FIGS. 40A–40D are diagrams showing the fabrication process of the acceleration electrode of the sixth embodiment.

In FIG. 40A, it should be noted that the fourth alignment mark 234 and the seventh alignment mark 241 are formed on the corresponding locations across the silicon wafer. Similarly, the fifth alignment mark 236 and the sixth alignment mark 240 are formed on the corresponding locations across the silicon wafer.

Next, by using the fourth and fifth marks 234 and 236, an etching mask of $SiO_2$ is provided on the wafer at the side of the marks 234 and 236. Similarly, another etching mask of $SiO_2$ is formed on the side of the wafer on which the marks 240 and 241 are provided. See the process of FIG. 40B.

Next, the silicon wafer is subjected to an etching process in an alkaline etchant such as KOH, wherein the openings 233, 235, 237 and 238 are formed as indicated in FIG. 40C.

Further, the etching mask of $SiO_2$ is removed by a buffered HF solution, and the formation of the acceleration electrode is completed. See the step of FIG. 40D.

It should be noted that the material for the acceleration electrode is not limited to Si but a substrate of other materials such as Mo, Cr, Ta, Ti, Kovar, Ge, GaAs, and the like, may also be used.

d) BONDING OF FIELD EMISSION GUN AND GLASS SLAB

Figure 41:
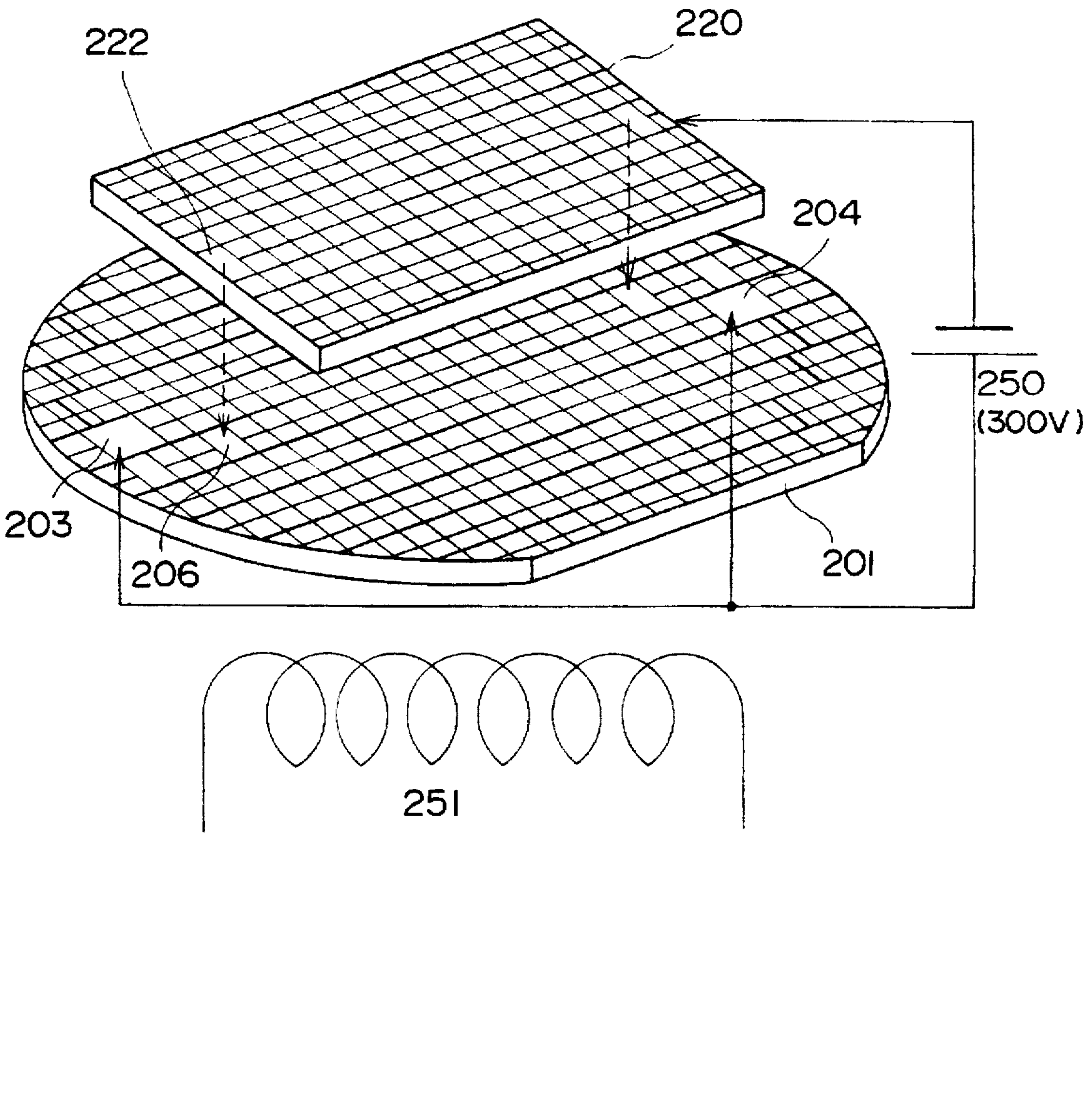
FIG. 41 is a diagram showing the anodic bonding process of the silicon wafer of FIG. 30 on which the micro field emission guns are formed and the insulation slab of FIG. 33.

Next, the bonding of the field emission guns formed on the silicon wafer and the insulator slab such as the glass slab will be described with reference to FIG. 41. It should be noted that the step corresponds to a step S4 of FIG. 39.

In the bonding process, the micro field emission guns on the silicon wafer 201 and the insulator slab are bonded with each other by an anodic bonding process.

First, the glass slab 220 is aligned with respect to the silicon wafer 201 by aligning the second alignment mark 206 and the third alignment mark 222.

Next, an evacuation process is conducted by activating a vacuum pump to a pressure of $1\times10^{-5}$ Torr, and a heater 251 is activated such that the interface boundary of the silicon wafer 201 and the glass slab 220 is held at a temperature of about 300° C. In this state, the first pad 203 on the silicon wafer 201 as well as the second pad 204 on the silicon wafer 201 are connected to an anode of a d.c. power supply 250, and the glass slab is connected to a cathode thereof. Thereby, the d.c. power supply 250 supplies a d.c. output of about 300 volts for about 10 minutes.

As a result of such an application of the d.c. voltage, the glass slab 220 and hence the cells 221 are bonded upon gate electrode 211 on the silicon wafer 201.

Figure 42:
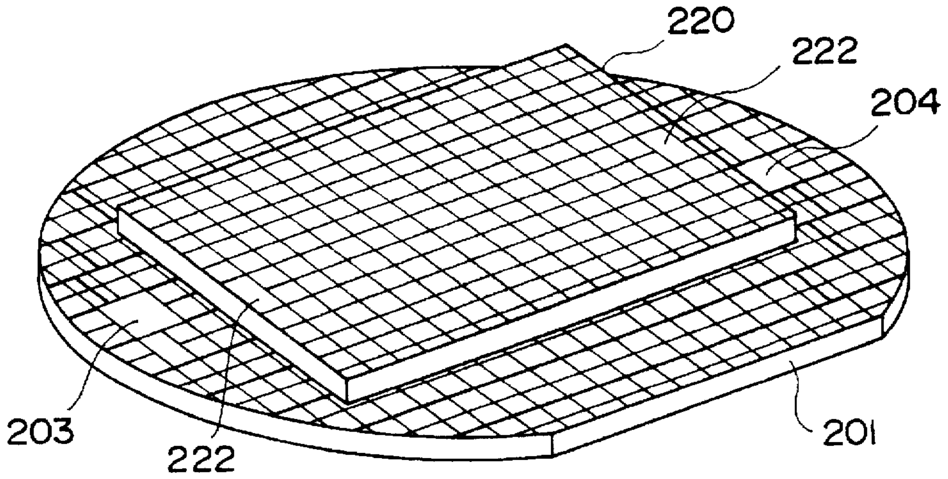
FIG. 42 is a diagram showing the state in which the anodic bonding process of FIG. 41 is completed.

FIG. 42 shows the structure thus obtained as a result of the anodic bonding process, in a perspective view.

e) BONDING OF ACCELERATION ELECTRODE

Next, the step of bonding the acceleration electrode upon the structure obtained in the step of FIG. 42 will be described with reference to FIG. 43, wherein the step of FIG. 43 corresponding to a step S5 of FIG. 39.

Similarly as before, the bonding of the acceleration electrode is achieved by an anodic bonding process.

Figure 43:
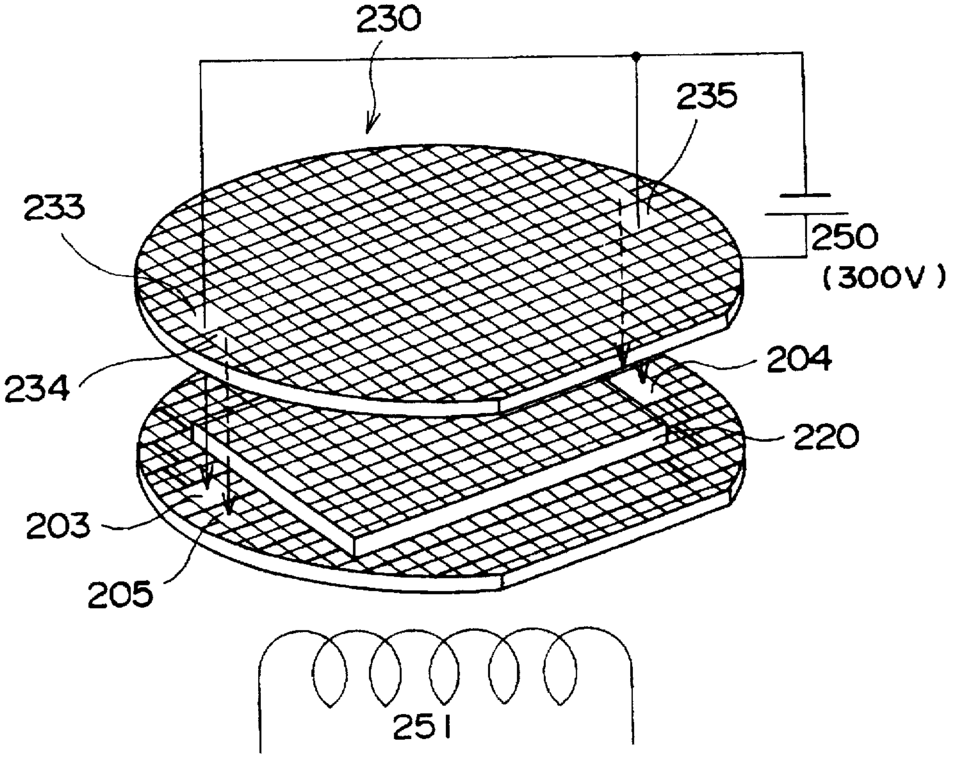
FIG. 43 is a diagram showing the anodic bonding process of the silicon wafer of FIG. 36 upon the insulation slab of the structure of FIG. 42.

First, the wafer 230 is placed upon the structure of FIG. 43, and the alignment mark 234 on the wafer 230 is aligned with respect to the alignment mark 206 on the wafer 201.

Further, an evacuation process is conducted by activating a vacuum pump such that the environmental pressure of the structure in processing is reduced to a level of $1\times10^{-5}$ Torr. Further, the heater 251 is activated such that the temperature of the interface boundary between the silicon wafer 201 and the glass slab 220 increases to about 300° C. In this state, the first and second pads 203 and 204 on the wafer 201 are connected to the anode of the d.c. power supply 250 via the openings 233 and 235 on the wafer 230, while simultaneously a negative voltage is applied to the wafer 230 itself from the cathode of the d.c. power supply 250. The d.c. power supply 250 produces a voltage of about 300 volts and supplies the same to the structure of FIG. 43 for a duration of about 10 minutes.

As a result, the acceleration electrode 231 is bonded upon the glass slab 221 by means of the anodic bonding process.

Figure 44:
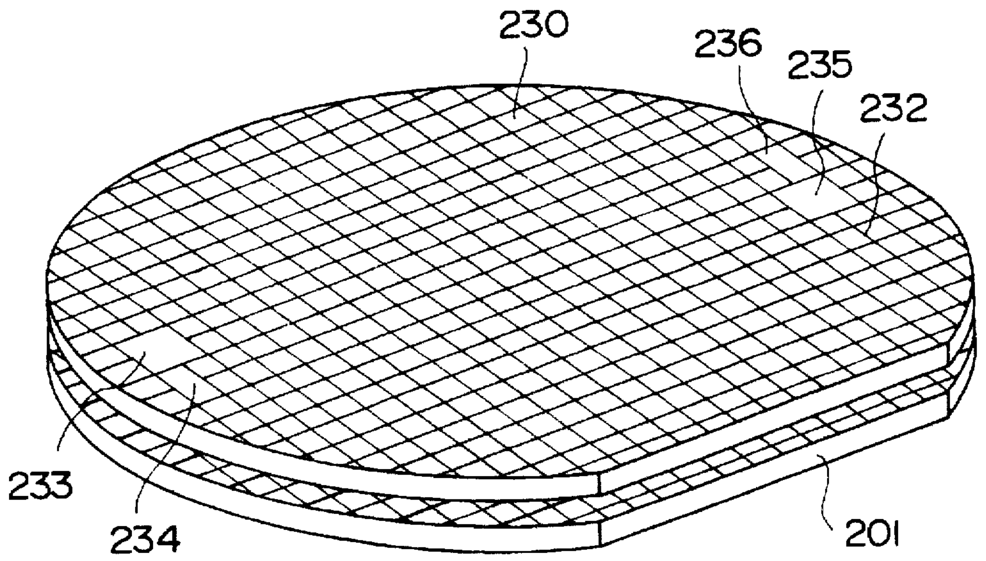
FIG. 44 is a diagram showing the state in which the anodic bonding process of FIG. 43 is completed.

FIG. 44 shows the structure thus obtained after the anodic bonding process in a perspective view.

f) SCRIBING OF INDIVIDUAL MICRO FIELD EMISSION GUNS

Figure 45:
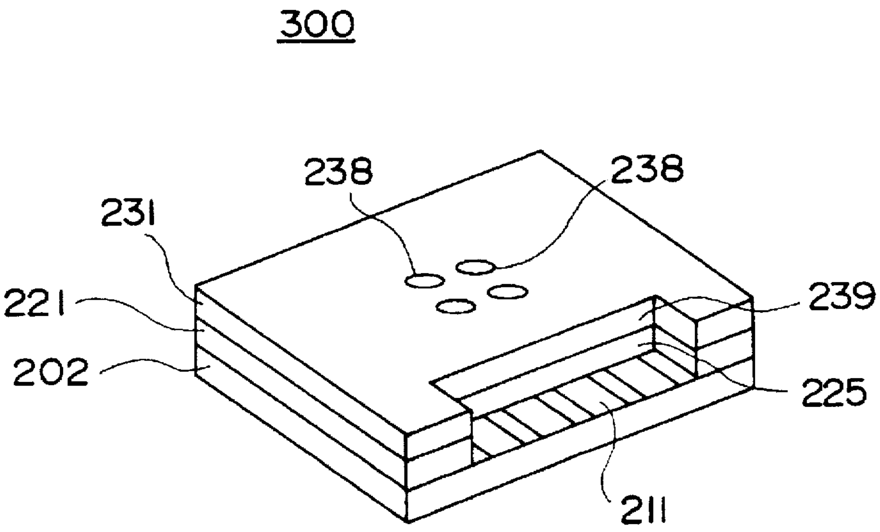
FIG. 45 is a diagram showing a single micro field emission module of the sixth embodiment in a perspective view.

Next, the structure of FIG. 44 is subjected to a scribing process, wherein the structure of FIG. 44 is divided into a number of micro field emission modules 300 along the scribe lines 232 on the wafer 230 as indicated in FIG. 45. This process corresponds to a step S6 of FIG. 39.

g) ASSEMBLING IN AN ELECTRON GUN PACKAGE

Figure 46:
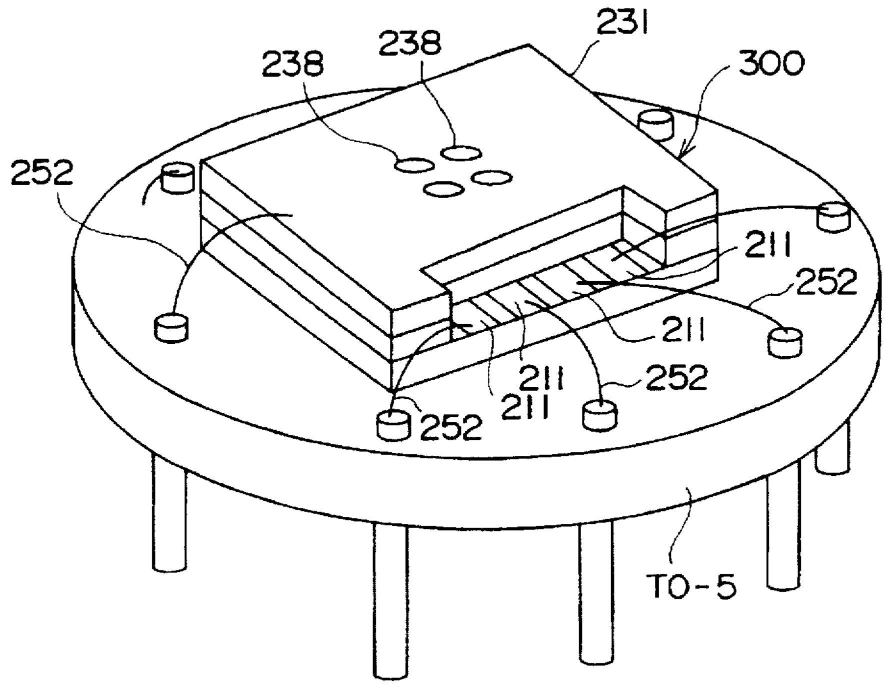
FIG. 46 is a diagram showing the packaging process of the micro field emission module of FIG. 45.

Next, the step for assembling the micro field emission modules 300 thus obtained upon a module package with reference to FIG. 46, wherein the present process corresponds to a step S7 of FIG. 39.

In the assembling process described hereinafter, a metal package such as the one of the TO-5 type may be used.

First, a gold (Au) layer is coated upon a support surface of the TO-5 package, and the module 300 thus obtained in the previous processes is placed upon the coated surface of the package. Further, a heat is applied such that the temperature of the Al film provided on the rear surface of the silicon substrate 201 reaches a temperature of about 600° C.

As a result, an eutectic of Al and Au is formed at the boundary and the Al film is firmly bonded upon the Au layer covering the support surface of the package.

h) CONNECTION OF THE POWER FEED WIRE

Further, a process corresponding to the step S8 of FIG. 69 is conducted, wherein each of the acceleration electrode 231 and the fourth gate electrodes 211 is connected to a corresponding terminal pad on the TO-5 package by means of a bonding wire 252.

Thereby, it will be noted that a large number of micro field emission guns are produced at the same time.

As the micro field emission gun of the present embodiment is equipped with the acceleration electrode, it is possible to produce a high energy electron beam by applying an acceleration voltage to the acceleration electrode. As the acceleration electrode is provided integrally to the field emission gun, the handling of the field emission gun is substantially facilitated.

In the foregoing sixth embodiment of the present invention, it should be noted that one can provide a cutout in place of the third and fourth openings 233 and 235 for passing the wirings for supplying the d.c. current to the silicon wafer 201 in the anodic bonding process.

[Seventh Embodiment]

Next, a seventh embodiment of the present invention will be described, wherein the seventh embodiment is an improvement of the sixth embodiment by providing a separate electrode on the wafer with respect to the foregoing gate electrode and feed the current from the rear side in the anodic bonding process.

a) FABRICATION OF THE MICRO FIELD EMISSION GUN

Figure 48:
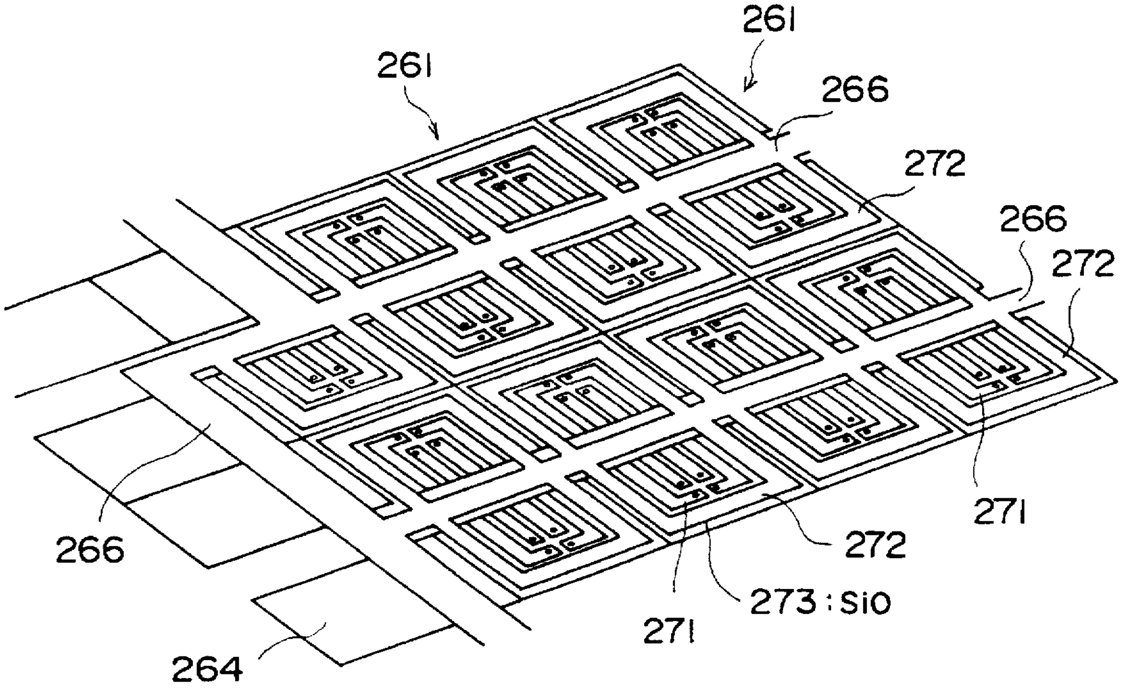
FIG. 48 is a diagram showing the silicon wafer of FIG. 47 in an enlarged scale.

In the process corresponding to the step S1 of FIG. 69, a silicon wafer is prepared as indicated in FIG. 48, such that the silicon wafer carries thereon a large number of micro field emission guns each having four emitters.

Figure 47:
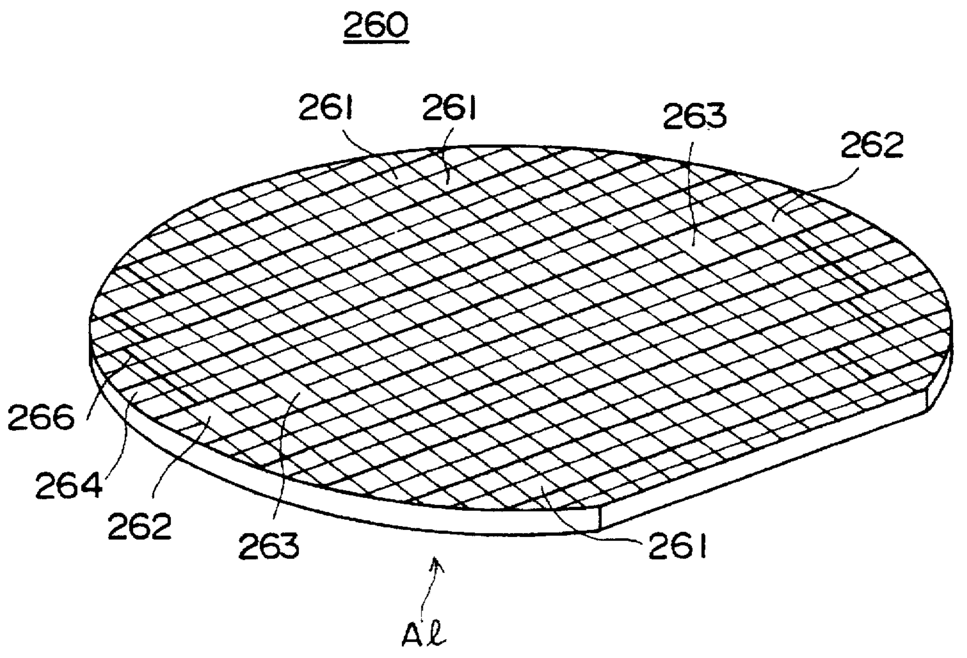
FIG. 47 is a diagram showing a silicon wafer used for constructing micro field emission guns of a seventh embodiment of the present invention in a perspective view.

Referring to FIG. 47 showing a silicon (Si) wafer 260 on which a number of micro field emission guns 261 are formed, it will be noted that a first alignment mark 262 for aligning the wafers and a second alignment mark 263 used also for aligning the wafers, are provided on the wafer 261, wherein the wafer 260 is further defined with first and second exposed surfaces 264 and 265 for supplying thereto a d.c. current used to an anodic bonding process. Thereby, each of the micro field emission guns 261 is connected to one of the foregoing first exposed surface 264 and the second exposed surface 265 by a conductor pattern 266. In the illustrated example, the silicon wafer 260 may have a diameter of 3 inches and a thickness of 500 μm.

Figure 49:
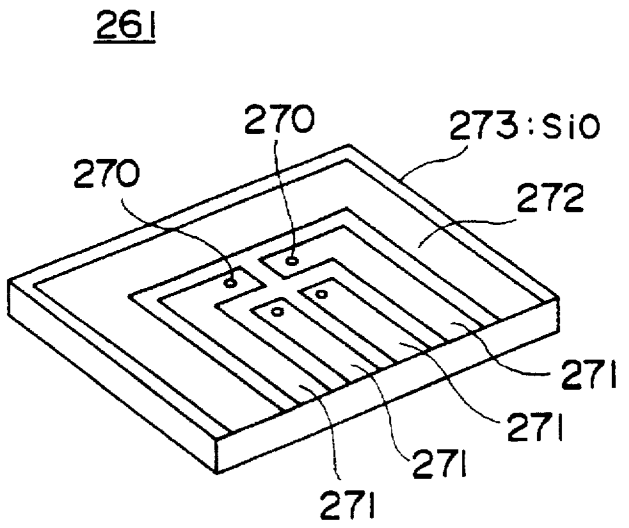
FIG. 49 is a diagram showing a single micro field emission gun of the seventh embodiment.

Each of the micro field emission guns 261 typically has a size of about 3 mm×3 mm and includes four emitters 270 disposed on the silicon substrate with a separation of about 500 μm, wherein there is a gate electrode 271 on the emitters 270 as indicated in FIG. 48 or FIG. 49, with an insulator layer 272 of SiO provided so as to intervene between the gate electrode 271 and the wafer 260.

One may use various materials for the emitter 210, in addition of silicon, wherein such materials include W, Ni, Au, and the like.

As indicated in FIG. 47, the first alignment mark 262 is formed at a position offset from the center of the silicon wafer 260 by a distance of 30–35 mm, while the second alignment mark 263 is formed at a position offset from the center by a distance of 20–25 mm. The alignment marks 262 and 263 may be formed by conducting an exposure simultaneously to the exposure of the field emission guns by using the same exposure mask, followed by a patterning process.

Further, the rear surface of the silicon wafer 260 is covered by an aluminum film.

It should be noted that each of the gate electrodes 271 of the micro field emission guns is connected to one of the exposed surfaces 264 and 265 via the conductor pattern 266, while the conductor pattern 266 is formed such that the gate electrode 271 is disconnected from the corresponding exposed surface upon scribing of the wafer 260 into individual field emission guns 261.

Figure 50:
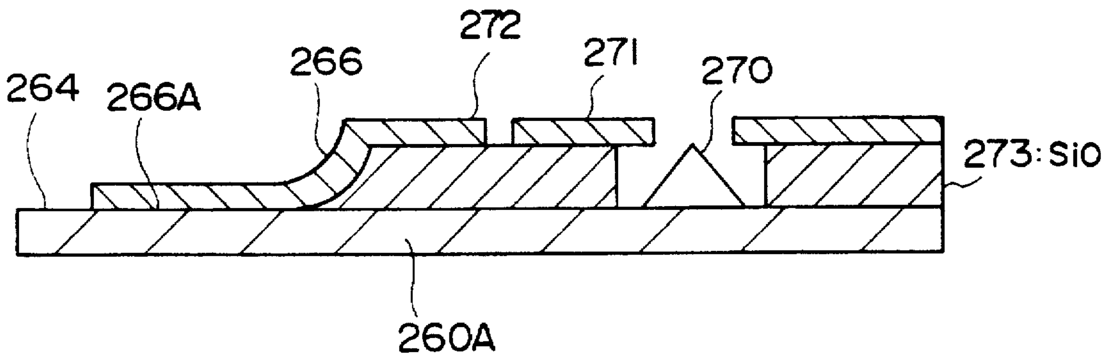
FIG. 50 is a diagram showing the micro field emission gun of FIG. 49 in a cross sectional view.

FIG. 50 shows the micro field emission gun 261 in a cross sectional view, wherein FIG. 50 shows a part of the gun 261 in the vicinity of the first exposed surface 264.

As will be noted in FIG. 50, the conductor pattern 266 is connected to the exposed surface 264 of a silicon substrate 260A by forming a contact 266A. Further, the conductor pattern 266 carries an electrode pad 272 at the other end thereof for the anodic bonding process.

b) PREPARATION OF INSULATOR GLASS SLAB

This step corresponds to the step S2 of FIG. 69 and is conducted by using the microfabrication technology of semiconductor devices.

Figure 51:
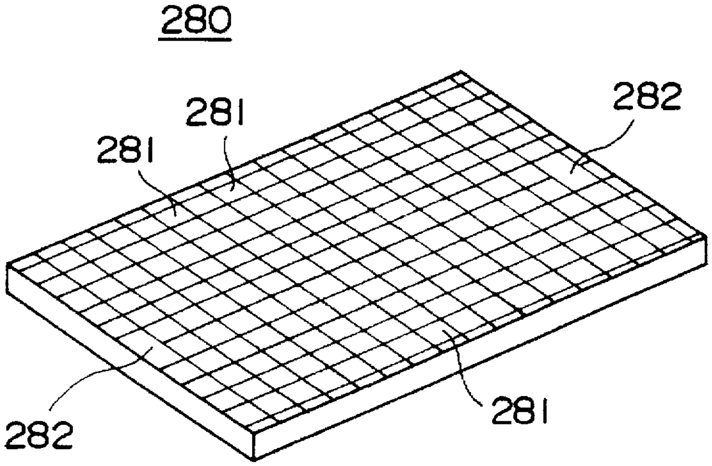
FIG. 51 is a diagram showing an insulation glass slab used in the seventh embodiment in a perspective view.

FIG. 51 shows a glass slab 280 in which a number of cells 281 are formed together with a third alignment mark 282, wherein the alignment mark 282 is formed at a position corresponding to the alignment mark 263 described before.

Figure 52:
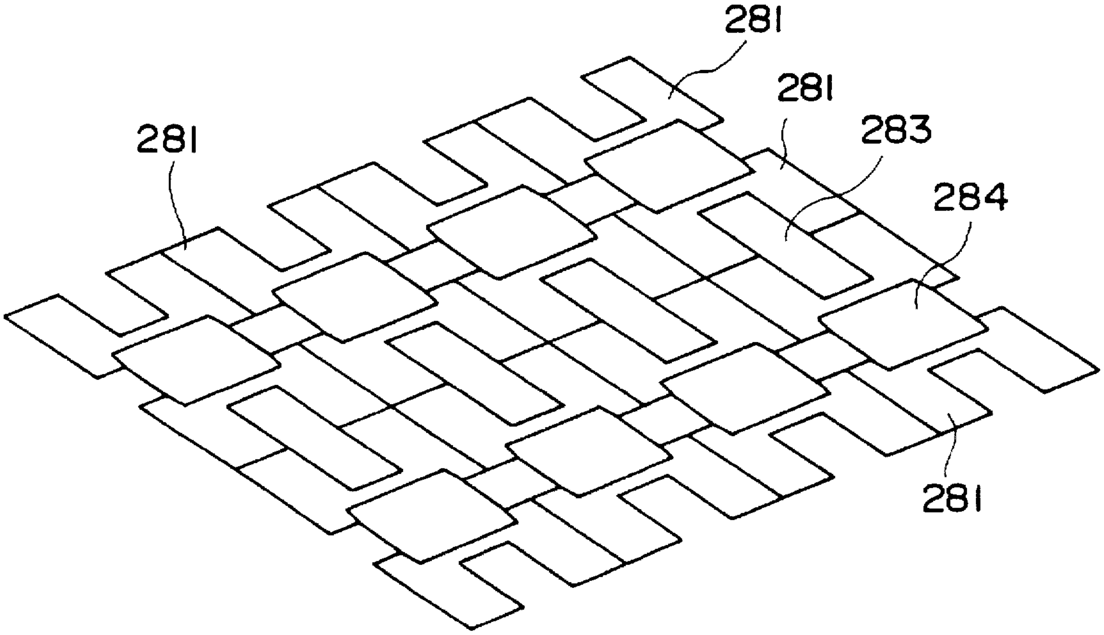
FIG. 52 is a diagram showing the glass slab of FIG. 51 in an enlarged scale.

Referring to FIG. 52 showing the glass slab 280 in an enlarged scale, it will be noted that there are formed a first opening 283 for forming a first cutout 285 used for the passage of the electron beam of the micro field emission gun (see FIG. 53) as well as a second opening 284 for forming a second cutout 286 used for a passage of a conductor pattern extending to the gate electrode 271 of the field emission gun. Thereby, one can improve the evacuation conductance of the emitter 270, as the cutout 285 and hence the insulation layer 281 surrounds the emitter 270 only partially in contrast to the opening 223 of the previous embodiment (FIG. 35).

The foregoing third alignment mark 282, the first opening 283 and the second opening 284 may be formed by a sand blasting process.

Further, the glass slab 280 may have a size such as 50 mm×50 mm×100 mm, which size being selected such that the electrode pads on the silicon substrate 260 are exposed and such that the first alignment mark 262 used for aligning the silicon wafer 260 and an acceleration electrode to be described layer is not covered.

Figure 53:
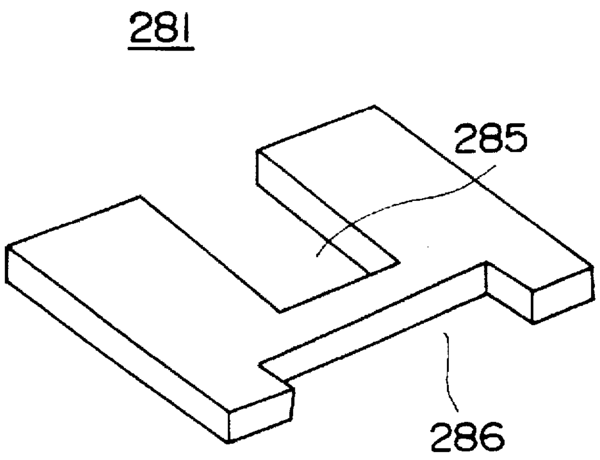
FIG. 53 is a diagram showing a piece of the glass slab used in the micro field emission gun of the seventh embodiment.

As indicated in FIG. 53, the glass piece 281 includes the first cutout 285 and the second cutout 286.

c) FABRICATION OF ACCELERATION ELECTRODE

The step corresponds to the step S3 of FIG. 69 and is conducted by employing a microfabrication process of semiconductor devices.

Figure 54:
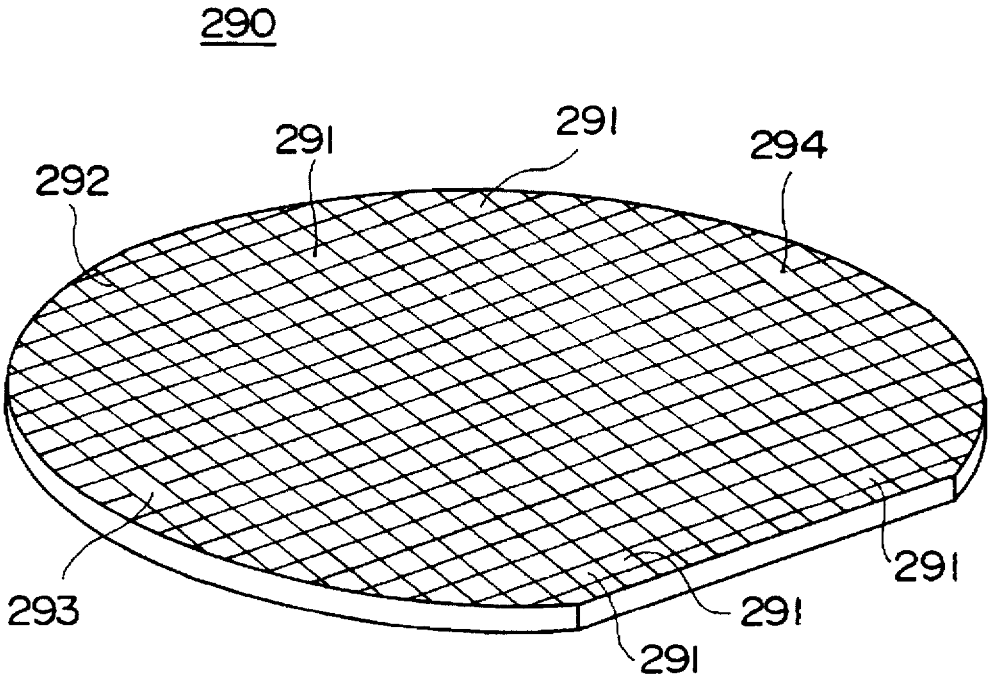
FIG. 54 is a diagram showing a silicon wafer used for the acceleration electrode in the seventh embodiment in a perspective view.
Figure 55:
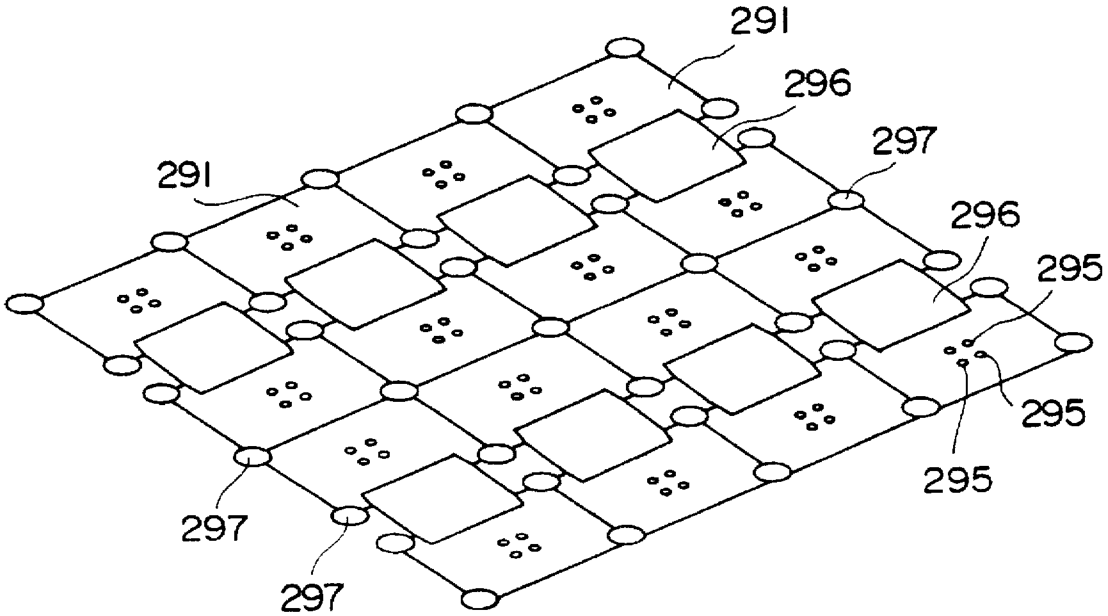
FIG. 55 is a diagram showing the silicon wafer of FIG. 54 in an enlarged scale.

FIG. 54 shows a silicon wafer 290 used for the acceleration electrode in a perspective view, wherein FIG. 54 shows the silicon wafer 290 viewed from a side not bonded upon the field emission guns.

Referring to FIG. 54, the silicon wafer 290 includes a number of cells 291 each acting as an acceleration electrode, wherein the cells 291 are separated from each other by scribe lines 292. Further, the wafer 290 includes a fourth alignment mark 293 for checking the alignment at the time of bonding and a fifth alignment mark 294 for checking the alignment at the time of bonding. In the illustrated example, the silicon wafer 290 may have a diameter of 3 inches and a thickness of about 200 μm.

Figure 56:
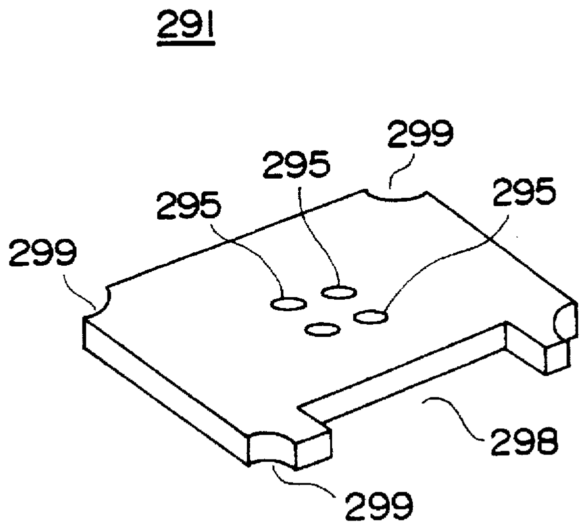
FIG. 56 is a diagram showing the acceleration electrode of the field emission gun of the seventh embodiment in a perspective view.

Each of the acceleration electrodes corresponding to the cells 291 has a size of 3 mm×3 mm and carries third apertures 295 in correspondence to the four emitters 270 of the micro field emission gun (see FIGS. 48 and 49), wherein the third apertures 295 act as a passage of the electron beam. There are four such apertures 295 on the wafer 290. Further, there are formed a fourth aperture 296 and a fifth aperture 297, wherein the fourth aperture 296 and the fifth aperture 297 are so provided to form a third cutout 298 and a fourth cutout 99 (see FIG. 56) upon scribing of the wafer 90, wherein the third cutout 98 enables an electric connection to the gate electrode 271 upon completion of the micro field emission guns.

Figure 57:
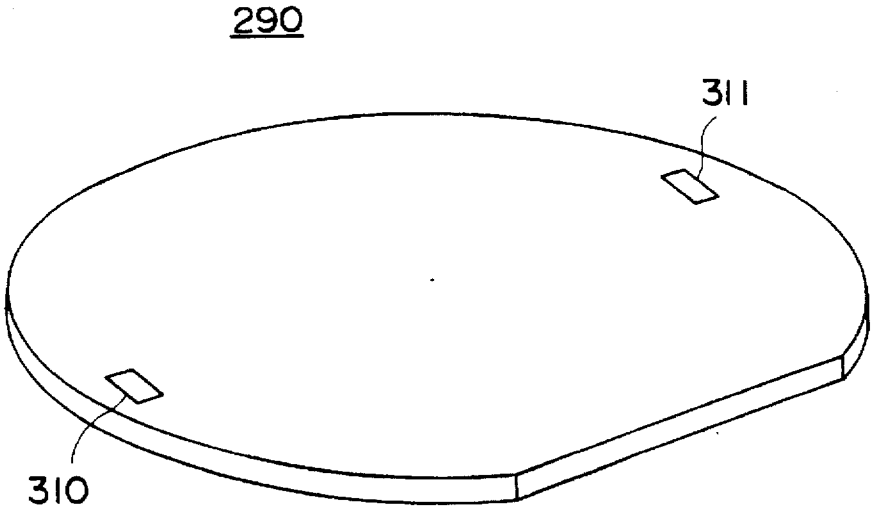
FIG. 57 is a diagram showing the rear side of the silicon wafer of FIG. 54.

FIG. 57 shows the silicon wafer 290 in another perspective view, wherein FIG. 57 shows the side of the wafer 290 that is contacted upon the field emission gun formed on the wafer 260.

Referring to FIG. 57, it will be noted that the silicon wafer 290 includes sixth and seventh alignment marks 310 and 311 for the alignment of the wafer 290 at the time of the anodic bonding process thereof.

Here, the process for forming the acceleration electrode upon the silicon wafer will be described.

First, the fourth and fifth alignment marks 293 and 294 as well as the scribe lines 292 are formed on a first side of a silicon wafer by using a dual-side mask aligner, followed by a formation of the sixth and seventh alignment marks 310 and 131 on the other side of the same wafer. See the process of FIG. 58A.

Figure 58A:
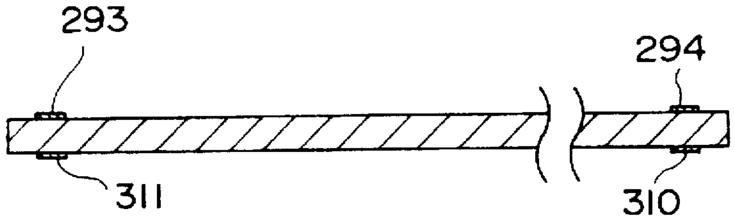
FIGS. 58A–58D are diagrams showing the fabrication process of the acceleration electrode of the seventh embodiment.

In FIG. 58A, it should be noted that the fourth alignment mark 293 and the seventh alignment mark 311 are formed on the corresponding locations across the silicon wafer 290. Similarly, the fifth alignment mark 294 and the sixth alignment mark 310 are formed on the corresponding locations across the silicon wafer 290.

Figure 58B:
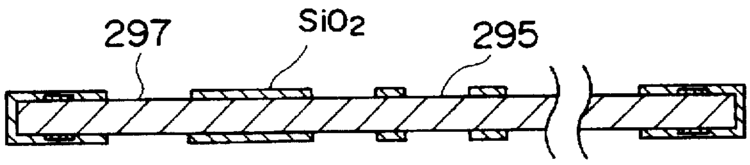

Next, by using the fourth and fifth marks 293 and 294, an etching mask of $SiO_2$ is provided on the wafer at the side of the marks 293 and 294. Similarly, another etching mask of $SiO_2$ is formed on the side of the wafer 290 on which the marks 310 and 311 are provided. See the process of FIG. 58B.

Figure 58C:
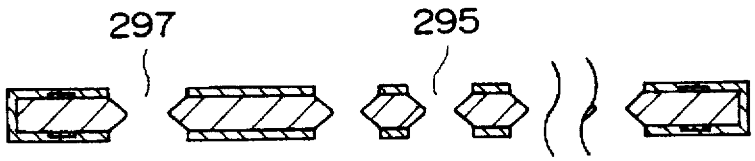

Next, the silicon wafer 290 is subjected to an etching process in an alkaline etchant such as KOH, wherein the third through fifth openings 295, 296 and 297 are formed as indicated in FIG. 58C.

Figure 58D:
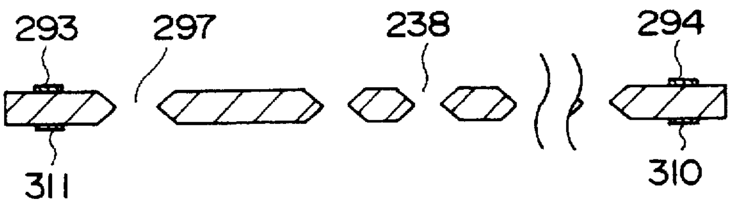

Further, the etching mask of $SiO_2$ is removed by a buffered HF solution, and the formation of the acceleration electrode is completed. See the step of FIG. 58D.

It should be noted that the material for the acceleration electrode is not limited to Si but a substrate of other materials such as Mo, Cr, Ta, Ti, Kovar, Ge, GaAs, and the like, may also be used.

d) BONDING OF FIELD EMISSION GUN AND GLASS SLAB

Figure 59:
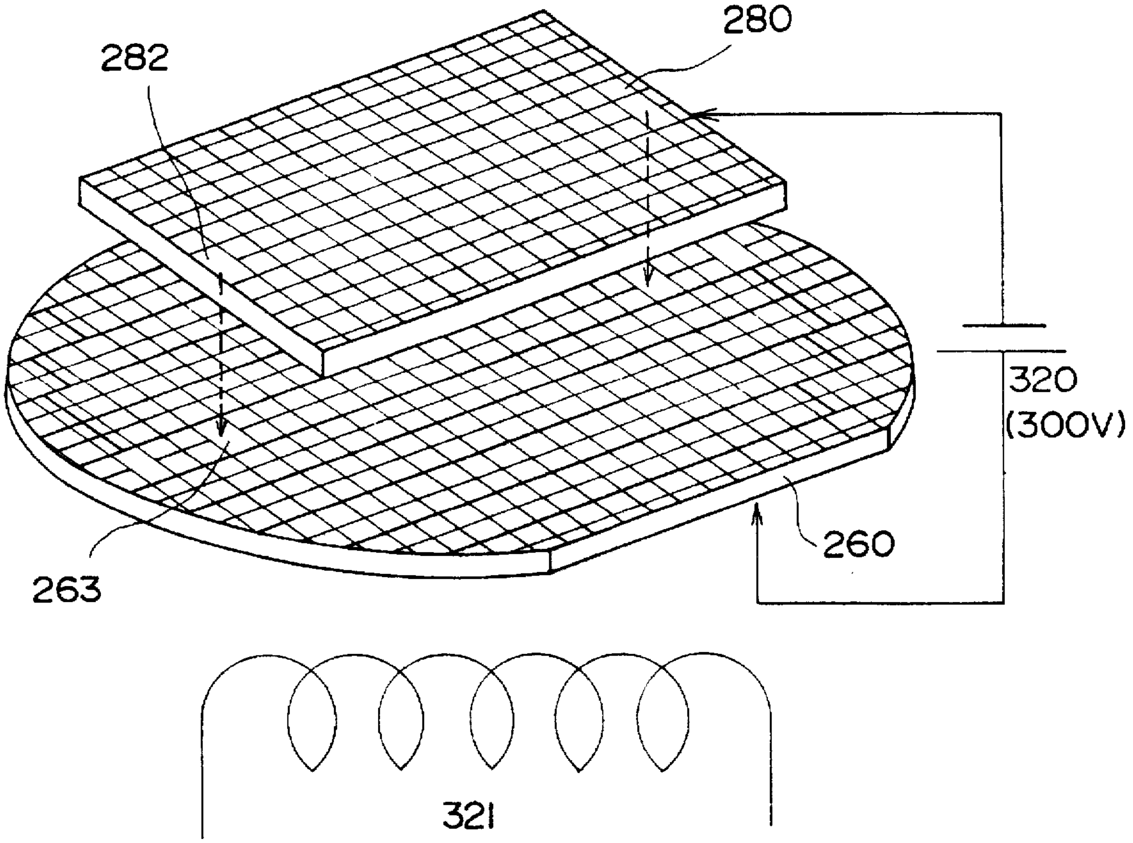
FIG. 59 is a diagram showing the anodic bonding process of the silicon wafer of FIG. 47 on which the micro field emission guns are formed and the insulation slab of FIG. 51.

Next, the bonding of the field emission guns formed on the silicon wafer and the insulator slab such as the glass slab will be described with reference to FIG. 59. It should be noted that the step corresponds to a step S4 of FIG. 69.

In the bonding process, the micro field emission guns on the silicon wafer 60 and the insulator slab are bonded with each other by an anodic bonding process.

First, the glass slab 280 is aligned with respect to the silicon wafer 260 by aligning the second alignment mark 263 and the third alignment mark 282.

Next, an evacuation process is conducted by activating a vacuum pump to a pressure of $1\times10^{-5}$ Torr, and a heater 321 is activated such that the interface boundary of the silicon wafer 260 and the glass slab 280 is held at a temperature of about 300° C. In this state, the Al film on the rear surface of the silicon wafer 260 is connected to an anode of a d.c. power supply 320, and the glass slab is connected to a cathode thereof. Thereby, the d.c. power supply 320 supplies a d.c. output of about 300 volts for about 10 minutes.

As a result of such an application of the d.c. voltage, the glass slab 280 is bonded upon gate electrode 271 on the silicon wafer 260.

Figure 60:
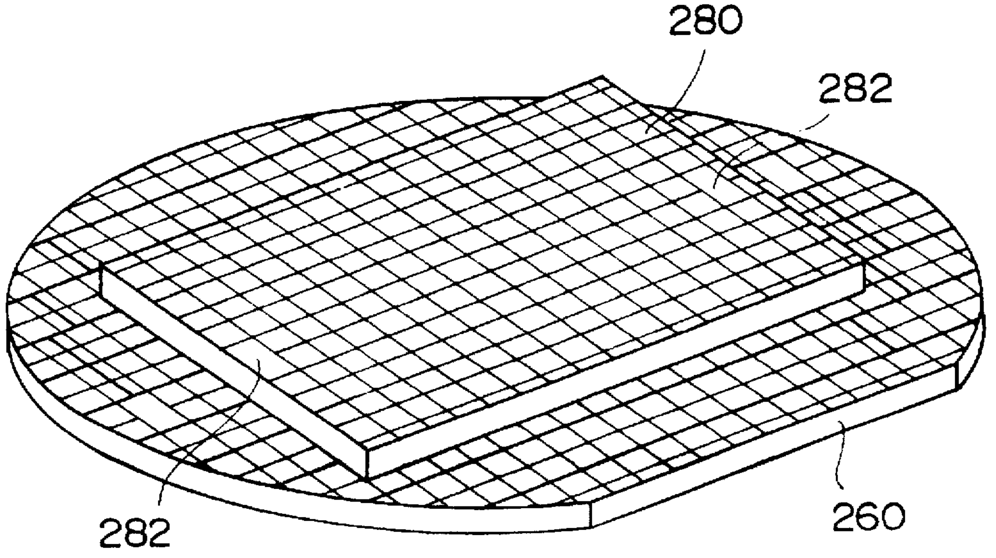
FIG. 60 is a diagram showing the state in which the anodic bonding process of FIG. 59 is completed.

FIG. 60 shows the structure thus obtained as a result of the anodic bonding process, in a perspective view.

e) BONDING OF ACCELERATION ELECTRODE

Figure 61:
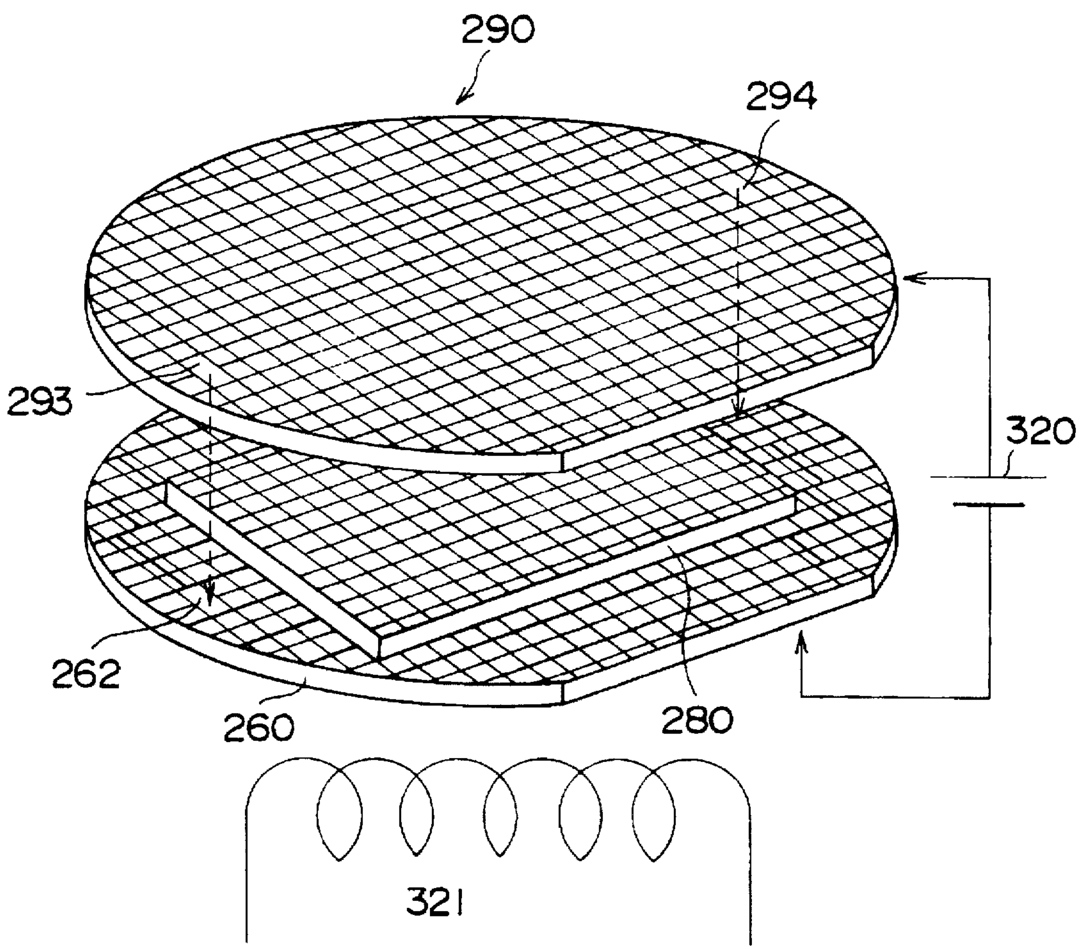
FIG. 61 is a diagram showing the anodic bonding process of the silicon wafer of FIG. 54 upon the insulation slab of the structure of FIG. 60.

Next, the step of bonding of the acceleration electrode upon the structure obtained in the step of FIG. 60 will be described with reference to FIG. 61, wherein the step of FIG. 43 corresponds to the step S5 of FIG. 69.

Similarly as before, the bonding of the acceleration electrode is achieved by an anodic bonding process.

First, the wafer 290 is placed upon the structure of FIG. 60, and the fourth and fifth alignment marks 293 and 294 on the wafer 290 are aligned with respect to the first alignment marks 262 on the wafer 260.

Further, an evacuation process is conducted by activating a vacuum pump such that the environmental pressure of the structure in processing is reduced to a level of $1\times10^{-5}$ Torr. Further, the heater 212 is activated such that the temperature of the interface boundary between the silicon wafer 260 and the glass slab 280 increases to about 300° C. In this state, the Al film covering the rear surface of the wafer 260 is connected to the anode of the d.c. power supply 320, while simultaneously a negative voltage is applied to the wafer 260 itself from the cathode of the d.c. power supply 321. The d.c. power supply 321 produces a voltage of about 300 volts and supplies the same to the structure of FIG. 61 for a duration of about 10 minutes.

As a result, the acceleration electrode 291 is bonded upon the glass slab 281 by means of the anodic bonding process.

Figure 62:
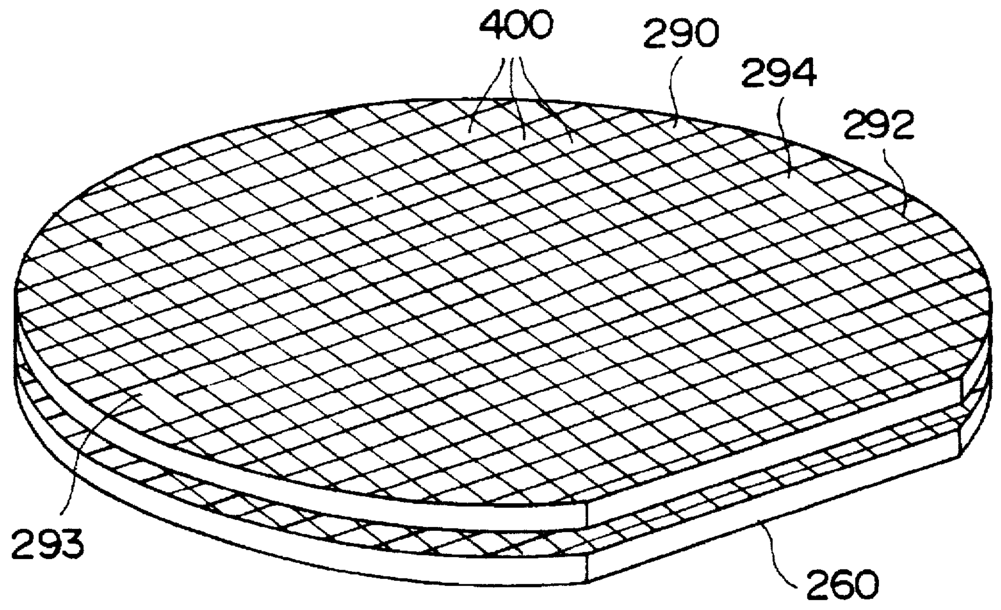
FIG. 62 is a diagram showing the state in which the anodic bonding process of FIG. 61 is completed.

FIG. 62 shows the structure thus obtained after the anodic bonding process in a perspective view.

f) SCRIBING OF INDIVIDUAL MICRO FIELD EMISSION GUNS

Figure 63:
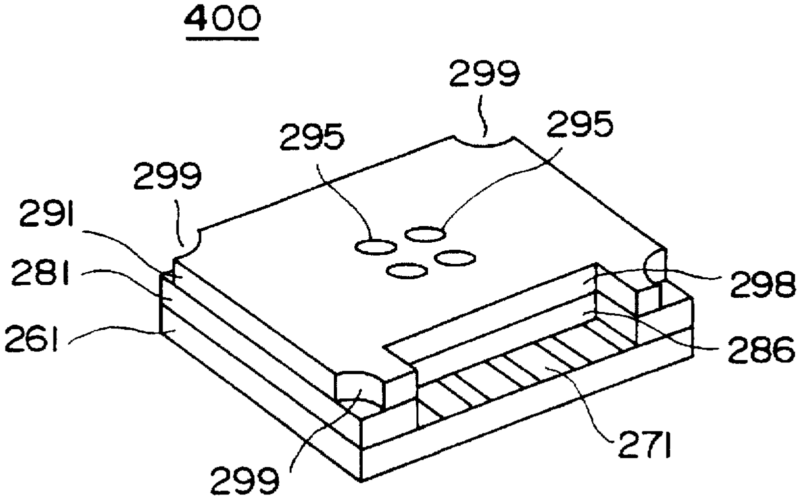
FIG. 63 is a diagram showing a single micro field emission module of the seventh embodiment in a perspective view.

Next, the structure of FIG. 62 is subjected to a scribing process, wherein the structure of FIG. 62 is divided into a number of micro field emission modules 400 along the scribe lines 292 on the wafer 290 as indicated in FIG. 63. This process corresponds to a step S6 of FIG. 69.

g) ASSEMBLING IN AN ELECTRON GUN PACKAGE

Figure 64:
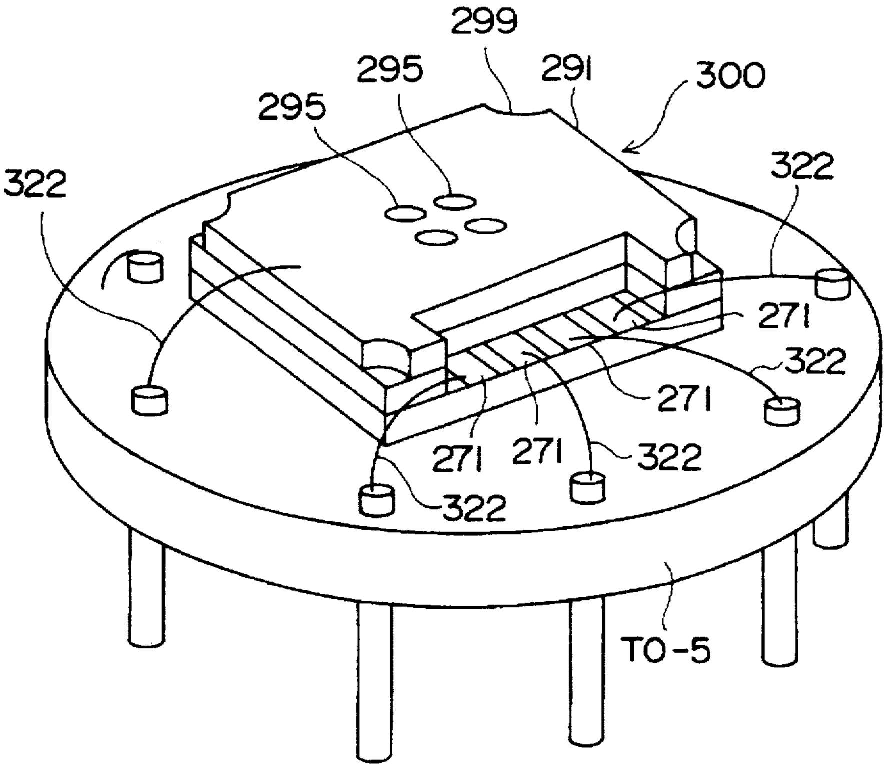
FIG. 64 is a diagram showing the packaging process of the micro field emission module of FIG. 63.

Next, the step for assembling the micro field emission modules 400 thus obtained upon a module package with reference to FIG. 64, wherein the present process corresponds to a step S7 of FIG. 69.

In the assembling process described hereinafter, a metal package such as the one of the TO-5 type may be used.

First, a gold (Au) layer is coated upon a support surface of the TO-5 package, and the module 200 thus obtained in the previous processes is placed upon the coated surface of the package. Further, a heat is applied such that the temperature of the Al film provided on the rear surface of the silicon substrate 260 reaches a temperature of about 600° C.

As a result, an eutectic of Al and Au is formed at the boundary and the Al film is firmly bonded upon the Au layer covering the support surface of the package.

h) CONNECTION OF THE POWER FEED WIRE

Further, a process corresponding to the step S8 of FIG. 69 is conducted, wherein each of the acceleration electrode 231 and the four gate electrodes 271 is connected to a corresponding terminal pad on the TO-5 package by means of a bonding wire 322.

Thereby, it will be noted that a large number of micro field emission guns are produced at the same time.

As the micro field emission gun of the present embodiment is equipped with the acceleration electrode, it is possible to produce a high energy electron beam by applying an acceleration voltage to the acceleration electrode. As the acceleration electrode is provided integrally to the field emission gun, the handling of the field emission gun is substantially facilitated.

In the foregoing seventh embodiment of the present invention, it is possible to accelerate the electron beam with a high acceleration voltage. Further, the micro field emission gun is easy to handle and can be fabricated with high efficiency and low cost. As the emitter is only partially surrounded by the insulation layer 281, it is possible to evacuate the field emission gun with high efficiency.

[Eighth Embodiment]

The present embodiment uses a substrate having an exposed rear surface, wherein the substrate is supplied with a d.c. current at the exposed rear surface when carrying out an anodic bonding process.

a) FABRICATION OF THE MICRO FIELD EMISSION GUN

Figure 65:
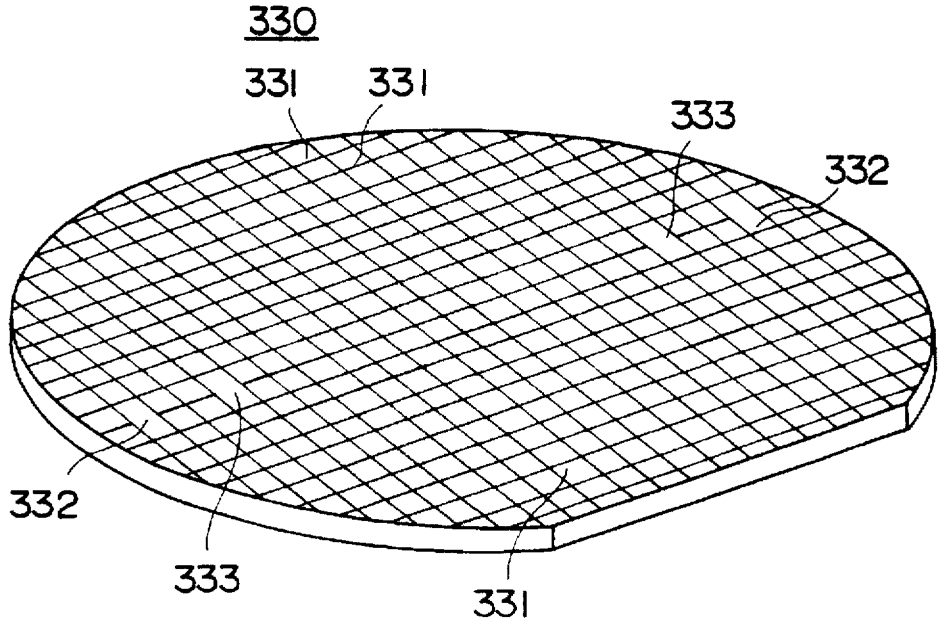
FIG. 65 is a diagram showing a silicon wafer used for constructing micro field emission guns of an eighth embodiment of the present invention in a perspective view.

FIG. 65 shows a silicon (Si) wafer 330 on which a number of micro field emission guns 331 are formed, wherein a first alignment mark 332 for aligning the wafers and a second alignment mark 333 used also for aligning the wafers, are provided also on the wafer 330. In the illustrated example, the silicon wafer 1 may have a diameter of 3 inches and a thickness of 500 µm.

Figure 66:
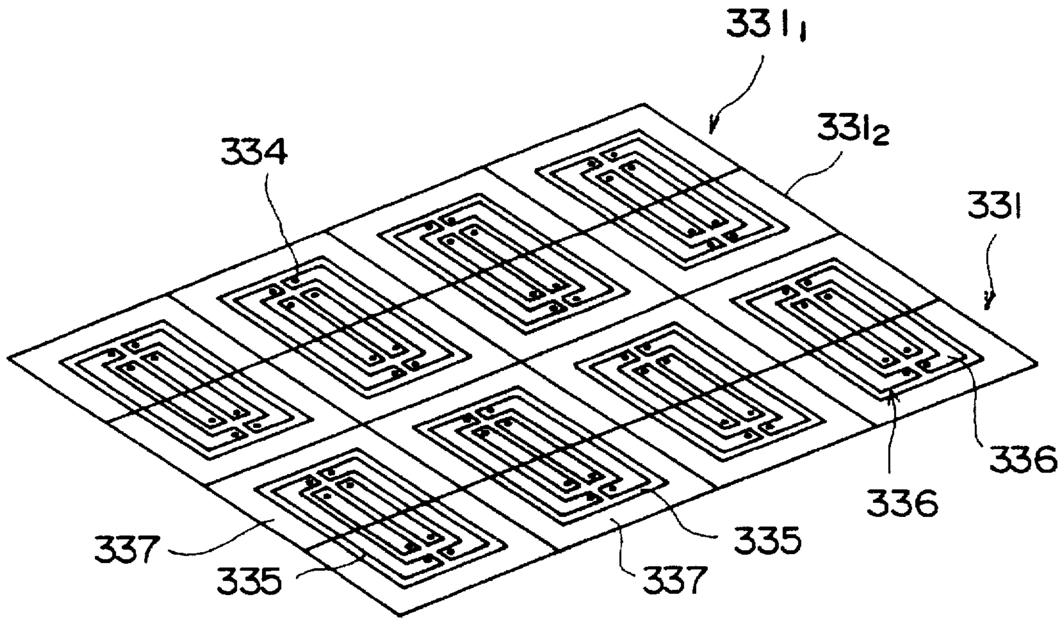
FIG. 66 is a diagram showing the silicon wafer of FIG. 65 in an enlarged scale.
Figure 67:
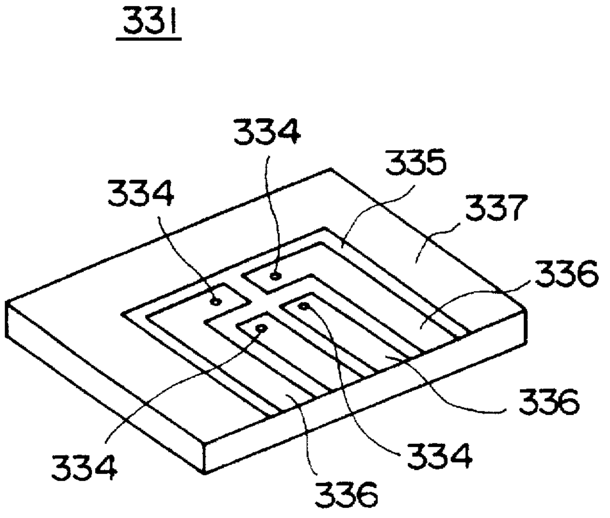
FIG. 67 is a diagram showing a single micro field emission gun of the eighth embodiment.

Each of the micro field emission guns 331 typically has a size of about 3 mm×3 mm and includes four emitters 334 disposed on the silicon substrate with a separation of about 500 µm, wherein there is a gate electrode 336 on the emitters 334 as indicated in FIG. 66 or FIG. 67, with an insulator layer 335 of SiO provided so as to intervene between the gate electrode 336 and the wafer 330. Further, the wafer 331 is formed with an exposed surface 337 for anodic bonding with another substrate.

As indicated in FIG. 65, the first alignment mark 332 is formed at a position offset from the center of the silicon wafer 330 by a distance of 30–35 mm, while the second alignment mark 333 is formed at a position offset from the center by a distance of 20–25 mm. The alignment marks 332 and 333 may be formed by conducting an exposure simultaneously to the exposure of the field emission guns by using the same exposure mask, followed by a patterning process.

Figure 68:
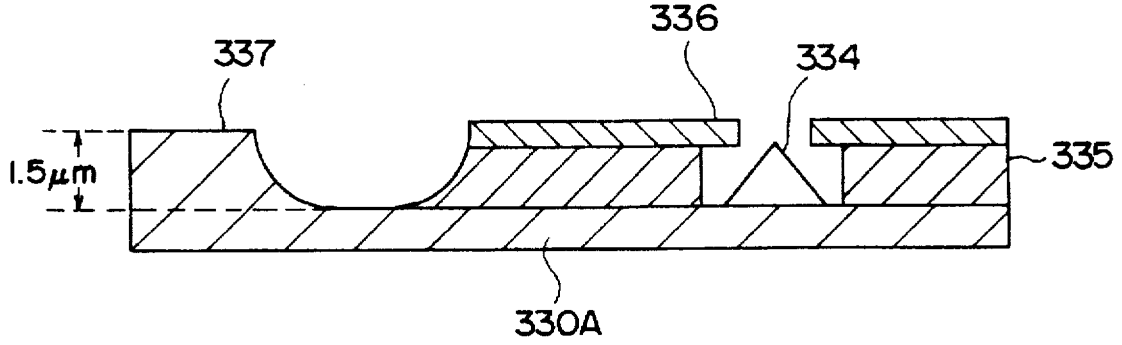
FIG. 68 is a diagram showing the micro field emission gun of FIG. 67 in a cross sectional view.

In the present embodiment, the exposed silicon surface 337 is formed with a step of about 1.5 µm step height as will be indicated in FIG. 68, wherein the exposed silicon surface 337 is formed by removing therefrom the $SiO_2$ layer used for the mask or for the insulator layer or the gate electrode. Thus, the wafer 330 can be used as an electrode in the anodic bonding process by simply supplying the d.c. current to the rear side of the substrate 330.

Further, the rear surface of the silicon wafer 330 is covered by an aluminum film.

It should be noted that the gate electrodes 336 of adjacent micro field emission guns such as the gun $331_{-1}$ and the gun $331_{-2}$ are connected with each other, while the gate electrodes 336 are so formed that they are disconnected from each other upon scribing of the wafer 130 into individual field emission guns.

The emitter 334 is by no means limited to Si but other materials such as W, Ni, Au, and the like, may also be used.

FIG. 68 shows the field emission gun 331 for the part in the vicinity of the exposed silicon surface 337.

The field emission gun of the present embodiment has a simple construction suited for mass production.

As the process for forming the insulation glass slab or the acceleration electrode is identical to the process of the sixth and seventh embodiment, further description will be omitted.

FIG. 69 shows a flowchart showing the fabrication process of the micro field emission gun of the present invention. As each of the steps S1–S8 are already explained with reference to the sixth through eighth embodiments, further description thereof will be omitted.

Further, the present invention is not limited to the embodiments described heretofore, but various variations and modifications may be made without departing from the scope of the invention.

What is claimed is:

1. A method for fabricating a micro-field emission gun, said micro-field emission gun having an emitter provided on a substrate, an insulator layer surrounding said emitter, and a gate electrode provided on said insulator layer so as to surround said emitter, said micro-field emission gun thereby emitting an electron beam from said emitter in response to a control voltage applied to said gate electrode, said method comprising the steps of:

providing an insulator slab, formed with a penetrating hole acting as a passage of said electron beam, upon said gate electrode, such that said penetrating hole is aligned with said emitter of said micro-field emission gun;

bonding said insulator slab upon said gate electrode by means of anodic bonding; and providing an acceleration electrode on said insulator slab such that said acceleration electrode covers a surface of said insulator slab facing away from said gate electrode, except for a passage of said electron beam.

2. A method as claims in claim 1, wherein said step of bonding is carried out by applying a voltage between said insulator slab and said gate electrode while simultaneously heating said insulator slab to a temperature at which movement of ions in said insulator slab is facilitated.

3. A method as claimed in claim 1, wherein said step of providing said acceleration electrode upon said insulator slab is carried out prior to said bonding step.

4. A method as claimed in claim 3, wherein said step of providing said acceleration electrode upon said insulator slab includes the steps of:

forming a penetrating hole in a conductor plate as a passage of said electron beam;

disposing said conductor plate thus formed with said penetrating hole upon said insulator slab, such that said penetrating hole of said conductor plate aligns with said penetrating hole of said insulator slab; and bonding said conductor plate thus placed upon said insulator slab against said insulator slab by anodic bonding.

5. A method for fabricating a micro-field emission gun, said micro-field emission gun having an emitter provided on a substrate, an insulator layer surrounding said emitter, and a gate electrode provided on said insulator layer so as to surround said emitter, said micro-field emission gun thereby emitting an electron beam from said emitter in response to a control voltage applied to said gate electrode, said method comprising the steps of:

placing a semiconductor slab on said gate electrode, said semiconductor slab carrying thereon a penetrating hole acting as a passage of said electron beam and comprising a p-type layer and an n-type layer contacting each other intimately at a p-n junction interface, said p-type layer further carrying an oxide film on a surface thereof, such that said penetrating hole is aligned with said emitter and such that the surface of said p-type layer carrying thereon said oxide film faces said gate electrode; and bonding said semiconductor slab upon said gate electrode by anodic bonding.

6. A method for fabricating a micro-field emission gun, said micro-field emission gun having an emitter provided on a substrate, an insulator layer surrounding said emitter, and a gate electrode provided on said insulator layer so as to surround said emitter, said micro-field emission gun thereby emitting an electron beam from said emitter in response to a control voltage applied to said gate electrode, said method comprising the steps of:

placing an insulator slab on said gate electrode;

bonding said insulator slab upon said gate electrode by anodic bonding;

providing a conductor layer upon a surface of said insulator slab at a side away from a side of said insulator slab facing said gate electrode, such that said conductor layer carries an opening for exposing said surface of said insulator slab in correspondence to a passage of said electron beam emitted from said emitter;

removing said insulator slab for a part thereof exposed by said opening of said conductor layer by etching to form said passage of said electron beam in said insulator slab.

7. A method as claimed in claim 6, wherein said step of providing said conductor layer includes the steps of:

forming said conductor layer upon said insulator slab; and patterning said conductor layer by using a resist pattern as a mask.

8. A method as claimed in claim 7, wherein said insulator slab comprises a photosensitive material, wherein said step of etching includes the steps of:

exposing said insulator slab to optical radiation while using said conductor layer as a mask; and etching a part of said insulator slab that has been selectively exposed to said optical radiation.

9. A method for fabricating a micro-field emission gun, said micro-field emission gun having an emitter provided on a substrate, a first insulator layer surrounding said emitter, a gate electrode provided on said first insulator layer so as to surround said emitter, said micro-field emission gun thereby emitting an electron beam from said emitter in response to a control voltage applied to said gate electrode, a second insulator layer having a passage of said electron beam and provided on said gate electrode, and an acceleration electrode having a passage of said electron beam and provided on said second insulator layer, said acceleration electrode thereby accelerating said electron beam in response to an acceleration voltage applied thereto, said method comprising the steps of:

providing a third insulator layer on said acceleration electrode by performing first anodic bonding, said third insulator layer having a passage for said electron beam;

forming an electrostatic lens as an alternate stacking of a plurality of electrode films each having an opening acting as a passage for said electron beam and a plurality of insulation films each having an opening acting as a passage for said electron beam, such that openings of said insulation films and said electrode films are aligned with each other to form a straight path of said electron beam extending from a bottom surface to a top surface of said electrostatic leans; and bonding the lowermost electrode film of said electrostatic lens upon said third insulator by performing second anodic bonding.

10. A method as claimed in claim 9, wherein said step for forming the electrostatic lens includes the steps of:

bonding first and second glass layers respectively on first and second sides of a first conductor foil, said first conductor foil corresponding to one of said plurality of electrode films and being formed with a passage for said electron beam by anodic bonding;

providing a first photosensitive layer upon a surface of said first glass layer at a side away from said first conductor foil;

exposing said first photosensitive layer from a side of said second glass layer while using said first conductor foil as a mask;

removing said first photosensitive layer from the surface of said first glass layer except for the part thereof subjected to exposure, to form a first resist pattern;

depositing a second conductor foil upon the surface of said first glass layer while using said first resist pattern as a mask, to form one of the electrode films constituting said plurality of electrode films;

providing a second photosensitive layer upon a surface of said second glass layer at a side away from said first conductor;

exposing said second photosensitive layer from a side of said first glass layer while using said first and second conductor foils as a mask;

removing said second photosensitive layer from the surface of said second glass layer except for a part thereof subjected to exposure, to form a second resist pattern; and depositing a third conductor foil upon said surface of said second glass layer while using said second resist pattern as a mask to form another electrode film also constituting one of said plurality of electrode films.

11. A method as claimed in claim 9, wherein said step for forming said electrostatic lens includes, in each of first and second undoped semiconductor substrates, the steps of:

forming a layer of a first conductivity type and an oxide film upon surfaces of said first and second substrates;

bonding said first semiconductor substrate upon a first surface of a third semiconductor substrate having a conductivity type opposite to said first conductivity type, such that said oxide film on said first semiconductor substrate contacts upon said first surface by anodic bonding;

bonding said second semiconductor substrate upon a second, opposite surface of said third semiconductor substrate such that said oxide film on said second semiconductor substrate contacts with said second surface; and forming a penetrating hole through a layered semiconductor structure formed as a result of said bonding steps as a passage for the electron beam.

12. A method for fabricating a micro-field emission gun, comprising the steps of:

forming a first structural component in which a plurality of micro-field emission elements are formed on a surface of a first substrate, each of said micro-field emission elements including an emitter for emitting an electron beam and a gate electrode disposed a distance from said emitter for causing an emission of said electron beam from said emitter, said first substrate carrying a bonding electrode having an electrode pad at an end thereof;

forming a second structural component from a second substrate such that a plurality of acceleration electrodes are formed upon said second substrate, said acceleration electrode accelerating said electron beam emitted from said emitter;

forming a third structural component of an insulation slab such that the insulation slab includes a plurality of openings enclosed by a rim as a passage of said electron beams;

bonding said third structural component upon said first structural component by first anodic bonding, said first anodic bonding including a step of applying a d.c. voltage to said bonding electrode on said first substrate via said bonding pad while simultaneously applying heat to said first substrate and said slab; and bonding said second structural component upon said insulation slab by second anodic bonding, said second anodic bonding including a step of applying a d.c. voltage to said second substrate to said insulation slab while simultaneously applying heat to said insulation slab and said second substrate.

13. A method for fabricating a micro-field emission gun, comprising the steps of:

forming a first structural component in which a plurality of micro-field emission elements are formed on a surface of a first, conductive substrate, each of said micro-field emission elements including an emitter for emitting an electron beam and a gate electrode disposed with a separation from said emitter for causing an emission of said electron beam from said emitter;

forming a second structural component from a second substrate such that a plurality of acceleration electrodes are formed upon said second substrate, said acceleration electrode accelerating said electron beam emitted from said emitter;

forming a third structural component of an insulation slab such that the insulation slab includes a plurality of openings enclosed by a rim as a passage of said electron beams;

bonding said third structural component upon said first structural component by first anodic bonding, said first anodic bonding including a step of applying a d.c. voltage to said first substrate while simultaneously applying heat to said first substrate and said slab; and bonding said second structural component upon said insulation slab by second anodic bonding, said second anodic bonding including a step of applying a d.c. voltage to said second substrate while simultaneously applying heat to said insulation slab and said second substrate.

* * * * *